(12) United States Patent
Kishino et al.

(10) Patent No.: US 11,539,341 B2
(45) Date of Patent: Dec. 27, 2022

(54) ACOUSTIC WAVE DEVICE, MULTIPLEXER, AND COMMUNICATION APPARATUS

(71) Applicant: KYOCERA Corporation, Kyoto (JP)

(72) Inventors: Tetsuya Kishino, Nara (JP); Soichiro Nozoe, Kyoto (JP); Motoki Ito, Ikoma (JP)

(73) Assignee: KYOCERA Corporation, Kyoto (JP)

( * ) Notice: Subject to any disclaimer, the term of this patent is extended or adjusted under 35 U.S.C. 154(b) by 442 days.

(21) Appl. No.: 16/626,832

(22) PCT Filed: Jul. 2, 2018

(86) PCT No.: PCT/JP2018/025071
§ 371 (c)(1),
(2) Date: Dec. 26, 2019

(87) PCT Pub. No.: WO2019/009246
PCT Pub. Date: Jan. 10, 2019

(65) Prior Publication Data
US 2021/0036679 A1 Feb. 4, 2021

(30) Foreign Application Priority Data

Jul. 4, 2017 (JP) .............................. JP2017-131499

(51) Int. Cl.
*H03H 9/02* (2006.01)
*H03H 9/145* (2006.01)
(Continued)

(52) U.S. Cl.
CPC ......... *H03H 9/02543* (2013.01); *G01S 7/521* (2013.01); *G10K 11/00* (2013.01);
(Continued)

(58) Field of Classification Search
CPC ...... H03H 9/02543; H03H 9/145; H03H 9/25; H03H 9/64; H03H 9/72; G01S 7/521; G10K 11/00; H04B 1/40
(Continued)

(56) References Cited

U.S. PATENT DOCUMENTS

2004/0189423 A1   9/2004 Loebl et al.
2005/0110596 A1   5/2005 Yamakawa et al.
(Continued)

FOREIGN PATENT DOCUMENTS

JP   2005-500778 A   1/2005
JP   2005-176321 A   6/2005
(Continued)

*Primary Examiner* — Hafizur Rahman
(74) *Attorney, Agent, or Firm* — Procopio Cory Hargreaves and Savitch LLP

(57) ABSTRACT

An acoustic wave device includes a substrate, a multilayer film on the substrate, an LT layer configured by a single crystal of $LiTaO_3$ on the multilayer film, and an IDT electrode on the LT layer. The thickness of the LT layer is $0.3\lambda$ or less where $\lambda$ is two times a pitch p of electrode fingers in the IDT electrode. Euler angles of the LT layer are (0°±20°, −5° to 65°, 0°±10°), (−120°±20°, −5° to 65°, 0°±10°), or (120°±20°, −5° to 65°, 0°±10°). The multilayer film configured by alternately stacking at least one first layer and at least one second layer. The first layer is comprised of $SiO_2$. The second layer is comprised of any one of $Ta_2O_5$, $HfO_2$, $ZrO_2$, $TiO_2$, and MgO.

17 Claims, 49 Drawing Sheets

(51) Int. Cl.
*H03H 9/25* (2006.01)
*H03H 9/64* (2006.01)
*H03H 9/72* (2006.01)
*H04B 1/40* (2015.01)
*G01S 7/521* (2006.01)
*G10K 11/00* (2006.01)

(52) U.S. Cl.
CPC .............. *H03H 9/145* (2013.01); *H03H 9/25* (2013.01); *H03H 9/64* (2013.01); *H03H 9/72* (2013.01); *H04B 1/40* (2013.01)

(58) Field of Classification Search
USPC ........................................................ 367/140
See application file for complete search history.

(56) References Cited

U.S. PATENT DOCUMENTS

| | | | |
|---|---|---|---|
| 2007/0096851 A1 | 5/2007 | Uno et al. | |
| 2014/0003196 A1 | 1/2014 | Tajima | |
| 2014/0152146 A1 | 6/2014 | Kimura et al. | |
| 2014/0312994 A1* | 10/2014 | Meltaus | H03H 9/02086 333/187 |
| 2016/0182007 A1 | 6/2016 | Bhattacharjee | |
| 2018/0123565 A1* | 5/2018 | Takamine | H03H 9/725 |

FOREIGN PATENT DOCUMENTS

| | | | | |
|---|---|---|---|---|
| JP | 2007-129391 A | 5/2007 | | |
| JP | 2014-011570 A | 1/2014 | | |
| JP | 2016-225727 A | 12/2016 | | |
| WO | WO-9749182 A1 * | 12/1997 | ........... | H03H 9/0259 |
| WO | 2012/086441 A1 | 6/2012 | | |
| WO | 2016/047255 A1 | 3/2016 | | |
| WO | 2016/100692 A2 | 6/2016 | | |
| WO | 2017/068827 A1 | 4/2017 | | |

\* cited by examiner

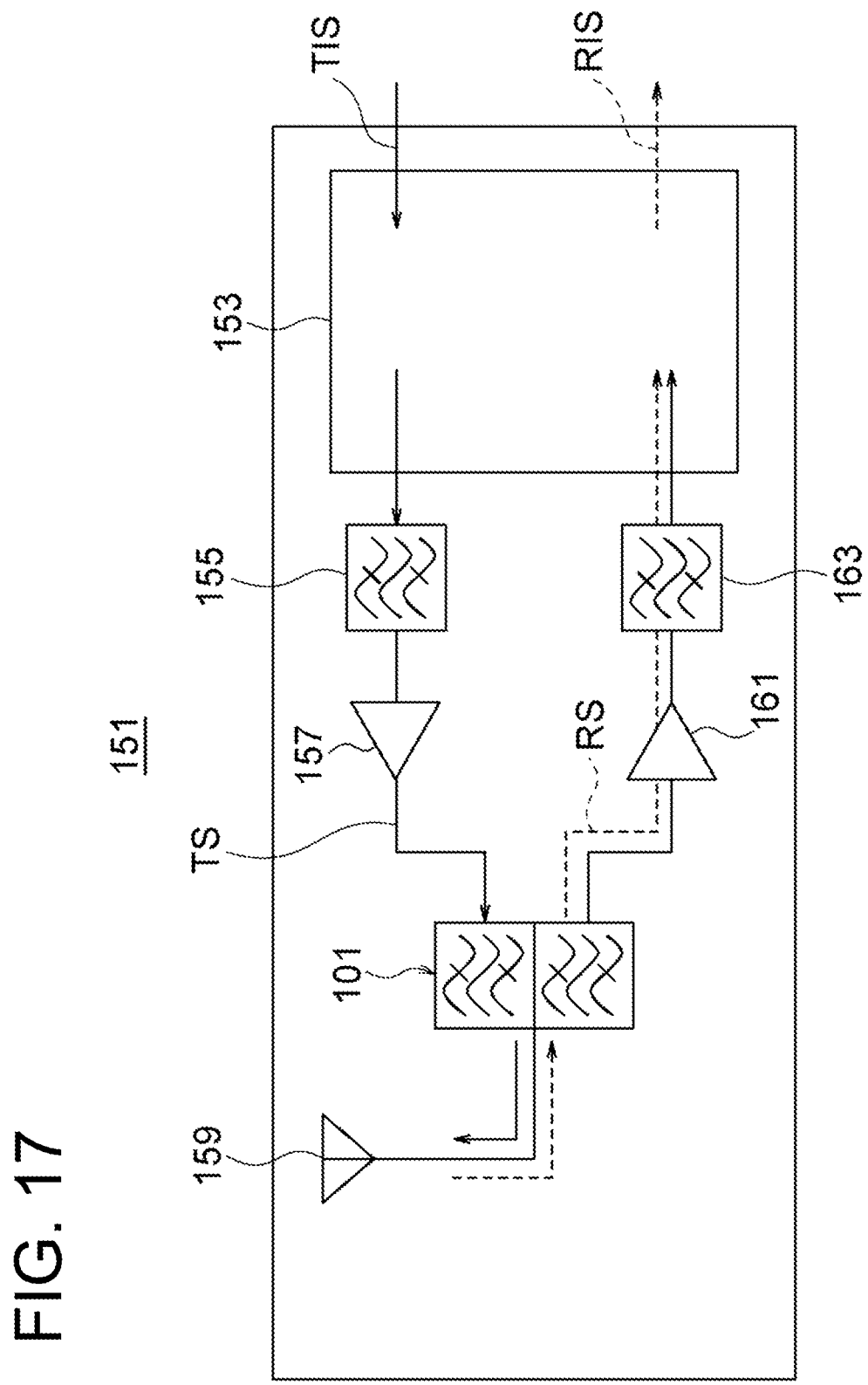

ACOUSTIC WAVE DEVICE, MULTIPLEXER, AND COMMUNICATION APPARATUS

TECHNICAL FIELD

The present disclosure relates to an electronic part utilizing an acoustic wave, that is, an acoustic wave device, and a multiplexer and a communication apparatus including the acoustic wave device.

BACKGROUND ART

Known in the art is an acoustic wave device which applies a voltage to an IDT (interdigital transducer) electrode on a piezoelectric body to cause the generation of an acoustic wave propagating through the piezoelectric body. The IDT electrode has a pair of comb-shaped electrodes. The pair of comb-shaped electrodes individually have pluralities of electrode fingers (corresponding to teeth of combs) and are arranged so as to intermesh with each other. In the acoustic wave device, a standing wave of the acoustic wave having a wavelength two times the pitch of the electrode fingers formed. The frequency of this standing wave becomes a resonance frequency. Accordingly, the resonance point of the acoustic wave device is defined by the pitch of the electrode fingers.

Patent Literature 1 proposes an acoustic wave device having a substrate, an acoustic reflector layer positioned on the substrate, a piezoelectric material layer positioned on the acoustic reflector layer, and an IDT electrode positioned on the piezoelectric material layer. The acoustic reflector layer is configured by alternately stacking a low acoustic impedance layer and a high acoustic impedance layer. Patent Literature 1 discloses that this configuration makes it possible to utilize a plate wave as the acoustic wave and that the pitch of the electrode fingers becomes about 3 µm when configuring an acoustic wave device having a resonance point at 5 GHz. Further, Patent Literature 1 discloses several combinations of materials and thicknesses of the above various layers.

CITATIONS LIST

Patent Literature

Patent Literature 1: International Patent Publication No. 2012/086441

SUMMARY OF INVENTION

An acoustic wave device according to one aspect of the present disclosure includes a substrate, a multilayer film on the substrate, an LT layer configured by a single crystal of LiTaO$_3$ (LT) on the multilayer film, and an IDT electrode on the LT layer. A thickness of the LT layer is 0.3λ or less where λ is two times a pitch of electrode fingers in the IDT electrode. Euler angles of the LT layer are (0°±20°, −5° to 65°, 0°±10°), (−120°±20°, −5° to 65°, 0°±10°), or (120°±20°, −5° to 65, 0°±10°). The multilayer film is configured by alternately stacking at least one first layer and at least one second layer. The first layer is comprised of SiO$_2$. The second layer is comprised of any one of Ta$_2$O$_5$, HfO$_2$, ZrO$_2$, TiO$_2$, and MgO.

An acoustic wave device according to one aspect of the present disclosure includes a substrate, a multilayer film on the substrate, an LT layer configured by a single crystal of LiTaO$_3$ on the multilayer film, and an IDT electrode on the LT layer. A thickness of the LT layer is 0.3λ or less where λ is two times a pitch of electrode fingers in the IDT electrode. When Euler angles of the LT layer are (φ, θ, ψ) and n is 0, 1, or 2, θ=25±5°, ψ=0°±10°, and −0.608ψ−139.5+120n≤φ≤−0.608ψ−102.0+120n stand. The multilayer film is configured by alternately stacking at least one first layer and at least one second layer. The first layer is comprised of Si$_2$. The second layer is comprised of any one of Ta$_2$O$_5$, HfO$_2$, ZrO$_2$, TiO$_2$, and MgO.

A multiplexer according to one aspect of the present disclosure includes an antenna terminal, a transmission filter filtering a signal output to the antenna terminal, and a reception filter filtering a signal input from the antenna terminal. At least one of the transmission filter and the reception filter includes the acoustic wave device described above.

A communication apparatus according to one aspect of the present disclosure includes an antenna, the multiplexer described above in which the antenna terminal is connected to the antenna, and an IC which is connected with respect to the transmission filter and the reception filter on a side opposite to the antenna terminal about a signal route.

BRIEF DESCRIPTION OF DRAWINGS

FIG. 17 is a circuit diagram schematically showing the configuration of a communication apparatus as an example of utilization of the acoustic wave device in FIG. 1.

DESCRIPTION OF EMBODIMENTS

Figure 1:
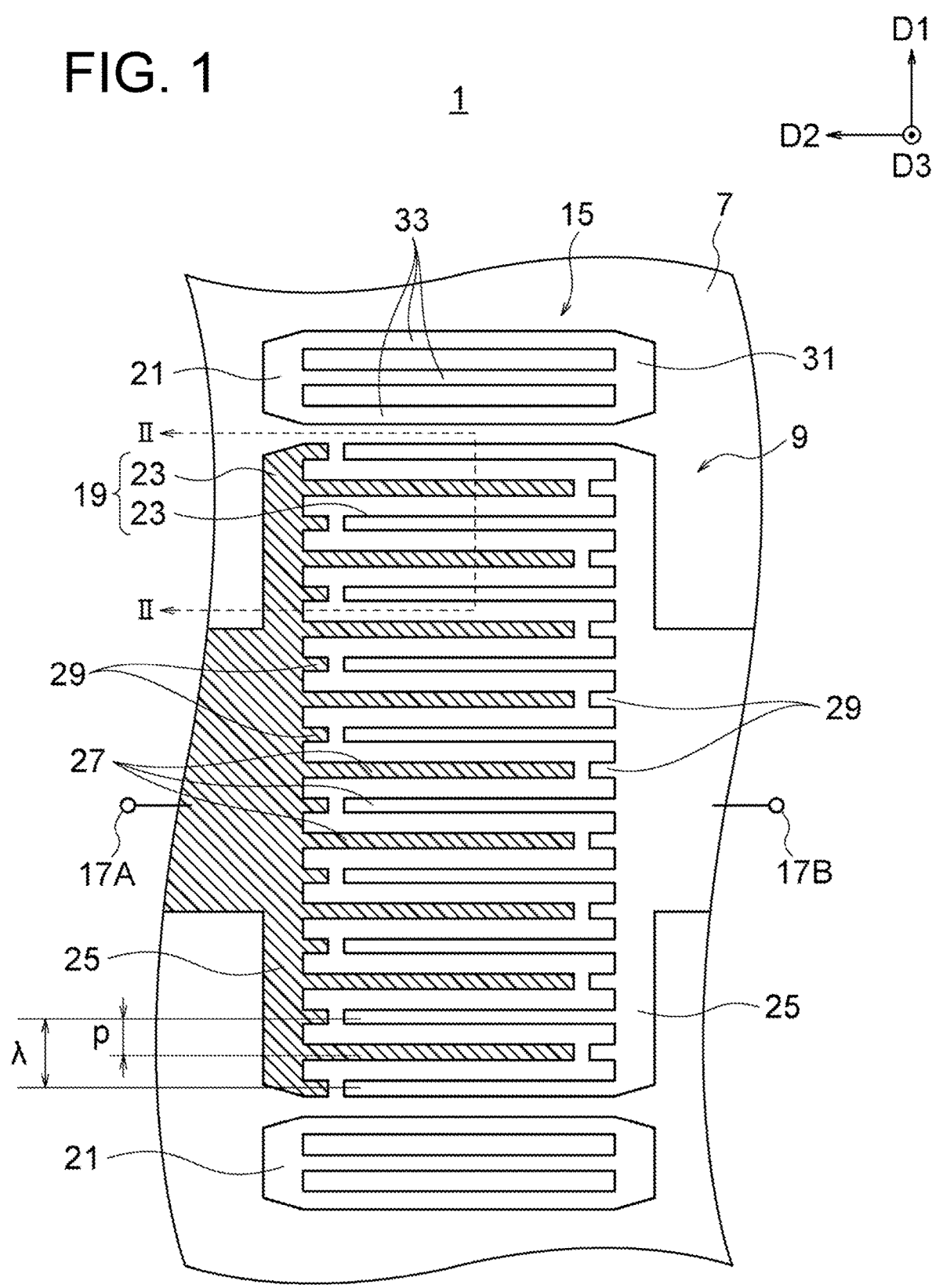
FIG. 1 is a plan view showing an acoustic wave device according to an embodiment.

Below, embodiments according to the present disclosure will be explained with reference to the drawings. Note that, the drawings used in the following explanation are schematic ones. Size ratios etc. in the drawings do not always coincide with the actual ones.

In the acoustic wave device according to the present disclosure, any direction may be defined as the "above" or "below". In the following explanation, however, for convenience, an orthogonal coordinate system comprised of a D1 axis, D2 axis, and D3 axis will be defined, and sometimes the "upper surface" or "lower surface", and other terms will be used where the positive side of the D3 axis is the upper part. Further, when referring to "viewed on a plane" or "plane perspective", unless particularly explained, this means "viewed in the D3 axis direction". Note that, the D1 axis is defined as parallel to the direction of propagation of the acoustic wave propagating along the upper surface of the LT layer which will be explained later, the D2 axis is defined as parallel to the upper surface of the LT layer and perpendicular to the D1 axis, and the D3 axis is defined as perpendicular to the upper surface of the LT layer.

(Overall Configuration of Acoustic Wave Device)

Figure 2:
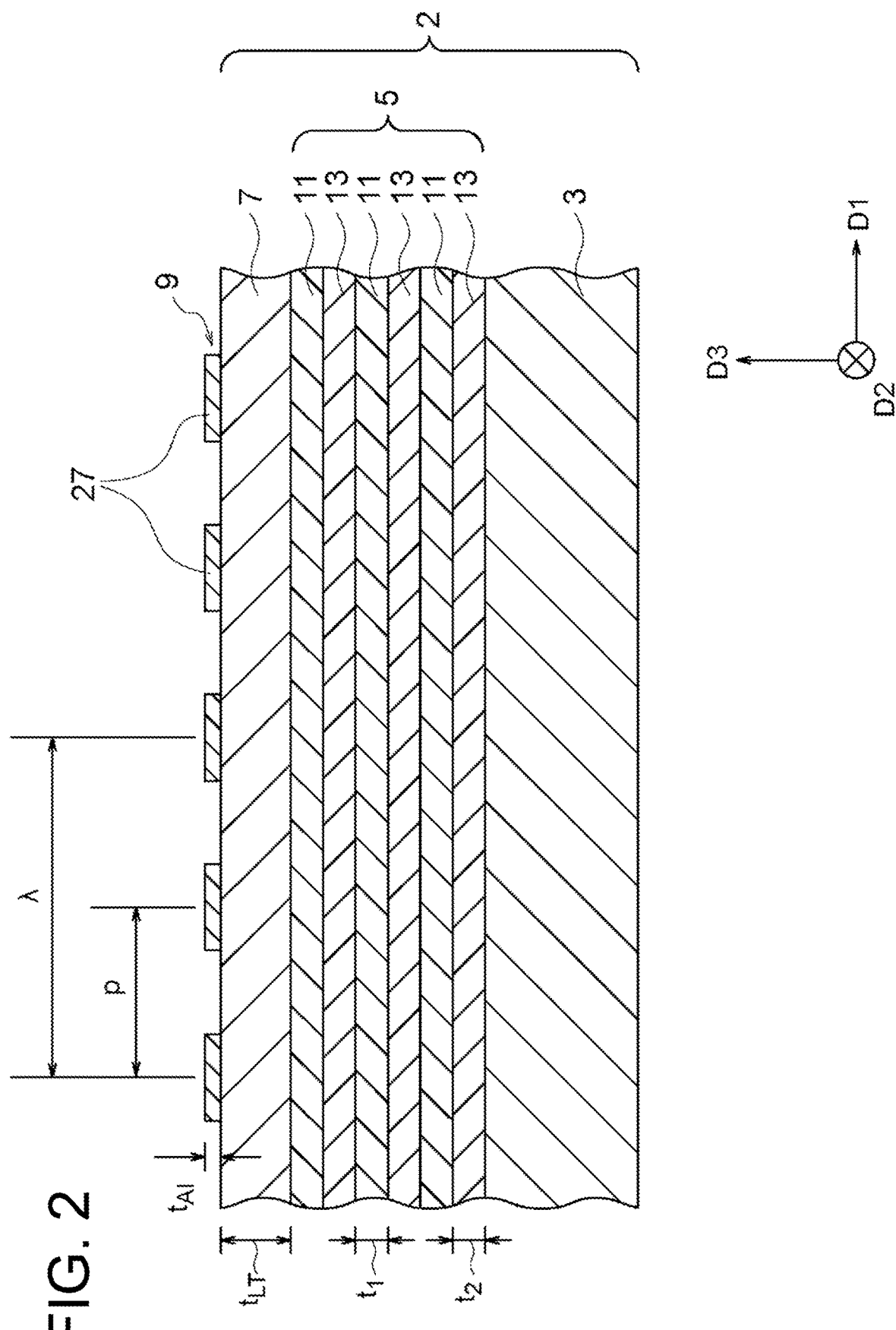
FIG. 2 is a cross-sectional view taken along the II-II line in the acoustic wave device in FIG. 1.

FIG. 1 is a plan view showing the configuration of a principal part of an acoustic wave device 1. FIG. 2 is a cross-sectional view taken along the II-II line in FIG. 1.

The acoustic wave device 1 has for example a substrate 3 (FIG. 2), a multilayer film 5 positioned on the substrate 3 (FIG. 2), an LT layer 7 positioned on the multilayer film 5, and a conductive layer 9 positioned on the LT layer 7. Each layer is for example given substantially a constant thickness.

Note that, sometimes a combination of the substrate 3, multilayer film 5, and LT layer 7 will be referred to as a "fixed substrate 2" (FIG. 2).

In the acoustic wave device 1, an acoustic wave propagating through the LT layer 7 is excited by application of a voltage to the conductive layer 9. The acoustic wave device 1 for example configures a resonator and/or filter which utilizes this acoustic wave. The multilayer film 5 for example contributes to reflection of the acoustic wave and trapping of the energy of the acoustic wave in the LT layer 7. The substrate 3 for example contributes to reinforcement of the strengths of the multilayer film 5 and LT layer 7.

(Schematic Configuration of Fixed Substrate) The substrate 3, as will be understood from the explanation which will be given later, does not directly influence the electrical characteristics of the acoustic wave device. Accordingly, the material and dimensions of the substrate 3 may be suitably set. The material of the substrate 3 is for example an insulating material. The insulating material is for example a resin or ceramic. Note that, the substrate 3 may be configured by a material having a lower thermal expansion coefficient compared with the LT layer 7 etc. as well. In this case, for example, a possibility of change of the frequency characteristics of the acoustic wave device 1 due to a temperature change can be reduced. As such a material, for example there can be mentioned silicon or another semiconductor, sapphire or another single crystal, and a sintered alumina or other ceramics. Note that, the substrate 3 may be configured by stacking a plurality of layers which are made of materials different from each other as well. The thickness of the substrate 3 is for example greater than the LT layer 7.

The multilayer film 5 is configured by alternately stacking first layers 11 and second layers 13. The first layers 11 are comprised of silicon dioxide ($SiO_2$). The second layers 13 are comprised of any one of tantalum pentoxide ($Ta_2O_5$), hafnium oxide ($HfO_2$), zirconium dioxide ($ZrO_2$), titanium oxide ($TiO_2$), and magnesium oxide (MgO). The material of the second layers 13 has a higher acoustic impedance compared with the material of the first layers 11. Due to this, at the interface of the two, the reflectivity of the acoustic wave becomes relatively high. As a result, for example, leakage of the acoustic wave propagating through the LT layer 7 is reduced.

The number of stacked layers of the multilayer film 5 may be suitably set. For example, in the multilayer film 5, the total number of stacked layers of the first layers 11 and second layers 13 may be three to 12. However, the multilayer film 5 may be configured by two layers in total of a single first layer 11 and a single second layer 13 as well. Further, the total number of stacked layers in the multilayer film 5 may be an even number or odd number. However, the layer contacting the LT layer 7 is a first layer 11. The layer which contacts the substrate 3 may be a first layer 11 or second layer 13. Further, between the layers, sometimes an additional layer is inserted for the purpose of adhesion or preventing diffusion. In that case, there is no problem so far as that layer is thin enough not to exert an influence upon the characteristics (roughly $0.01\lambda$).

The LT layer 7 is configured by a single crystal of lithium tantalate ($LiTaO_3$, LT). The cut angle of the LT layer 7 is for example (0°±110°, −5° to 65°, 0°±10°) or (0°±10°, 0° to 55°, 0°±10°) in terms of the Euler angles. From another viewpoint, the LT layer 7 is a rotated, Y-cut, and X-propagation one, and the Y axis is inclined at an angle of 85° to 155° or 90° to 145° relative to the normal line (D3 axis) of the LT layer 7. The X-axis is substantially parallel to the upper surface (D1 axis) of the LT layer 7. However, the X-axis and the D1 axis may be inclined by −10° to 10° at the XZ plane or D1D2 plane as well. Further, the thickness of the LT layer 7 is made relatively small. For example, it is $0.3\lambda$ or less based on $\lambda$ which will be explained later. By setting the cut angle and thickness of the LT layer 7 in this way, it becomes possible to utilize a wave having a vibration mode close to a slab mode as the acoustic wave.

(Schematic Configuration of Conductive Layer)

The conductive layer 9 is for example formed by a metal. The metal may be a suitable type. For example, it is aluminum (Al) or an alloy containing Al as a principal ingredient (Al alloy). The Al alloy is for example an aluminum-copper (Cu) alloy. Note that, the conductive layer 9 may be configured by a plurality of metal layers as well. For example, between the Al or Al alloy and the LT layer 7, a relatively thin layer comprised of titanium (Ti) for reinforcing their bondability may be provided as well.

The conductive layer 9 is formed so as to configure a resonator 15 in the example in FIG. 1. The resonator 15 is configured as a so-called 1-port acoustic wave resonator. When an electrical signal having a predetermined frequency is input from one of the conceptually and schematically shown terminals 17A and 17B, resonance is caused. A signal with resonance can be output from the other of the terminals 17A and 17B.

The conductive layer 9 (resonator 15) includes for example an IDT electrode 19 and a pair of reflectors 21 which are positioned on the two sides of the IDT electrode 19.

The IDT electrode 19 includes a pair of comb-shaped electrodes 23. Note that, in order to improve visual understanding, one comb-shaped electrode 23 is shown with hatching. The comb-shaped electrodes 23 for example include bus bars 25, pluralities of electrode fingers 27 extending from the bus bars 25 alongside each other, and dummy electrodes 29 each of which projecting from the bus bar 25 between two or more electrode fingers 27. The pair of comb-shaped electrodes 23 are arranged so that the pluralities of electrode fingers 27 intermesh (intersect) with each other.

The bus bars 25 are for example substantially formed in long shapes so as to linearly extend in the direction of propagation of the acoustic wave (D1 axis direction) with constant widths. Further, the pair of bus bars 25 face each other in a direction (D2 axis direction) perpendicular to the direction of propagation of the acoustic wave. Note that, the bus bars 25 may be changed in widths or be inclined relative to the direction of propagation of the acoustic wave.

The electrode fingers 27 are for example substantially formed in long shapes so as to linearly extend in the direction (D2 axis direction) perpendicular to the direction of propagation of the acoustic wave with constant widths. In each comb-shaped electrode 23, the plurality of electrode fingers 27 are arranged in the direction of propagation of the acoustic wave. Further, the plurality of electrode fingers 27 in one comb-shaped electrode 23 and the plurality of electrode fingers 27 in the other comb-shaped electrode 23 are basically alternately arranged.

A pitch "p" of the plurality of electrode fingers 27 (for example a distance between the centers of two mutually neighboring electrode fingers 27) is basically constant in the IDT electrode 19. Note that, parts of the IDT electrodes 19 may be provided with narrow pitch parts in which the pitch "p" becomes narrower than that in the other major parts and broad pitch parts in which the pitch "p" becomes broader than that in the other major parts.

Note that, below, when referring to the "pitch p", unless particularly indicated otherwise, it means the pitch of the parts (the major parts of the pluralities of electrode fingers 27) excluding the special parts such as the narrow pitch parts or broad pitch parts described above. Further, when the pitch changes even in the major parts of the pluralities of electrode fingers 27 excluding the special parts, a mean value of pitches of the major parts of the pluralities of electrode fingers 27 may be used as the value of the pitch "p".

The number of the electrode fingers 27 may be suitably set in accordance with the electrical characteristics etc. demanded from the resonator 15. Note that, FIG. 2 is a schematic view, therefore a smaller number of electrode fingers 27 are shown. In actuality, a larger number of electrode fingers 27 than those shown may be arranged. The same is true for the strip electrodes 33 in the reflector 21 which will be explained later.

The lengths of the pluralities of electrode fingers 27 are for example equal to each other. Note that, the IDT electrode 19 may be so-called apodized so as to change the lengths of the pluralities of electrode fingers 27 (from another viewpoint, intersecting widths) in accordance with the positions in the direction of propagation. The lengths and widths of the electrode fingers 27 may be suitably set in accordance with the demanded electrical characteristics etc.

The dummy electrodes 29 for example substantially project in a direction perpendicular to the direction of propagation of the acoustic wave with constant widths. The widths thereof are for example equal to the widths of the electrode fingers 27. Further, the plurality of dummy electrodes 29 are arranged by an equal pitch to that of the plurality of electrode fingers 27. The front edge of a dummy electrode 29 in one comb-shaped electrode 23 faces the front edge of an electrode finger 27 in the other comb-shaped electrode 23 across a gap. Note that, the IDT electrode 19 may be one not including dummy electrodes 29 as well.

The pair of reflectors 21 are positioned on the two sides of the plurality of IDT electrodes 19 in the direction of propagation of the acoustic wave. Each reflector 21 may be for example made an electrically floating state or may be given the reference potential. Each reflector 21 is for example formed in a lattice shape. That is, the reflector 21 includes a mutually facing pair of bus bars 31 and pluralities of strip electrodes 33 extending between the pair of bus bars 31. The pitch of the plurality of strip electrodes 33 and the pitch of the mutually neighboring electrode finger 27 and strip electrode 33 are basically equal to the pitch of the plurality of electrode fingers 27.

Note that, although not particularly shown, the upper surface of the LT layer 7 may be covered by a protective film comprised of $SiO_2$, $Si_3N_4$, or the like from the top of the conductive layer 9 as well. The protective film may be a laminate of a plurality of layers comprised of these materials as well. The protective film may be one for simply suppressing corrosion of the conductive layer 9 or may be one contributing to temperature compensation. Where the protective film is provided or the like, on the upper surfaces or lower surfaces of the IDT electrode 19 and reflectors 21, additional films made of an insulator or metal may be provided as well in order to improve the reflection coefficient of the acoustic wave.

The configurations shown in FIG. 1 and FIG. 2 may be suitably packaged. The package may be for example one obtained by mounting the shown configuration on a not shown substrate so as to make the upper surface of the LT layer 7 face the substrate across a clearance and sealing it by resin from the top thereof or may be a wafer level package type providing a box type cover on the LT layer 7.

(Utilization of Slab Mode)

When a voltage is applied to the pair of comb-shaped electrodes 23, the voltage is applied to the LT layer 7 by the pluralities of electrode fingers 27, and the piezoelectric body comprised of the LT layer 7 vibrates. Due to this, an acoustic wave propagating in the D1 axis direction is excited. The acoustic wave is reflected by the pluralities of electrode fingers 27. Further, a standing wave having the pitch "p" of the pluralities of electrode fingers 27 as substantially a half wavelength ($\lambda/2$) is excited. The electrical signal generated in the LT layer 7 by the standing wave is extracted by the pluralities of electrode fingers 27. According to such a principle, the acoustic wave device 1 functions as a resonator which has the frequency of the acoustic wave having the pitch "p" as a half wavelength as the resonance frequency. Note that, $\lambda$ is usually a notation showing the wavelength. Further, the wavelength of an actual acoustic wave sometimes deviates from 2p. However, when use will be made of the notation of $\lambda$ in the following explanation, unless particularly explained, $\lambda$ means 2p.

Here, as explained above, the LT layer 7 is formed relatively thin and has Euler angles of (0°±10°, −5° to 65°, 0°±10°), therefore it becomes possible to utilize the slab mode acoustic wave. Note that, as the plane equivalent to these Euler angles, there is a plane of (180°±10°, −65° to 5°, 0°±10°). The velocity of propagation (acoustic velocity) of the slab mode acoustic wave is faster than the velocity of propagation of a general SAW (surface acoustic wave). For example, in contrast to the velocity of propagation of a general SAW of 3000 to 4000 m/s, the velocity of propagation of the slab mode acoustic wave is 10000 m/s or more. Accordingly, with a pitch "p" equal to the conventional one, a resonance in a higher frequency region than the conventional one can be realized. For example, a resonance frequency not less than 5 GHz can be realized with a pitch "p" of 1 μm or more.

(Setting of Materials and Thicknesses of Layers)

The inventors of the present application performed computer simulations of the frequency characteristics of the acoustic wave device 1 while changing the materials and thicknesses of the multilayer film 5, the Euler angles, material, and thickness of the piezoelectric material layer (LT layer 7 in the present embodiment), and the thickness of the conductive layer 9 in various ways. Further, they found the conditions enabling realization of resonance in a relatively high frequency region (for example 5 GHz or more) by utilizing the slab mode acoustic wave. Specifically, this is as follows. Note that, in the following simulations, values standardized by the wavelength A were shown as various film thicknesses. The simulations (FIG. 3A to FIG. 15B and FIG. 18A to FIG. 49B) were carried out while making the pitch "p" 1 μm. However, even in a case where the pitch is changed, if the actual film thickness is changed according to the wavelength represented by $\lambda=2p$, the results of the resonance characteristics become the same except that only a frequency dependency shifts as a whole.

(Materials of Multilayer Film)

First, simulations were carried out while changing the materials of the piezoelectric material layer (LT layer 7) and multilayer film in various ways. As a result, the inventors found that, by using a single crystal of $LiTaO_3$ as the material of the piezoelectric material layer, using $SiO_2$ as the material of the first layers 11, and using any one of $Ta_2O_5$, $HfO_2$, $ZrO_2$, $TiO_2$, and MgO as the material of the second layers 13, the resonance in a relatively high frequency region could be realized by utilizing the slab mode acoustic wave.

Figure 3B:
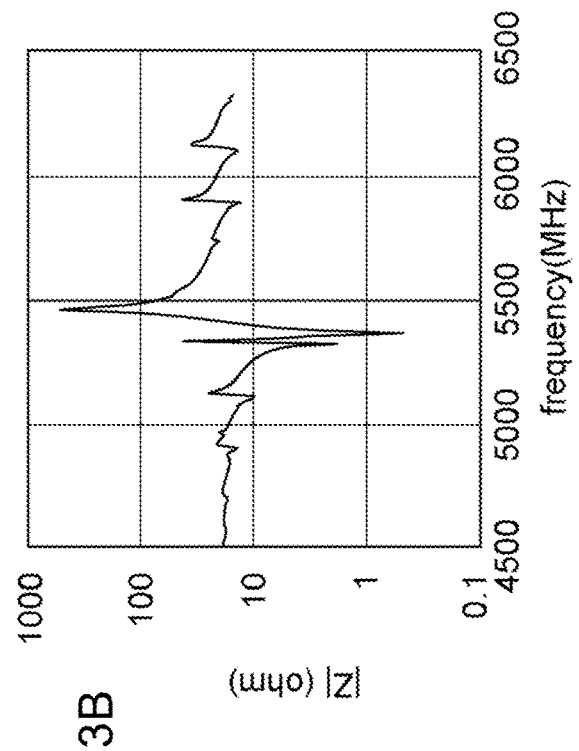
FIG. 3A, FIG. 3B, FIG. 3C, and FIG. 3D are graphs which respectively show the results of simulations according to Example 1, Example 2, Comparative Example 1, and Comparative Example 2.
Figure 3D:
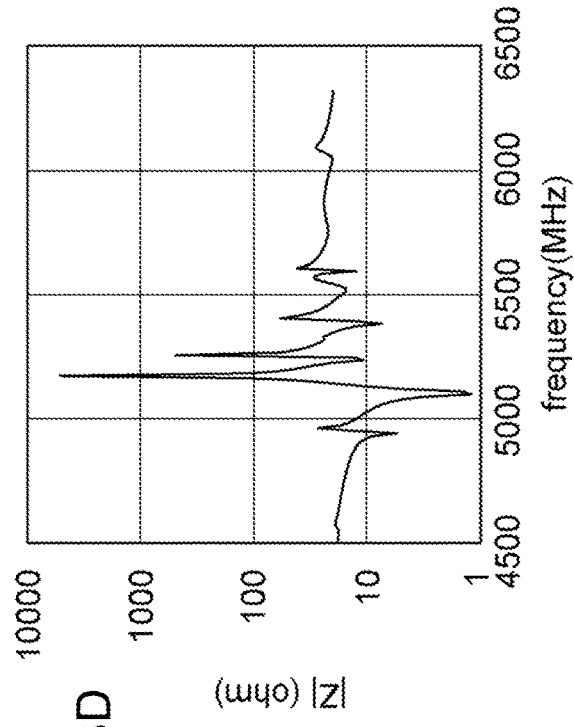
Figure 3A:
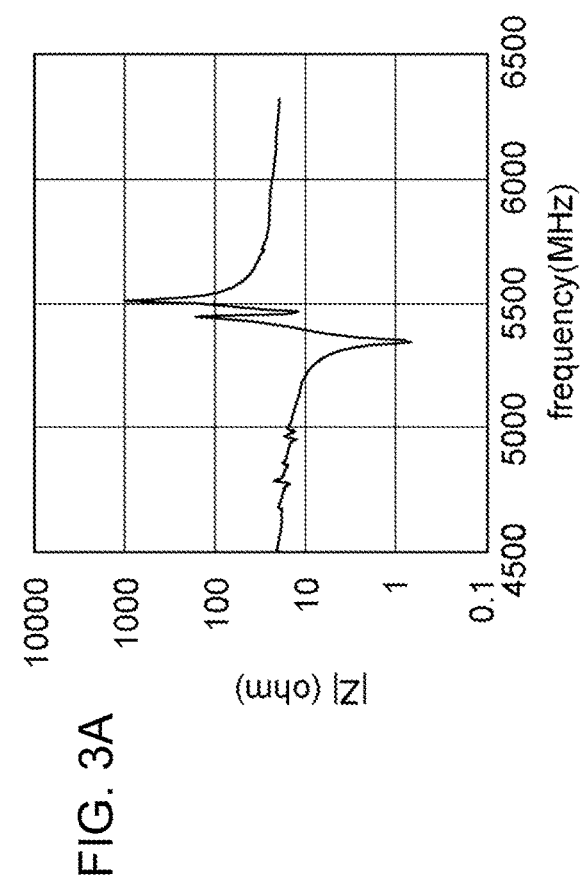

FIG. 3A to FIG. 3D show examples of such results of simulations. FIG. 3A corresponds to Example 1, FIG. 3B corresponds to Example 2, FIG. 3C corresponds to Comparative Example 1, and FIG. 3D corresponds to Comparative Example 2. In these graphs, the abscissas show the frequencies (MHz), and the ordinates show absolute values of impedances (Ω).

The conditions common to Example 1, Example 2, Comparative Example 1, and Comparative Example 2 are as follows:

Piezoelectric substance layer:
Material: LiTaO$_3$
Thickness: 0.2λ
Euler angles: (0°, 15°, 0°)
Multilayer film:
Material: SiO$_2$ for first layers 11
Number of stacked layers: 8 layers
Conductive layer:
Material: Al
Thickness: 0.08λ
Pitch "p": 1 μm (λ=2 μm)

Note that, the number of stacked layers is a sum of the numbers of the first layers 11 and second layers 13 (for example six in the example in FIG. 2) (the same is true in the following explanation).

Ta$_2$O$_5$ (example) or aluminum nitride (AlN, comparative example) was assumed as the material of the second layers 13. Further, computer simulations were carried out while assuming various values within a range of 0.125λ to 1λ for the thicknesses of the first layers 11 and assuming various values within a range of 0.125λ to 1λ for the thicknesses of the second layers 13. That is, in actuality, computer simulations more than the shown four cases were carried out.

As a result, when assuming Ta$_2$O$_5$ as the material of the second layers 13, as exemplified in FIG. 3A and FIG. 3B, there were thicknesses of the first layers 11 and second layers 13 by which a resonance point at which the absolute value of impedance took the minimum value and an anti-resonance point at which the absolute value of impedance took the maximum value relatively clearly appeared.

Figure 3C:
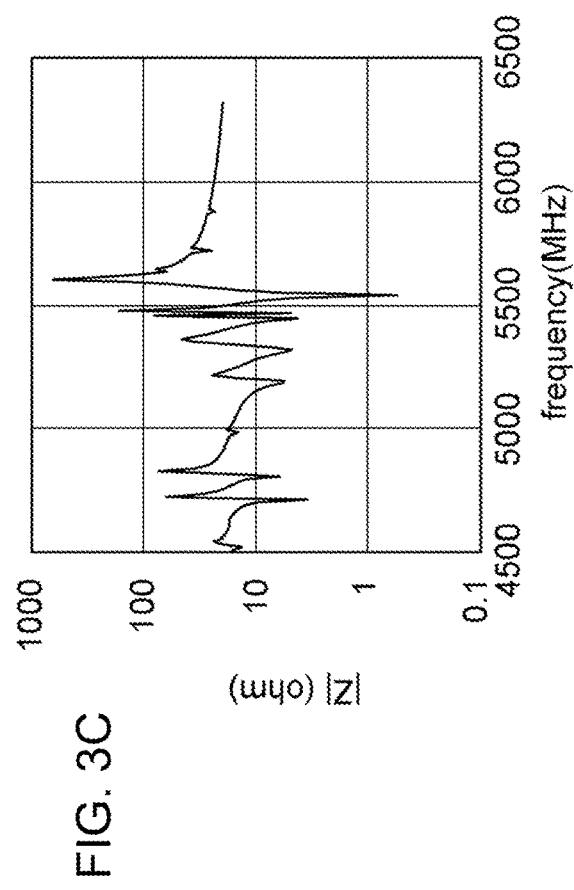

On the other hand, when assuming AlN as the material of the second layers 13, as exemplified in FIG. 3C and FIG. 3D, many spurious emissions ended up being generated, therefore the inventors could not find the thicknesses of the first layers 11 and second layers 13 at which the resonance point and antiresonance point clearly appeared.

Note that, in the shown Example 1, Example 2, Comparative Example 1, and Comparative Example 2, thicknesses of first layers 11/thicknesses of second layers 13 is 0.125λ/1.0 in Example 1, 0.375λ/0.5λ in Example 2, 1.0λ/0.25λ in Comparative Example 1, and 0.125λ/0.625λ in Comparative Example 2.

In the above description, Ta$_2$O$_5$ was used as an example of the material of the second layers 13 in a case where the resonance point and antiresonance point clearly appeared. However, as understood from the results of simulations which will be explained later, even in a case where the material of the second layers 13 was HfO$_2$, ZrO$_2$, TiO$_2$, or MgO, the resonance point and antiresonance point clearly appeared.

(Ranges of Thicknesses Etc. of Layers)

Below, for convenience, as shown in FIG. 2, sometimes the thickness of the conductive layer 9 (Al or Al alloy) will be represented by "$t_{Al}$", the thickness of the LT layer 7 will be represented by "$t_{LT}$", the thickness of the first layers 11 (SiO$_2$) will be represented by "$t_1$", and the thickness of the second layers 13 will be represented by "$t_2$". Further, sometimes the Euler angles of the LT layer 7 will be represented by "E" or "(φ, θ, ψ)".

The inventors of the present application assumed various values for the parameters described above ($t_{Al}$, $t_{LT}$, $t_1$, $t_2$, and E) for each of the materials for the second layers 13 and performed computer simulations for the frequency characteristics of the acoustic wave device 1. As a result, they found examples of ranges realizing resonance in a relatively high frequency region by utilizing the slab mode.

Here, for each of the materials for the second layers 13, an example of the ranges of the values of parameters described above will be explained by the following procedure. First, a combination of values of parameters by which relatively good characteristics can be obtained will be explained. Next, using this combination as the center (standard), the changes of the characteristics when changing the various types of parameters will be explained. Together with this, an example of ranges of the values of the various parameters will be explained.

Note that, the ranges which will be explained later are only examples. Naturally the values of the various parameters may be set beyond these ranges. Further, in the conditions of the computer simulations which will be explained below, matters which are not particularly explained (material of the conductive layer 9, number of stacked layers of the multilayer film 5, and pitch "p") are the same as those in Examples 1 and 2.

[Ta$_2$O$_5$]

Examples of ranges of the values of parameters when the material of the second layers 13 is Ta$_2$O$_5$ are given below:

(Values of Parameters Which Become Standard)

As a result of computer simulations, Example 3, Example 4, and Example 5 giving relatively good frequency characteristics were obtained.

Figure 4A:
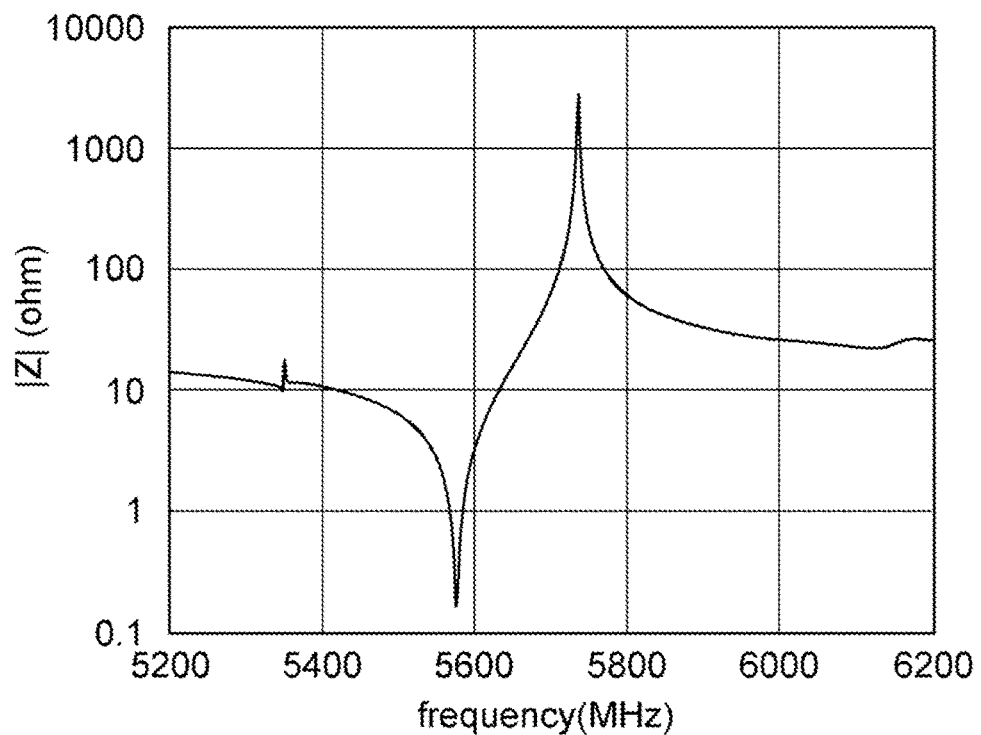
FIG. 4A and FIG. 4B are graphs showing the results of simulation according to Example 3.
Figure 4B:
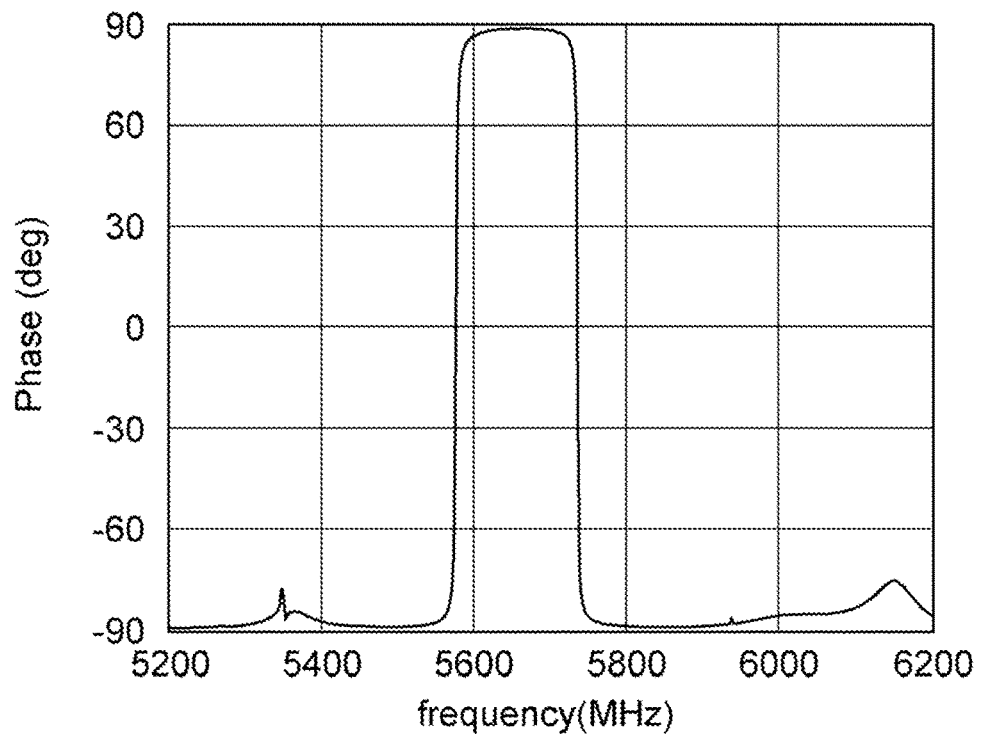
Figure 5A:
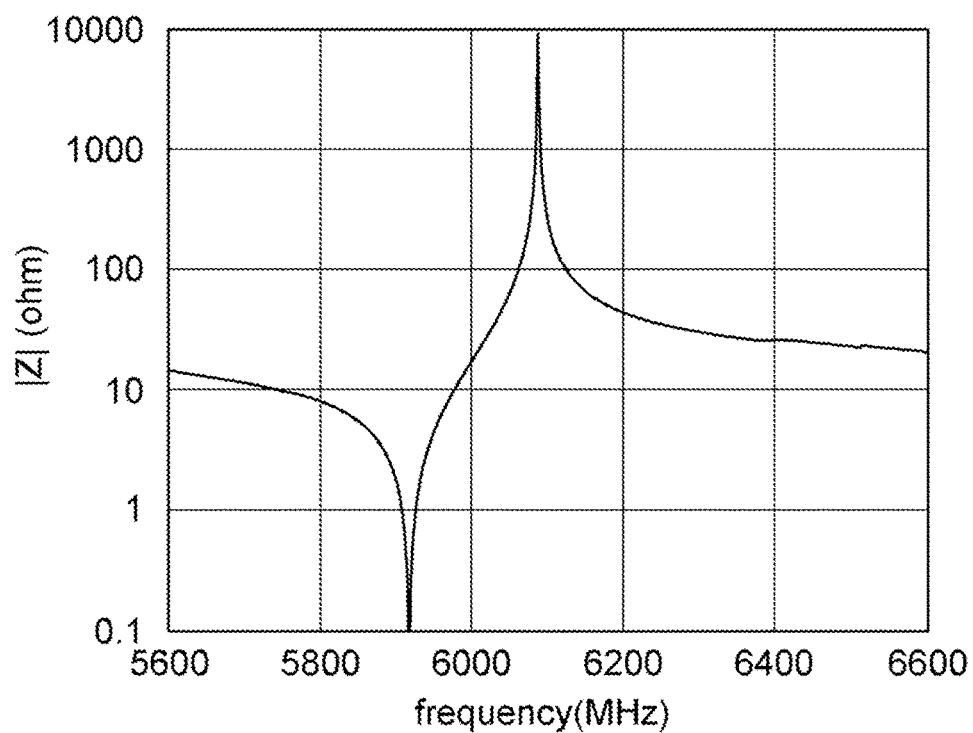
FIG. 5A and FIG. 5B are graphs showing the results of simulation according to Example 4.
Figure 5B:
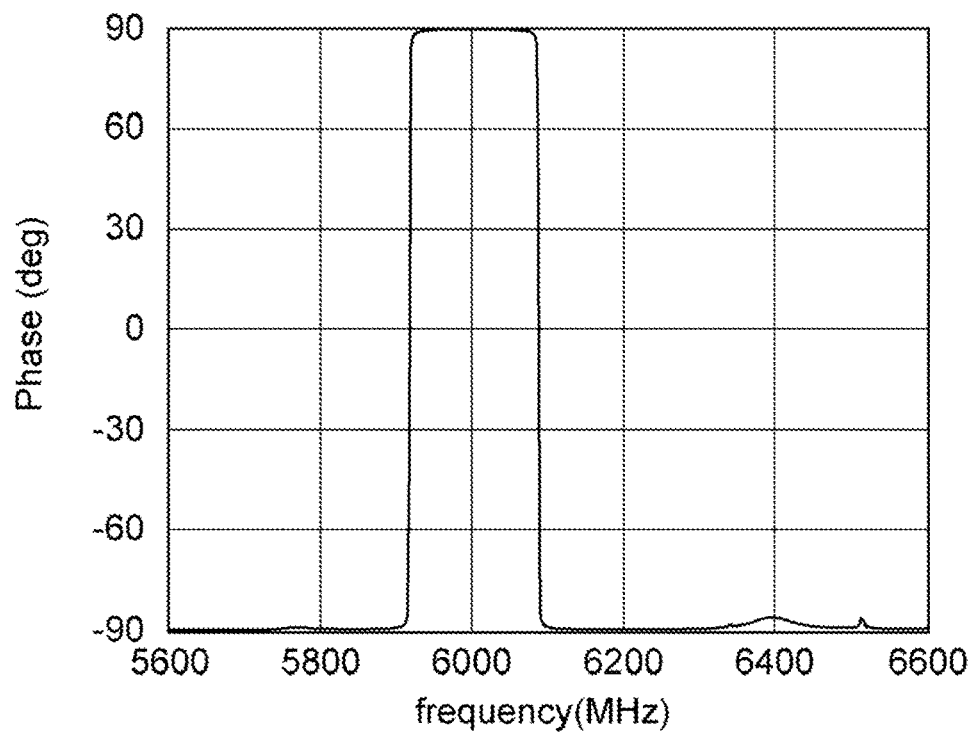
Figure 18A:
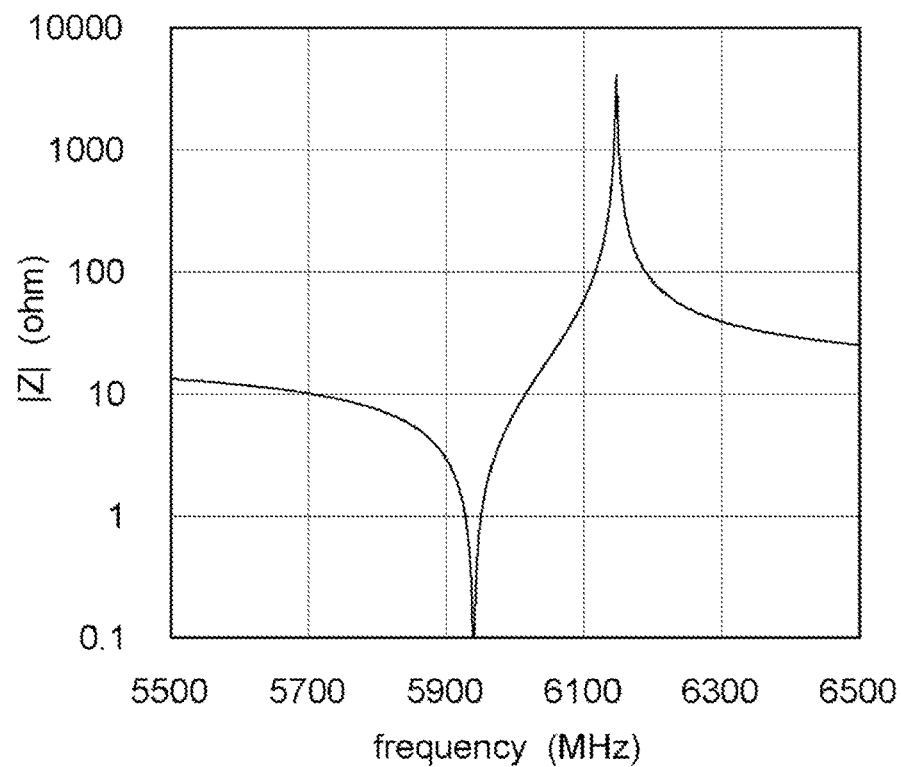
FIG. 18A and FIG. 18B are graphs showing the results of simulation according to Example 5.
Figure 18B:
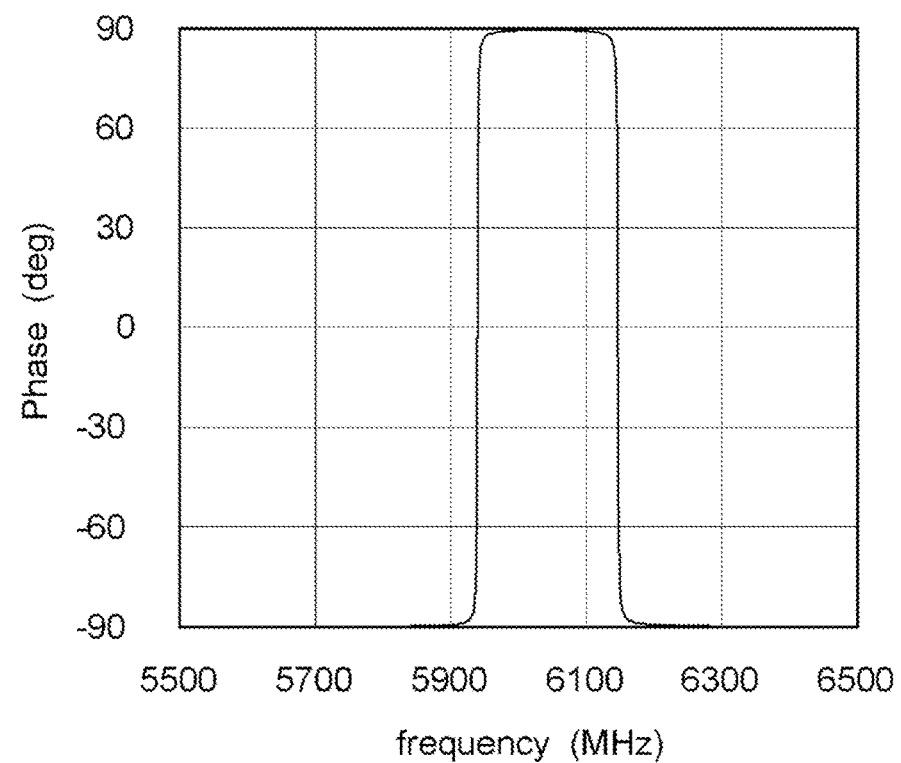

FIG. 4A and FIG. 4B are graphs showing the characteristics of Example 3, and FIG. 5A and FIG. 5B are graphs showing the characteristics of Example 4. FIG. 18A and FIG. 18B are graphs showing the characteristics of Example 5. FIG. 4A, FIG. 5A, and FIG. 18A are graphs each showing the change of the absolute value of impedance relative to the frequency in the same way as FIG. 3A. FIG. 4B, FIG. 5B, and FIG. 18B are graphs each showing the change of the phase of impedance relative to the frequency. In FIG. 4B, FIG. 5B, and FIG. 18B, the abscissas show the frequencies (MHz), and the ordinates show the phases of impedance (°). In FIG. 4B, FIG. 5B, and FIG. 18B, an insertion loss of the acoustic wave device 1 becomes smaller as the phase of impedance becomes closer to 90°.

The values of the various parameters in Example 3, Example 4, and Example 5 are as follows:

Example 3

$t_{Al}$=0.06λ, $t_{LT}$=0.20λ, $t_1$=0.10, $t_2$=0.98, E=(0°, 24°, 0°) (114°-rotated, Y-cut, X-propagation)

Example 4

$t_{Al}$=0.06λ, $t_{LT}$=0.18λ, $t_1$=0.1, $t_2$=0.33, E=(0°, 16°, 0°) (106°-rotated, Y-cut, X-propagation)

Example 5

$t_{Al}$=0.06λ, $t_{LT}$=0.175λ, $t_1$=0.10λ, $t_2$=0.088λ, E=(0°, 25°, 0°) (115°-rotated, Y-cut, X-propagation)

As shown in FIG. 4A, FIG. 4B, FIG. 5A, FIG. 5B, FIG. 18A, and FIG. 18B, in Examples 3, 4, and 5, the resonance point and antiresonance point appear in a relatively high frequency region. Further, on the peripheries of the resonance point and antiresonance point, almost no spurious emission is generated. Further, the phase of impedance closely coincides with 900 between the resonance point and the antiresonance point.

Note that, when the material of the second layers 13 is a material other than $Ta_2O_5$ as explained later, the "relatively good frequency characteristics" referred to in Examples giving the standard values of parameters also designate the above characteristics.

Below, a case (Case 1) where various values were assumed by using the values of parameters in Example 3 as centers (standards) a case (Case 2) where various values were assumed by using the values of parameters in Example 4 as centers (standards), and a case (Case 3) where various values were assumed by using the values of parameters in Example 5 as centers (standards) will be explained in that order.

(Thickness of Conductive Layer in Case 1)

Figure 6A:
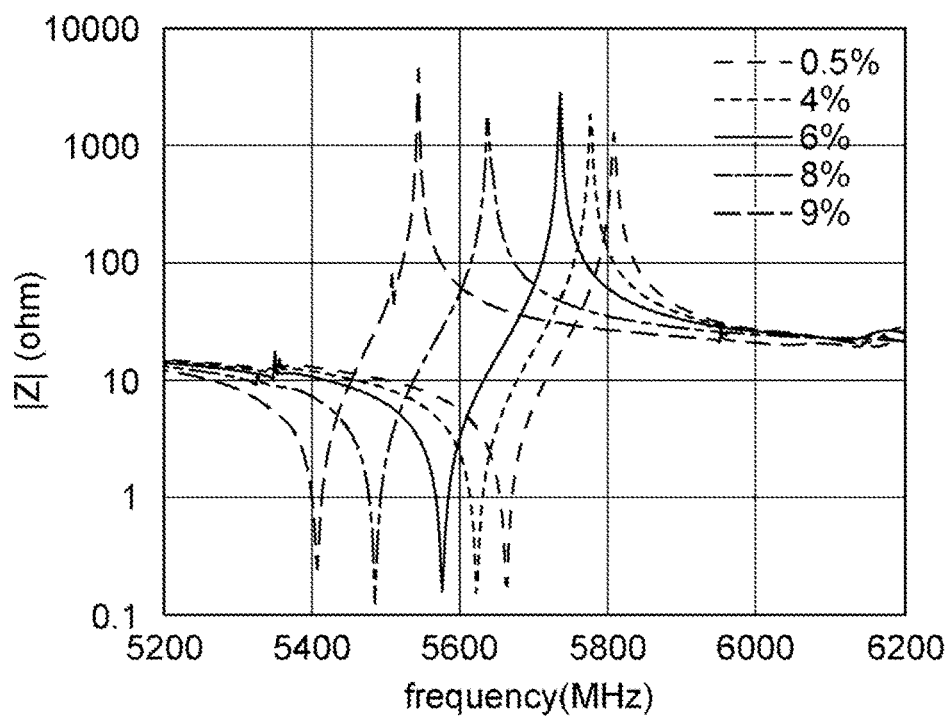
FIG. 6A and FIG. 6B are graphs showing the results of simulation when changing the thickness of a conductive layer in Example 3.
Figure 6B:
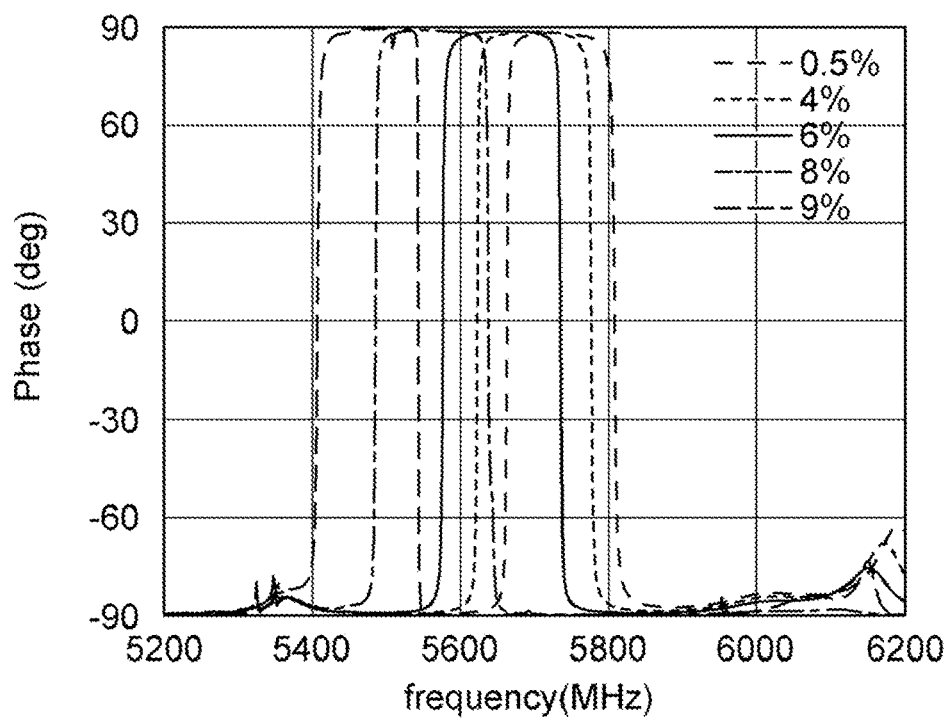

FIG. 6A and FIG. 6B are graphs, similar to FIG. 4A and FIG. 4B, showing the results of computer simulations assuming various values for the thickness $t_{Al}$ of the conductive layer 9 in Case 1. In the graphs, 0.5%, 4%, 6%, 8%, and 9% indicate that the thickness $t_{Al}$ is 0.005λ, 0.04λ, 0.06λ, 0.08λ, and 0.09λ. Note that, the values of parameters other than the thickness $t_{Al}$ are the standard values (same as the values in Example 3).

As shown in these graphs, even if the thickness $t_{Al}$ was made smaller than the standard value (0.06λ), there was no large difference in generation of a spurious emission and degree of loss. However, when the conductive layer 9 is made too thin, the electrical resistance becomes large. Therefore, from this viewpoint, 0.02λ may be made the lower limit of the example of range of the value of the thickness $t_{Al}$. Further, when the thickness $t_{Al}$ becomes 0.09λ or more, a ripple is generated between the resonance point and the antiresonance point. Accordingly, 0.08λ may be made the upper limit of the example of range of the value of the thickness $t_{Al}$.

(Thickness of LT Layer in Case 1)

Figure 7A:
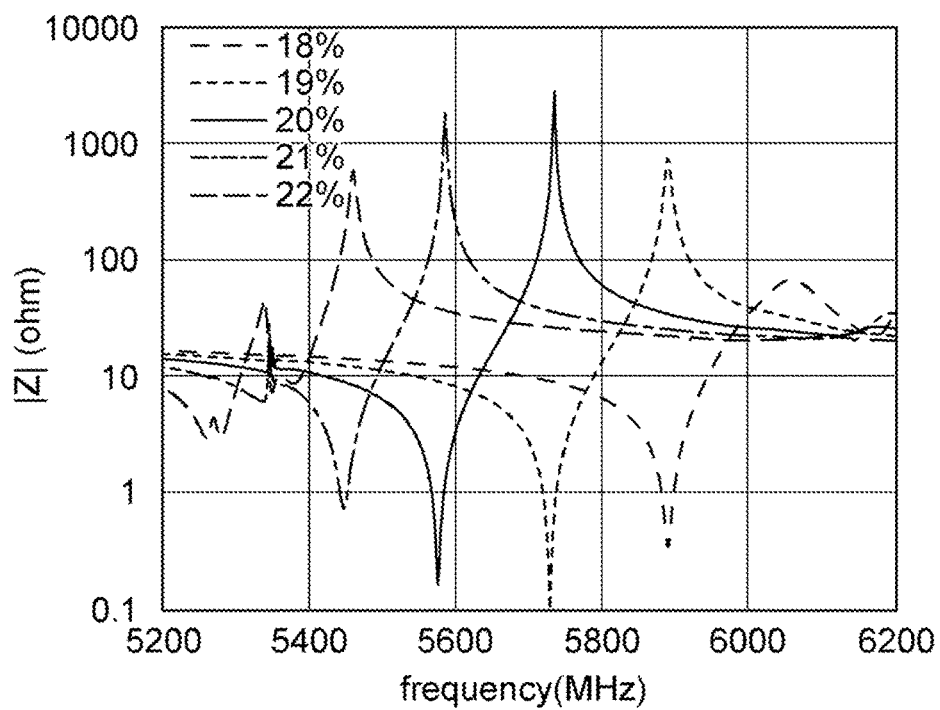
FIG. 7A and FIG. 7B are graphs showing the results of simulation when changing the thickness of an LT layer in Example 3.
Figure 7B:
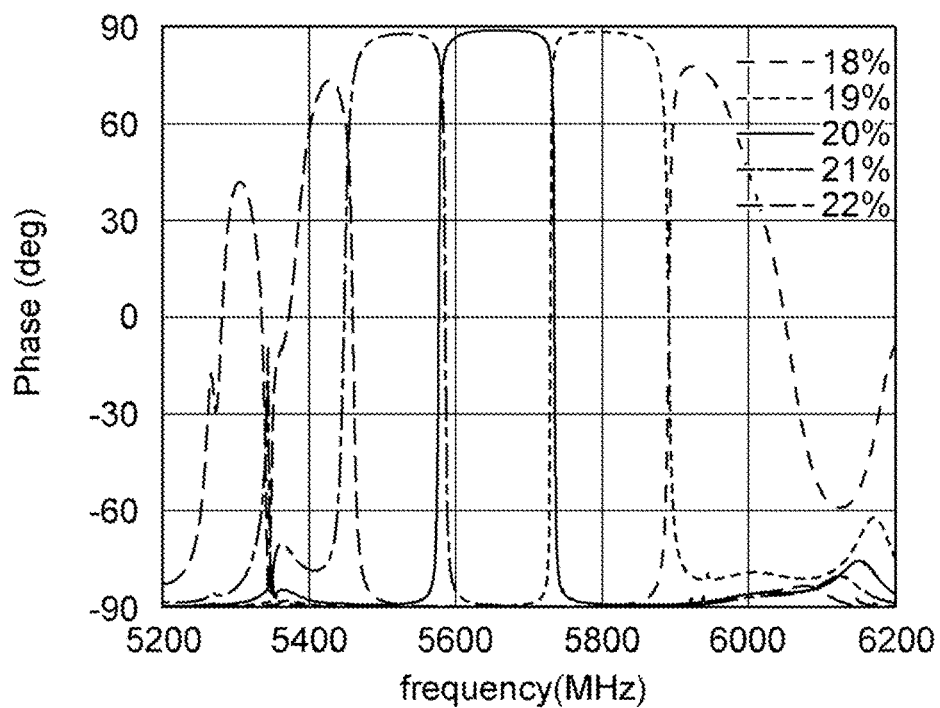

FIG. 7A and FIG. 7B are graphs, similar to FIG. 4A and FIG. 4B, showing the results of computer simulations assuming various values for the thickness $t_{LT}$ of the LT layer 7 in Case 1. In the graphs, 18%, 19%, 20%, 21%, and 22% indicate that the thickness $t_{LT}$ is 0.18λ, 0.19λ, 0.20λ, 0.21λ, and 0.22λ. Note that, the values of parameters other than the thickness $t_{LT}$ are the standard values (same as the values in Example 3).

As shown in these graphs, when the thickness $t_{LT}$ becomes 0.18λ or less, the loss between the resonance point and the antiresonance point becomes large. Further, when the thickness $t_{LT}$ becomes 0.22λ or more, the loss between the resonance point and the antiresonance point becomes large. Accordingly, 0.19λ to 0.21λ may be made the example of range of the value of the thickness $t_{LT}$.

(Thickness of First Layers in Case 1)

Figure 8A:
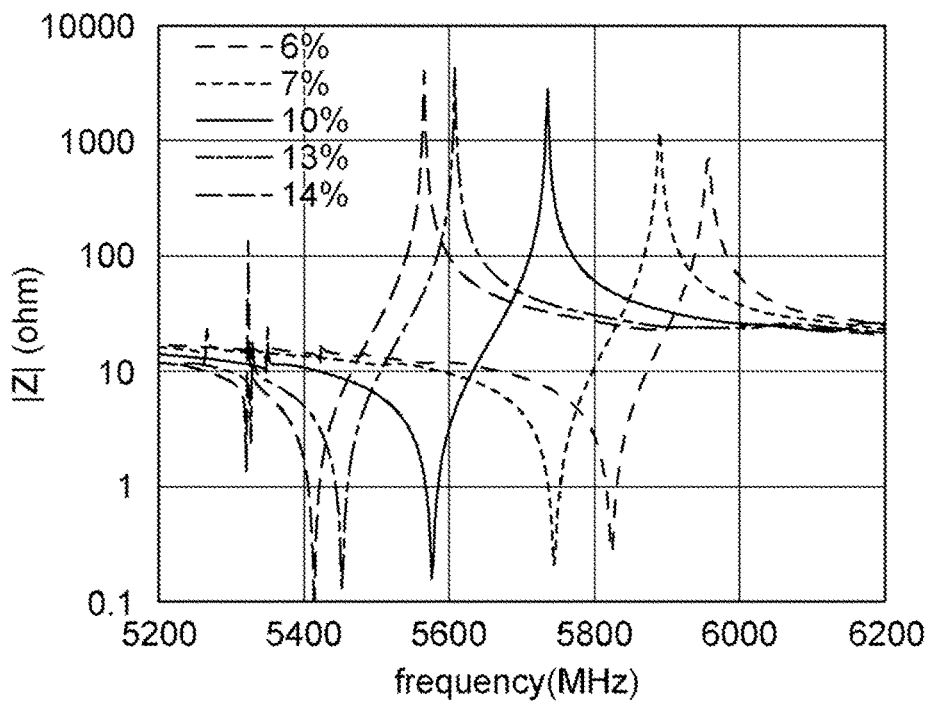
FIG. 8A and FIG. 8B are graphs showing the results of simulation when changing the thicknesses of first layers in Example 3.
Figure 8B:
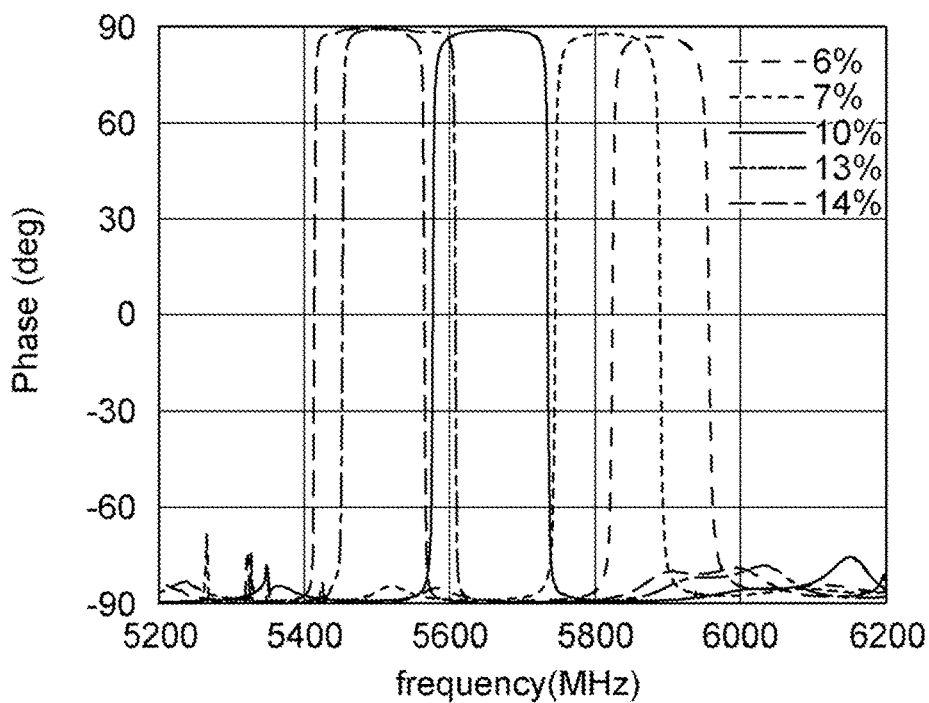

FIG. 8A and FIG. 8B are graphs, similar to FIG. 4A and FIG. 4B, showing the results of computer simulations assuming various values for the thickness $t_1$ of the first layers 11 in Case 1. In the graphs, 6%, 7%, 10%, 13%, and 14% indicate that the thickness $t_1$ is 0.06λ, 0.07λ, 0.10λ, 0.13λ, and 0.14λ. Note that, the values of parameters other than the thickness $t_1$ are the standard values (same as the values in Example 3).

As shown in these graphs, when the thickness $t_1$ becomes 0.06λ or less, the loss between the resonance point and the antiresonance point becomes large. Further, when the thickness $t_1$ becomes 0.14λ or more, a ripple in the vicinity of the resonance point becomes large. Accordingly, 0.07λ to 0.13λ may be made an example of range of the values of the thickness $t_1$.

(Thickness of Second Layers in Case 1)

Figure 9A:
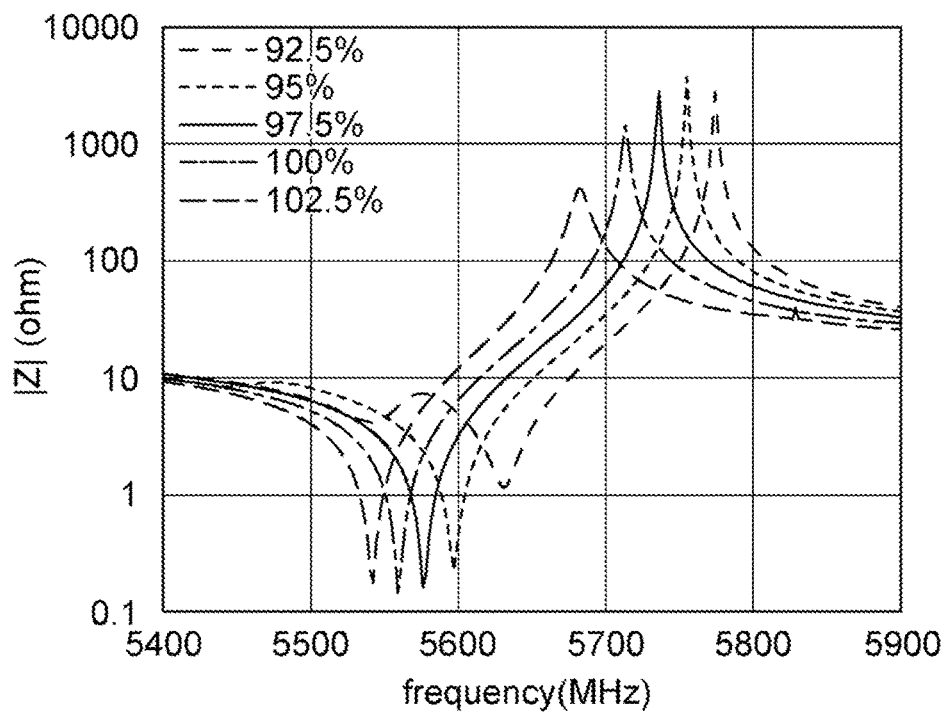
FIG. 9A and FIG. 9B are graphs showing the results of simulation when changing the thicknesses of second layers in Example 3.
Figure 9B:
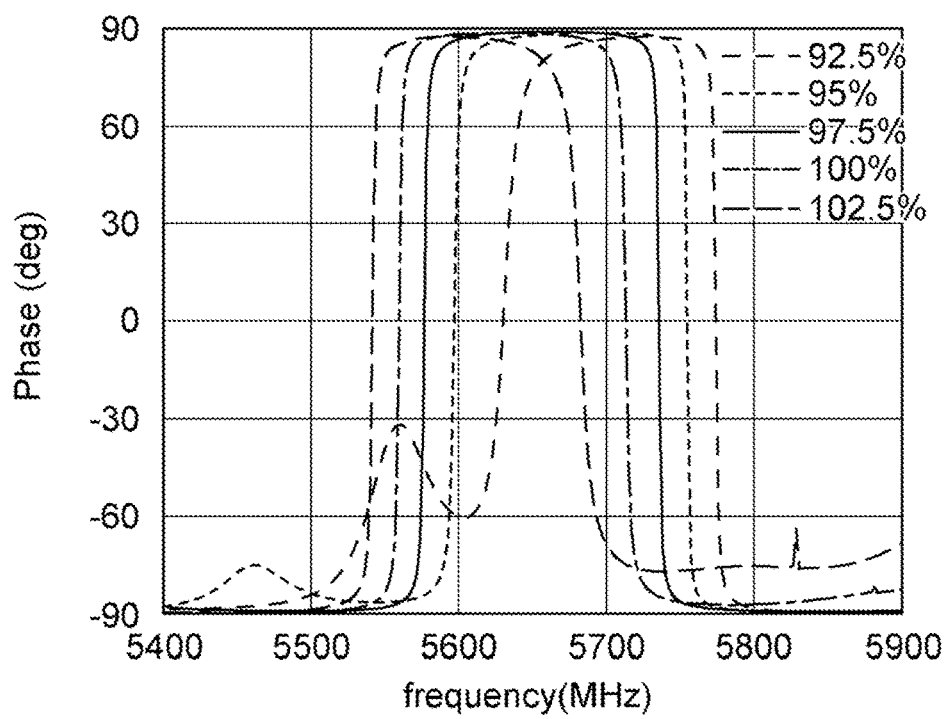

FIG. 9A and FIG. 9B are graphs the same as FIG. 4A and FIG. 4B, showing the results of computer simulations assuming various values for the thickness $t_2$ of the second layers 13 in Case 1. In the graphs, 92.5%, 95%, 97.5%, 100%, and 102.5% indicate that the thickness $t_2$ is 0.925λ, 0.95λ, 0.975λ, 1.00λ, and 1.025λ. Note that, the values of parameters other than the thickness $t_2$ are the standard values (same as the values in Example 3).

As shown in these graphs, when the thickness $t_2$ becomes 0.925λ or less, a loss between the resonance point and the antiresonance point becomes large. Further, when the thickness $t_2$ becomes 1.025λ or more, the loss between the resonance point and the antiresonance point becomes large. Further, in the same range, also the loss and ripple become larger on a lower frequency side than the resonance point and higher frequency side than the antiresonance point. Accordingly, 0.95λ to 1.0λ may be made an example of range of the values of the thickness $t_2$.

(Euler Angles of LT Layer in Case 1)

Figure 10A:
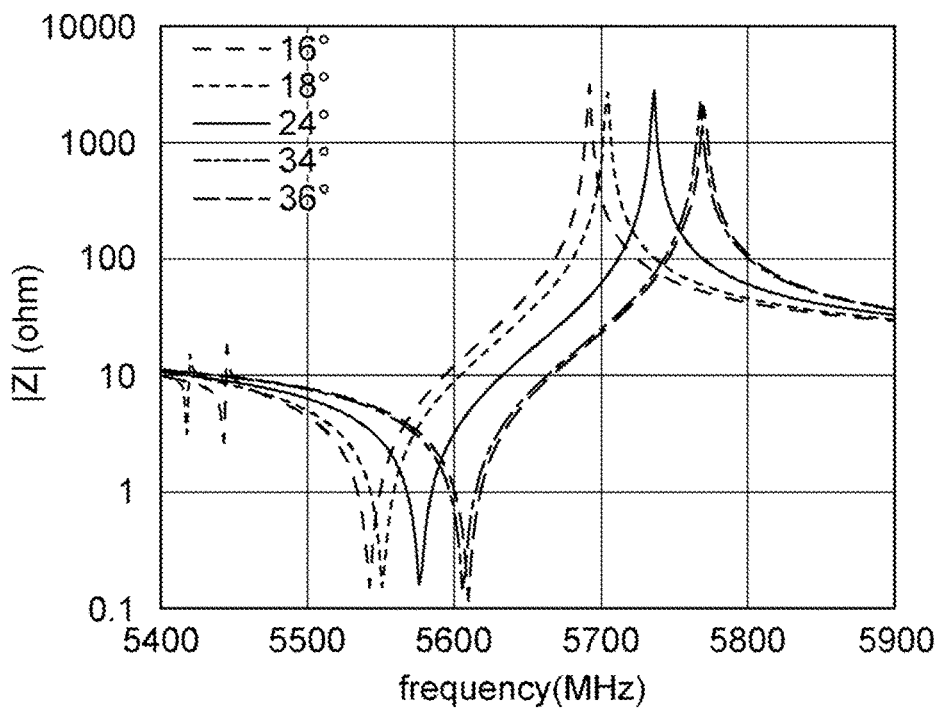
FIG. 10A and FIG. 10B are graphs showing the results of simulation when changing Euler angles of the LT layer in Example 3.
Figure 10B:
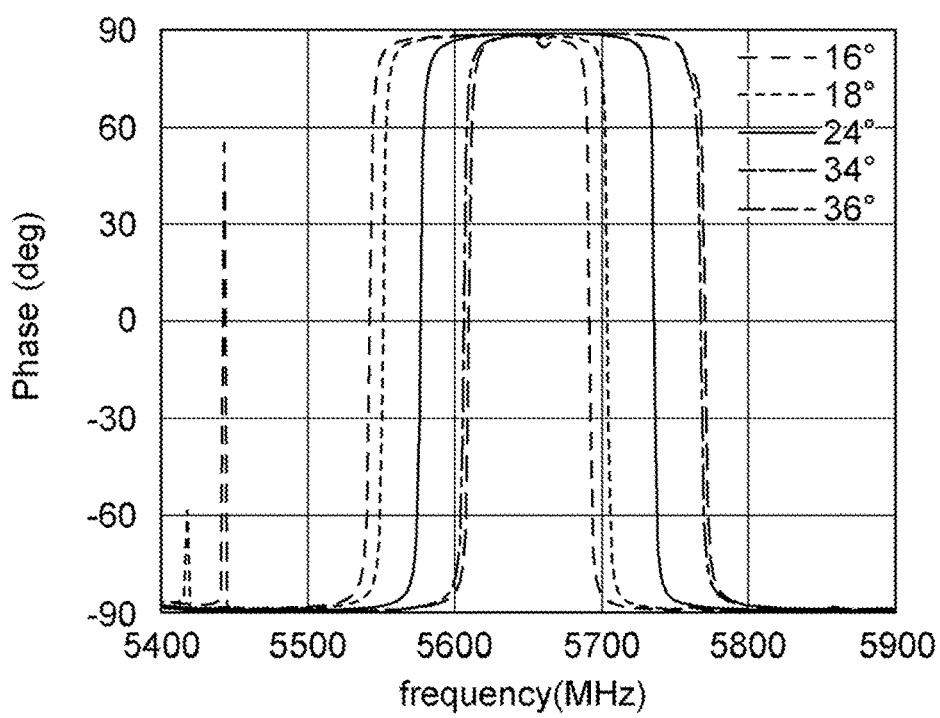

FIG. 10A and FIG. 10B are graphs, similar to FIG. 4A and FIG. 4B, showing the results of computer simulations assuming various values for θ in the Euler angles (φ, θ, ψ) of the LT layer 7 in Case 1. In the graphs, the angles 16, 180, 240, 34°, and 36° correspond to θ. Note that, the values of parameters other than θ are the standard values (same as the values in Example 3).

As shown in these graphs, when θ becomes 160 or less, the ripple in the vicinity of the resonance point becomes large. Further, when θ becomes 36° or more, the ripple in the vicinity of the antiresonance point becomes large. For example, when θ is 360 or more, if focusing on the shoulder characteristic in the vicinity of the antiresonance point, a ripple is generated in the vicinity of the phase 75°. Accordingly, 18° to 34° may be made an example of range of the values of θ.

(Thickness of Conductive Layer in Case 2)

Figure 11A:
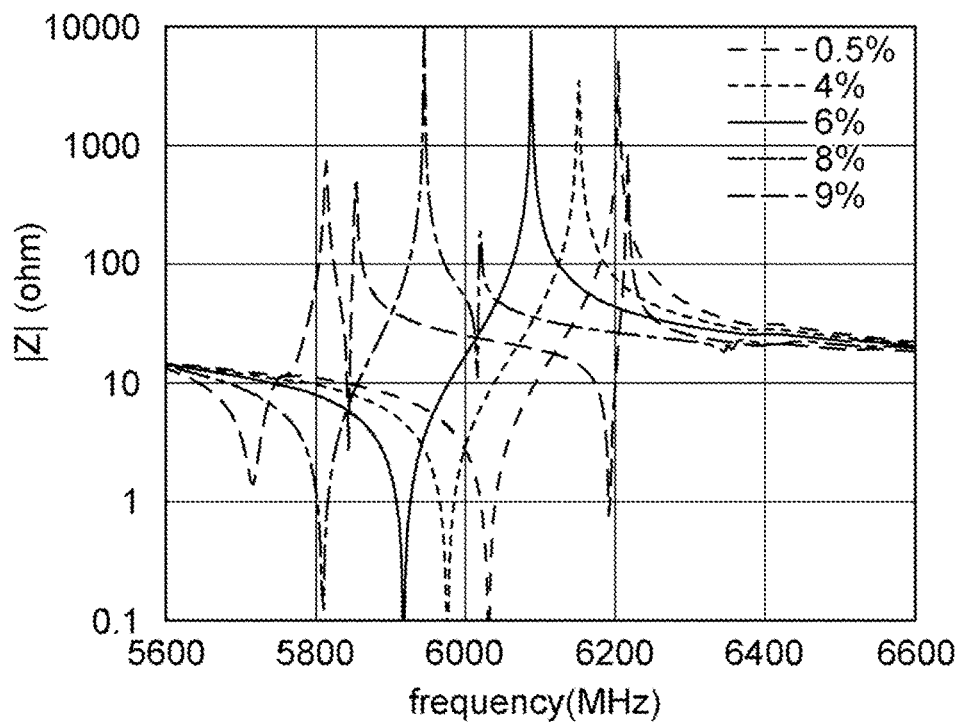
FIG. 11A and FIG. 11B are graphs showing the results of simulation when changing the thickness of the conductive layer in Example 4.
Figure 11B:
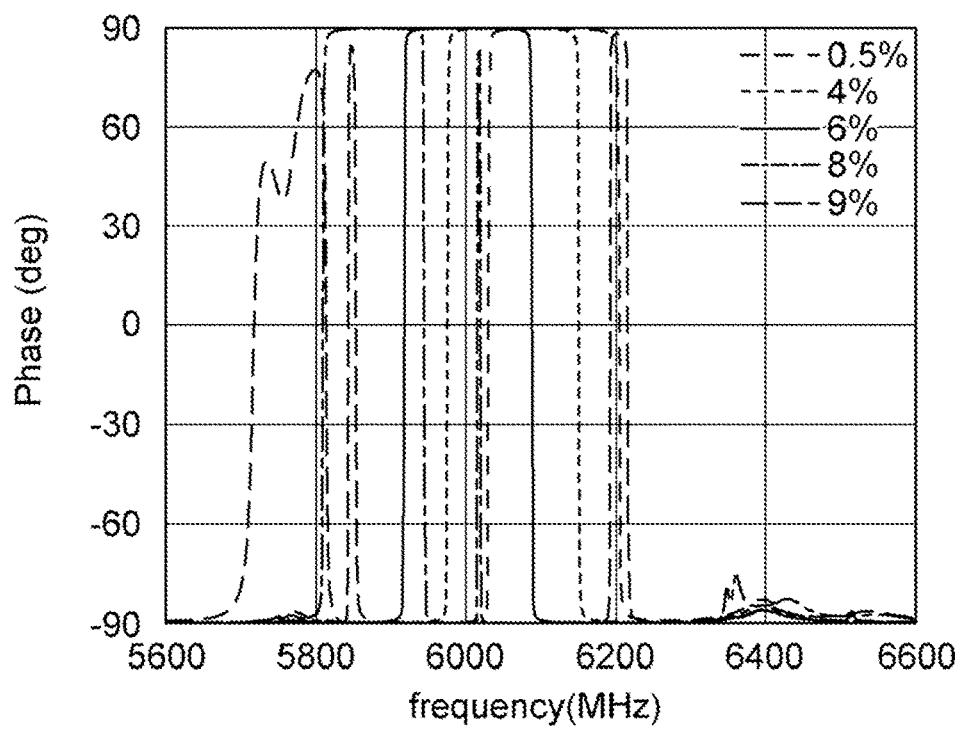

FIG. 11A and FIG. 11B are graphs, similar to FIG. 5A and FIG. 5B, showing the results of computer simulations assuming various values for the thickness $t_{Al}$ of the conductive layer 9 in Case 2. In the graphs, 0.5%, 4%, 6%, 8%, and 9% indicate that the thickness $t_{Al}$ is 0.005λ, 0.04λ, 0.06λ, 0.08λ, and 0.09λ. Note that, the values of parameters other than the thickness $t_{Al}$ are the standard values (same as the values in Example 4).

As shown in these graphs, even if the thickness $t_{Al}$ was made smaller than the standard value (0.06λ), a large difference was not seen concerning generation of a spurious emission and magnitude of loss. However, when the conductive layer 9 is made too thin, the electrical resistance becomes large. Therefore, from this viewpoint, 0.02λ may be made the lower limit of the example of range of the values of the thickness $t_{Al}$. Further, when the thickness $t_{Al}$ becomes 0.09λ or more, the ripple is large. Accordingly, 0.08λ may be made the upper limit of the example of range of the values of the thickness $t_{Al}$.

(Thickness of LT Layer in Case 2)

Figure 12A:
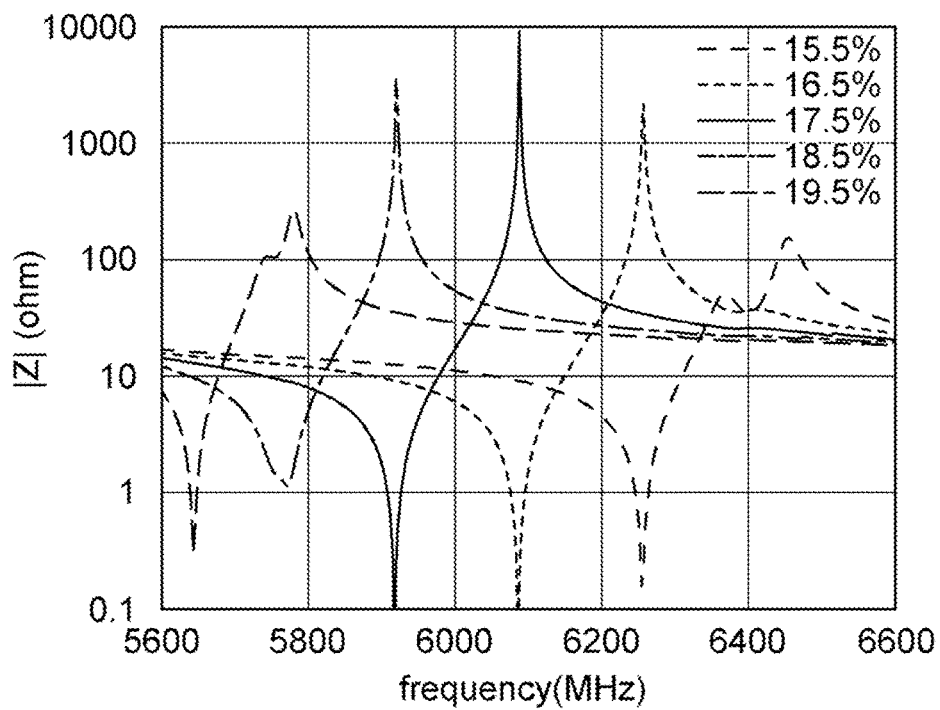
FIG. 12A and FIG. 12B are graphs showing the results of simulation when changing the thickness of the LT layer in Example 4.
Figure 12B:
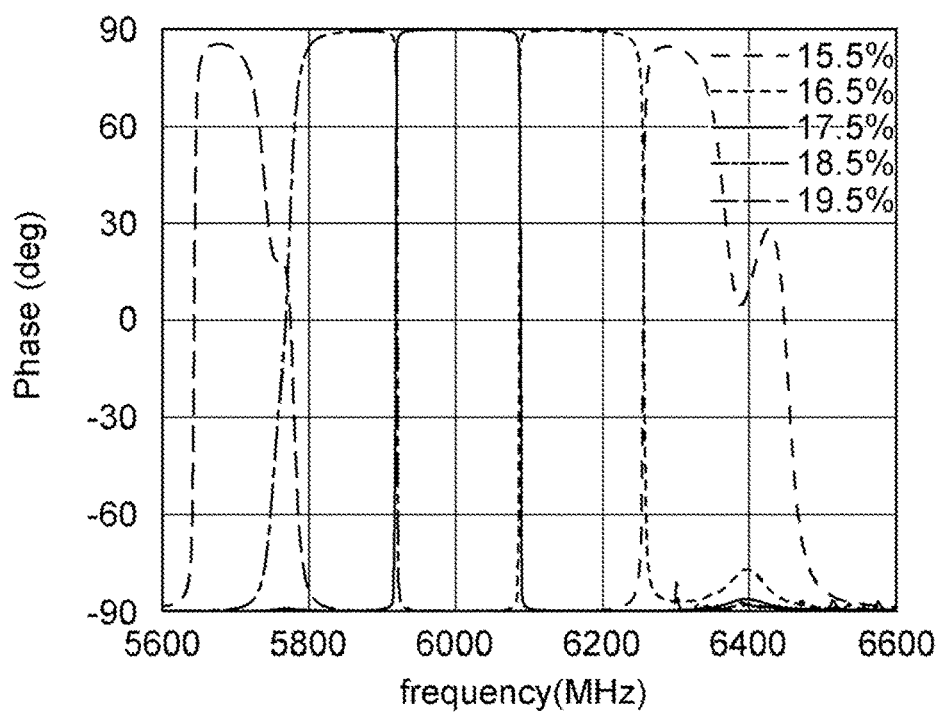

FIG. 12A and FIG. 12B are graphs, similar to FIG. 5A and FIG. 5B, showing the results of computer simulations assuming various values for the thickness $t_{LT}$ of the LT layer 7 in Case 2. In the graphs, 15.5%, 16.5%, 17.5%, 18.5%, and 19.5% indicate that the thickness $t_{LT}$ is 0.155λ, 0.165λ, 0.175λ, 0.185λ, and 0.195λ. Note that, the values of parameters other than the thickness $t_{LT}$ are the standard values (same as the values in Example 4).

As shown in these graphs, when the thickness $t_{LT}$ becomes 0.155λ or less, a loss between the resonance point and the antiresonance point becomes large. Further, when the thickness $t_{LT}$ becomes 0.195λ or more, the loss between the resonance point and the antiresonance point becomes large. Accordingly, 0.165λ to 0.185λ may be made the example of range of the values of the thickness $t_{LT}$.

(Thickness of First Layers in Case 2)

Figure 13A:
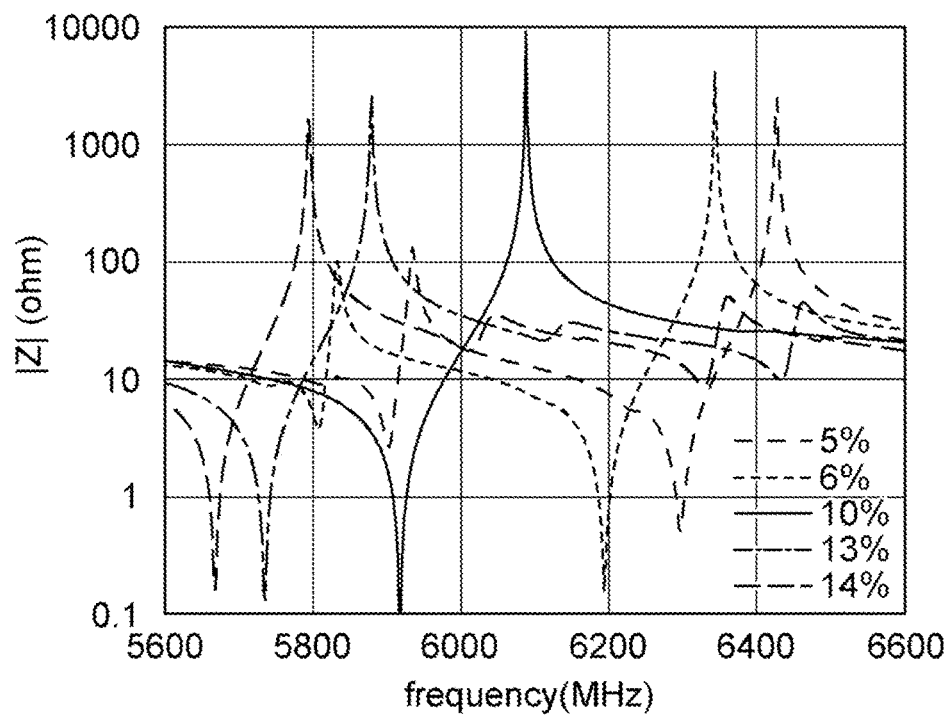
FIG. 13A and FIG. 13B are graphs showing the results of simulation when changing the thicknesses of the first layers in Example 4.
Figure 13B:
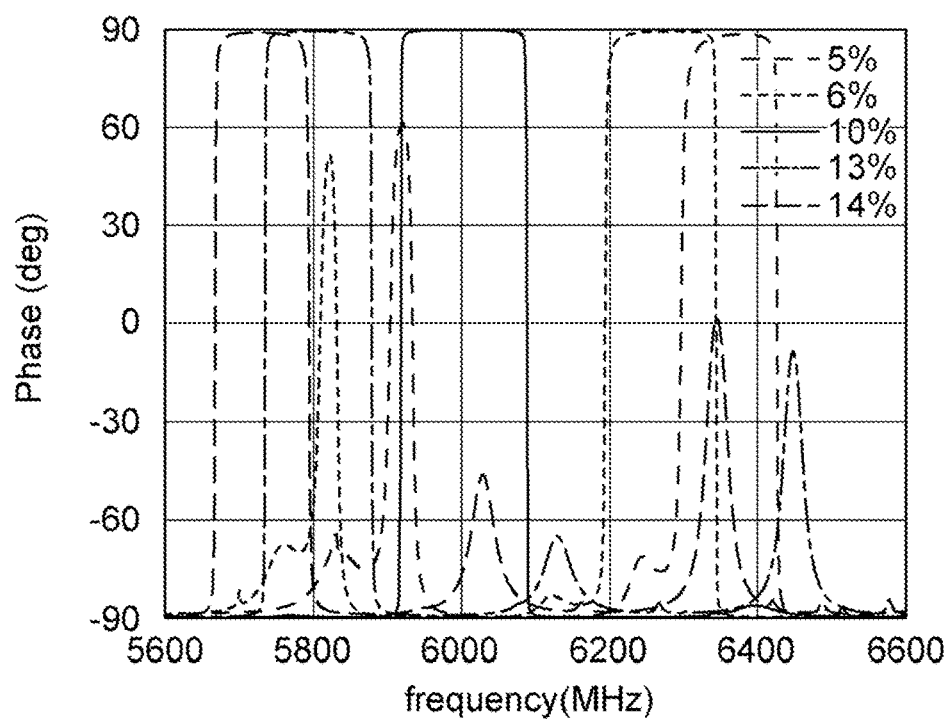

FIG. 13A and FIG. 13B are graphs, similar to FIG. 5A and FIG. 5B, showing the results of computer simulations assuming various values for the thickness $t_1$ of the first layers 11 in Case 2. In the graphs, 5%, 6%, 10%, 13%, and 14% indicate that the thickness $t_1$ is 0.05, 0.06λ, 0.10λ, 0.13λ, and 0.14λ. Note that, the values of parameters other than the thickness $t_1$ are the standard values (same as the values in Example 4).

As shown in these graphs, when the thickness $t_1$ becomes 0.05λ or less, a loss between the resonance point and the antiresonance point becomes large. Further, when the thickness $t_1$ becomes 0.14λ or more, a frequency difference between the resonance point and the antiresonance point becomes narrow. Accordingly, 0.06λ to 0.13λ may be made the example of range of the values of the thickness $t_1$.

(Thickness of Second Layers in Case 2)

Figure 14A:
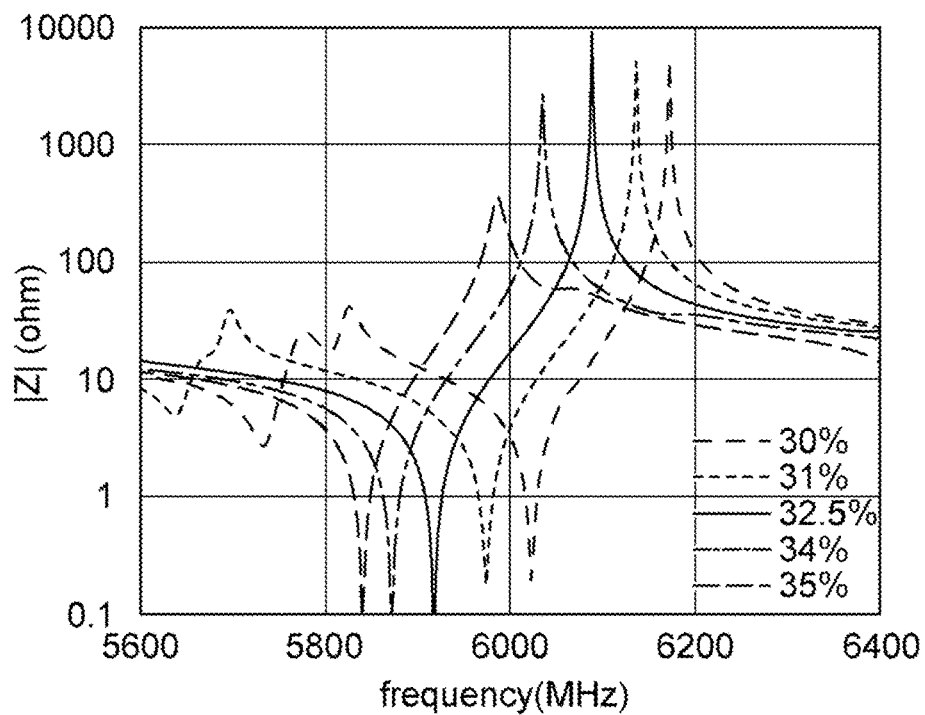
FIG. 14A and FIG. 14B are graphs showing the results of simulation when changing the thicknesses of the second layers in Example 4.
Figure 14B:
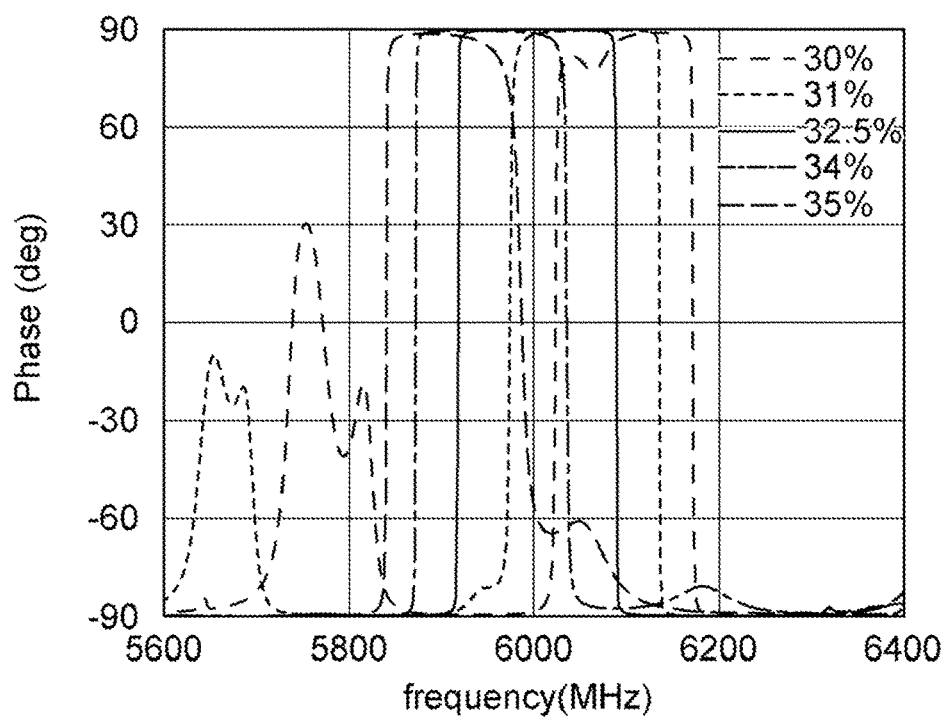

FIG. 14A and FIG. 14B are graphs, similar to FIG. 5A and FIG. 5B, showing the results of computer simulations assuming various values for the thickness $t_2$ of the second layers 13 in Case 2. In the graphs, 30%, 31%, 32.5%, 34%, and 35% indicate that the thickness $t_2$ is 0.30λ, 0.31λ, 0.325λ, 0.34λ, and 0.35λ. Note that, the values of parameters other than the thickness $t_2$ are the standard values (same as the values in Example 4).

As shown in these graphs, when the thickness $t_2$ becomes 0.30λ or less, the ripple in the vicinity of the resonance point becomes large. Further, when the thickness $t_2$ becomes 0.35λ or more, the loss between the resonance point and the antiresonance point becomes large. Accordingly, 0.31λ to 0.34λ may be made the example of range of the values of the thickness $t_2$.

(Euler Angles of LT Layer in Case 2)

Figure 15A:
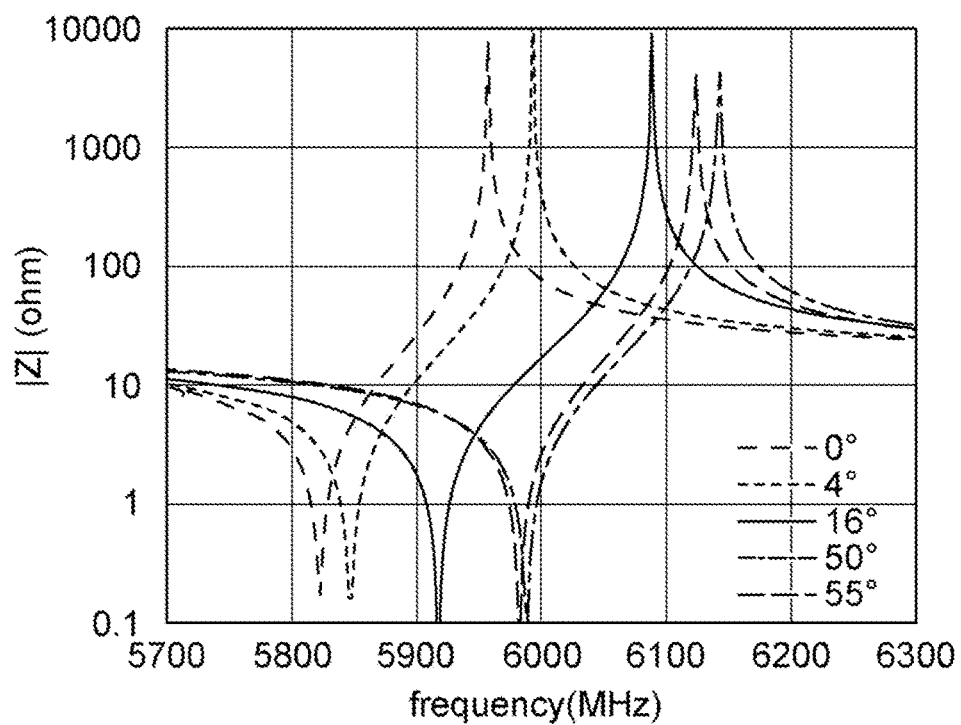
FIG. 15A and FIG. 15B are graphs showing the results of simulation when changing the Euler angles of the LT layer in Example 4.
Figure 15B:
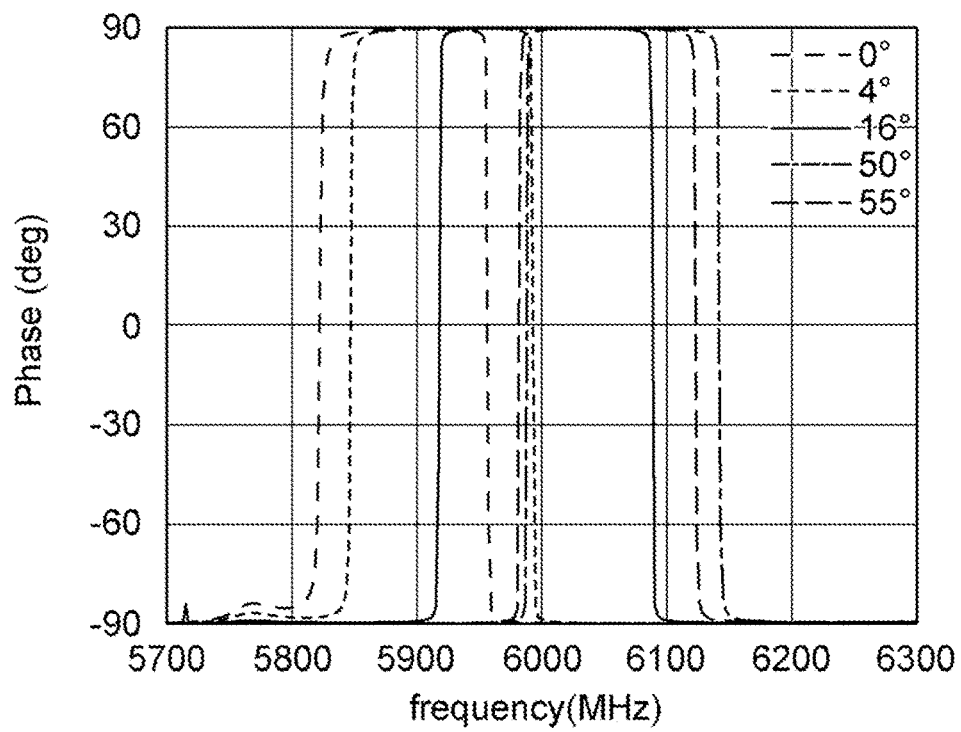

FIG. 15A and FIG. 15B are graphs, similar to FIG. 5A and FIG. 5B, showing the results of computer simulations assuming various values for θ in the Euler angles (φ, θ, ψ) of the LT layer 7 in Case 2. In the graphs, the angles 0°, 4°, 16°, 50°, and 55° correspond to θ. Note that, the values of parameters other than θ are the standard values (same as the values in Example 4).

As shown in these graphs, when θ becomes 0° or less, the frequency difference between the resonance point and the antiresonance point becomes narrower. Further, when θ becomes 550 or more, the frequency difference between the resonance point and the antiresonance point becomes narrower. Accordingly, 4° to 50° may be made the example of range of the values of θ.

(Thickness of Conductive Layer in Case 3)

Figure 19A:
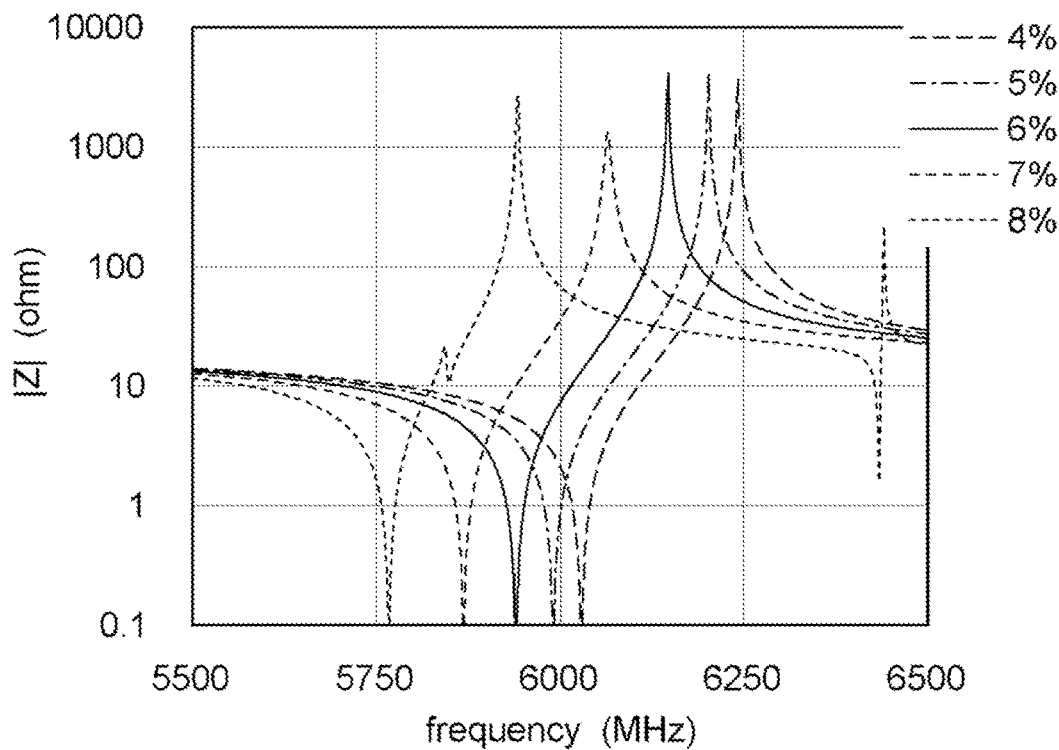
FIG. 19A and FIG. 19B are graphs showing the results of simulation when changing the thickness of the conductive layer in Example 5.
Figure 19B:
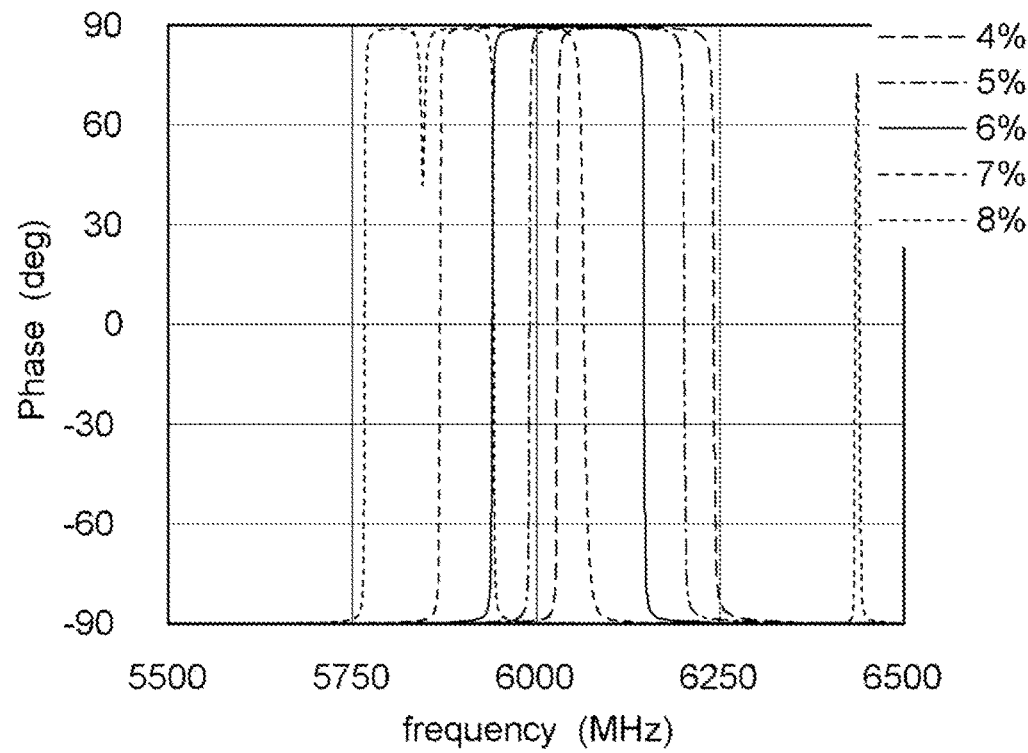

FIG. 19A and FIG. 19B are graphs, similar to FIG. 18A and FIG. 18B, showing the results of computer simulations assuming various values for the thickness $t_{Al}$ of the conductive layer 9 in Case 3. In the graphs, 4%, 5%, 6%, 7%, and 8% indicate that the thickness $t_{Al}$ is 0.04λ, 0.05λ, 0.06λ, 0.07λ, and 0.08λ. Note that, the values of parameters other than the thickness $t_{Al}$ are the standard values (same as the values in Example 5).

As shown in these graphs, even if the thickness $t_{Al}$ was made smaller than the standard value (0.06λ), a large difference was not seen in generation of a spurious emission and magnitude of loss. However, when the conductive layer 9 is made too thin, the electrical resistance becomes large. Therefore, from this viewpoint, 0.02λ may be made the lower limit of the example of range of the values of the thickness $t_{Al}$. Further, when the thickness $t_{Al}$ becomes 0.08λ or more, the ripple between the resonance point and the antiresonance point is large. Accordingly, 0.075λ may be made the upper limit of the example of range of the values of the thickness $t_{Al}$.

(Thickness of LT Layer in Case 3)

Figure 20A:
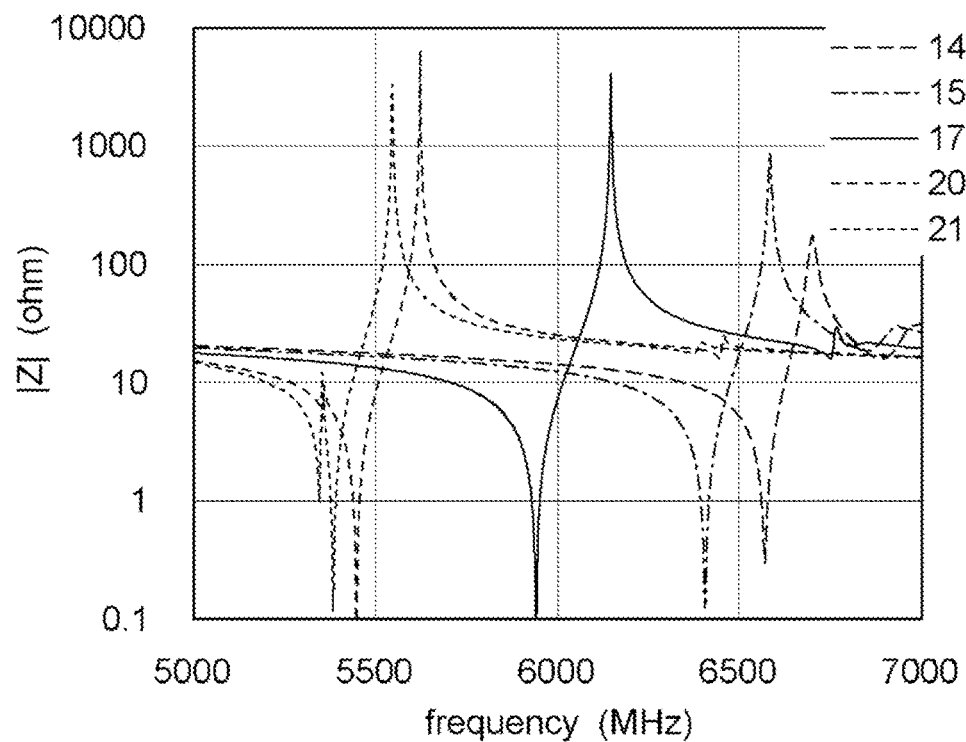
FIG. 20A and FIG. 20B are graphs showing the results of simulation when changing the thickness of the LT layer in Example 5.
Figure 20B:
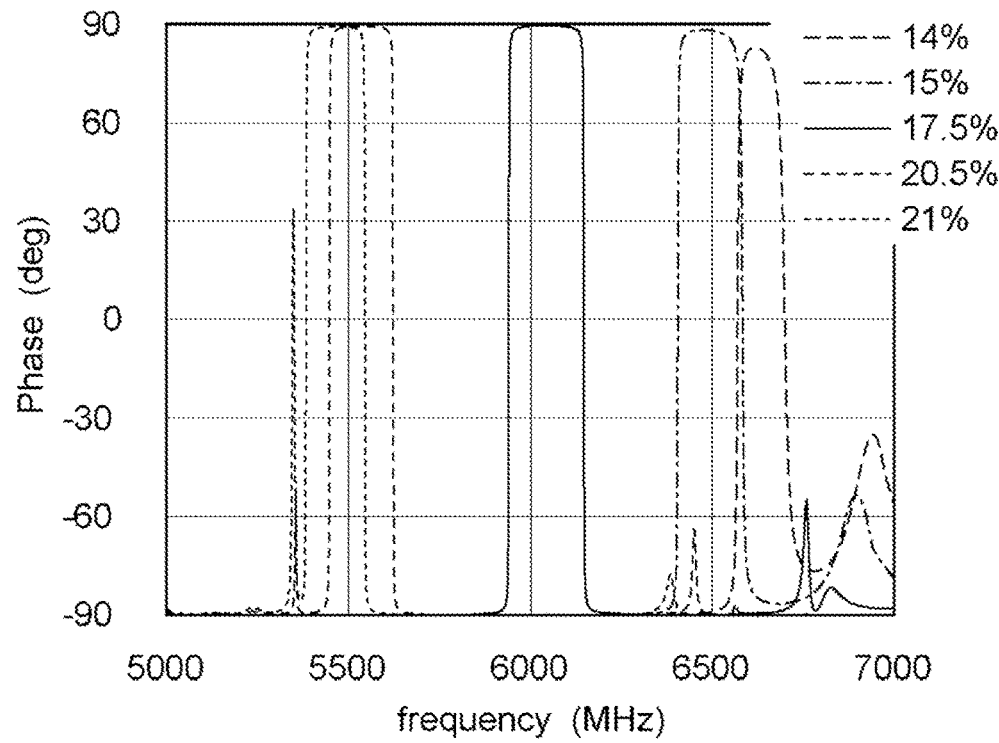

FIG. 20A and FIG. 20B are graphs, similar to FIG. 18A and FIG. 18B, showing the results of computer simulations assuming various values for the thickness $t_{LT}$ of the LT layer 7 in Case 3. In the graphs, 14%, 15%, 17.5%, 20.5%, and 21% indicate that the thickness $t_{LT}$ is 0.14λ, 0.15λ, 0.175λ, 0.205λ, and 0.21λ. Note that, the values of parameters other than the thickness $t_{LT}$ are the standard values (same as the values in Example 5).

As shown in these graphs, when the thickness $t_{LT}$ becomes 0.14λ or less, a loss between the resonance point and the antiresonance point becomes large. Further, when the thickness $t_{LT}$ becomes 0.21λ or more, a spurious emission is generated in the vicinity of the resonance point. Accordingly, 0.15λ to 0.205λ may be made the example of range of the values of the thickness $t_{LT}$.

(Thickness of First Layers in Case 3)

Figure 21A:
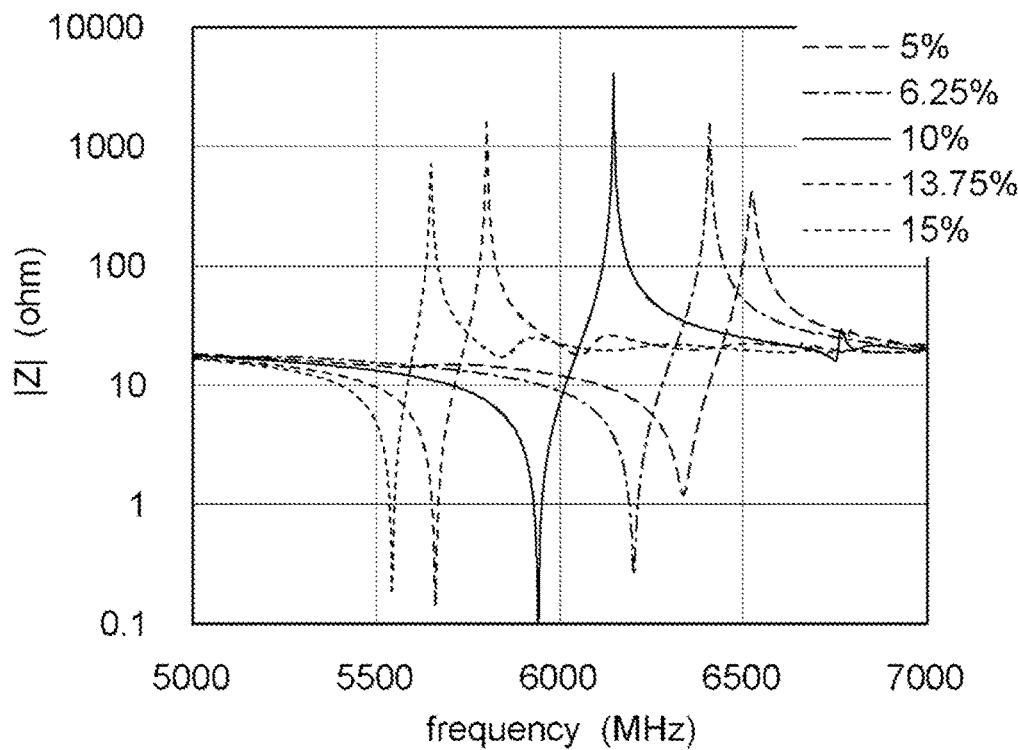
FIG. 21A and FIG. 21B are graphs showing the results of simulation when changing the thicknesses of the first layers in Example 5.
Figure 21B:
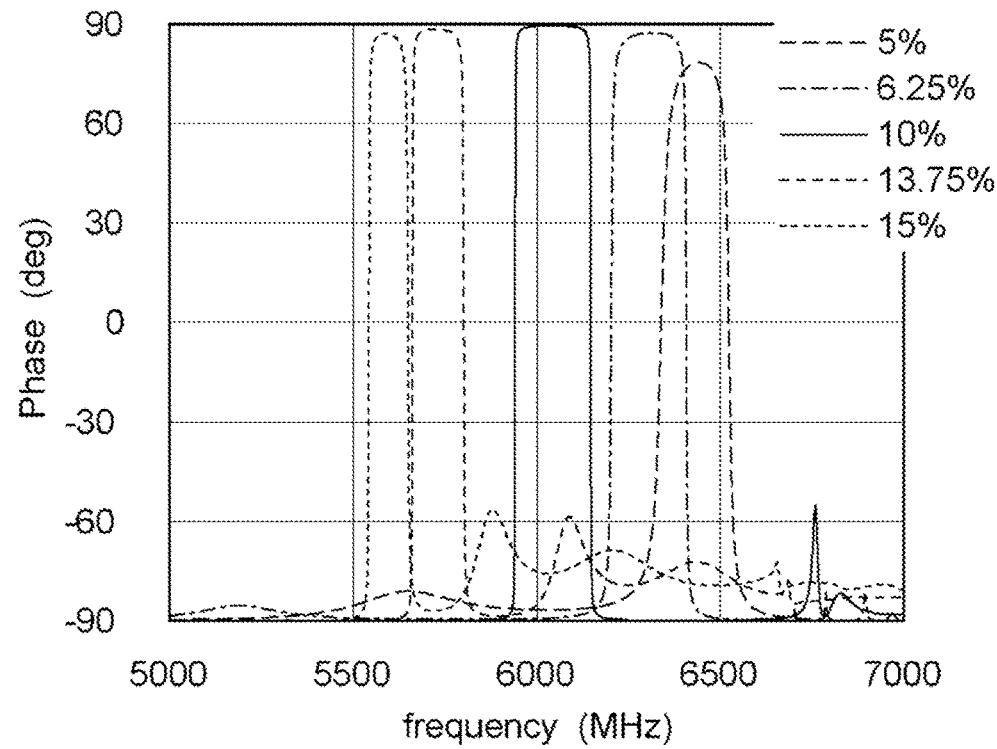

FIG. 21A and FIG. 21B are graphs, similar to FIG. 18A and FIG. 18B, showing the results of computer simulations assuming various values for the thickness $t_1$ of the first layers 11 in Case 3. In the graphs, 5%, 6.25%, 10%, 13.75%, and 15% indicate that the thickness $t_1$ is 0.05λ, 0.0625λ, 0.10λ, 0.1375λ, and 0.15λ. Note that, the values of parameters other than the thickness $t_1$ are the standard values (same as the values in Example 5).

As shown in these graphs, when the thickness $t_1$ becomes 0.05λ or less, a loss between the resonance point and the antiresonance point becomes large. Further, when the thickness $t_1$ becomes 0.15λ or more, the loss between the resonance point and the antiresonance point becomes large. Accordingly, 0.0625λ to 0.1375λ may be made the example of range of the values of the thickness $t_1$.

(Thickness of Second Layers in Case 3)

Figure 22A:
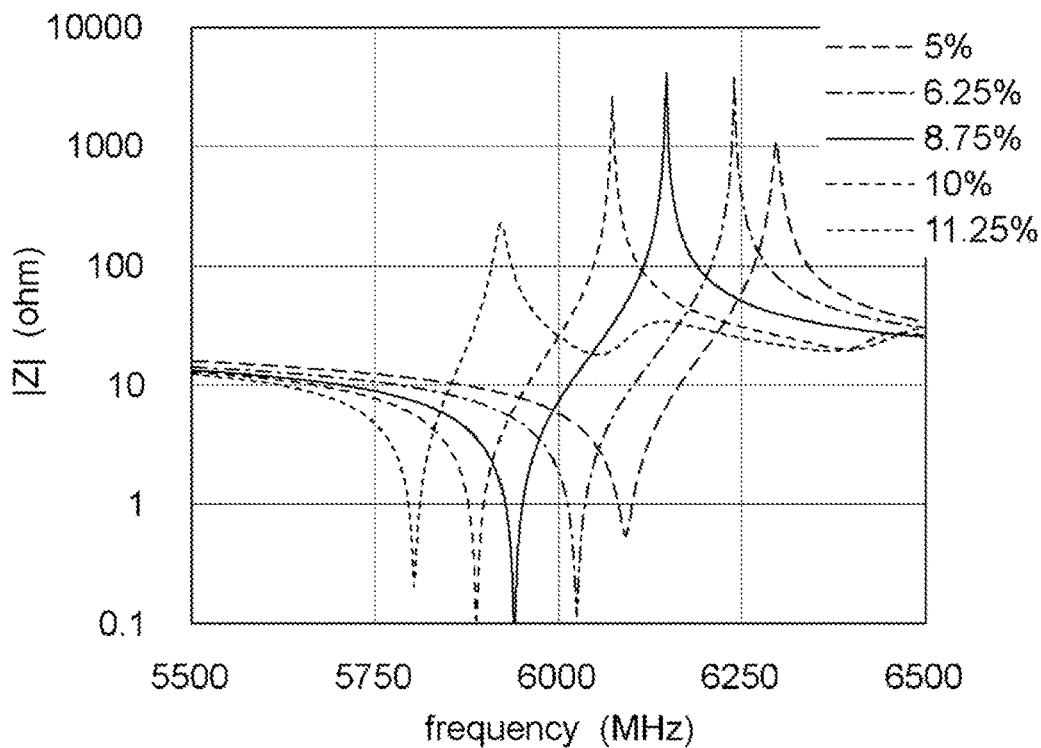
FIG. 22A and FIG. 22B are graphs showing the results of simulation when changing the thicknesses of the second layers in Example 5.
Figure 22B:
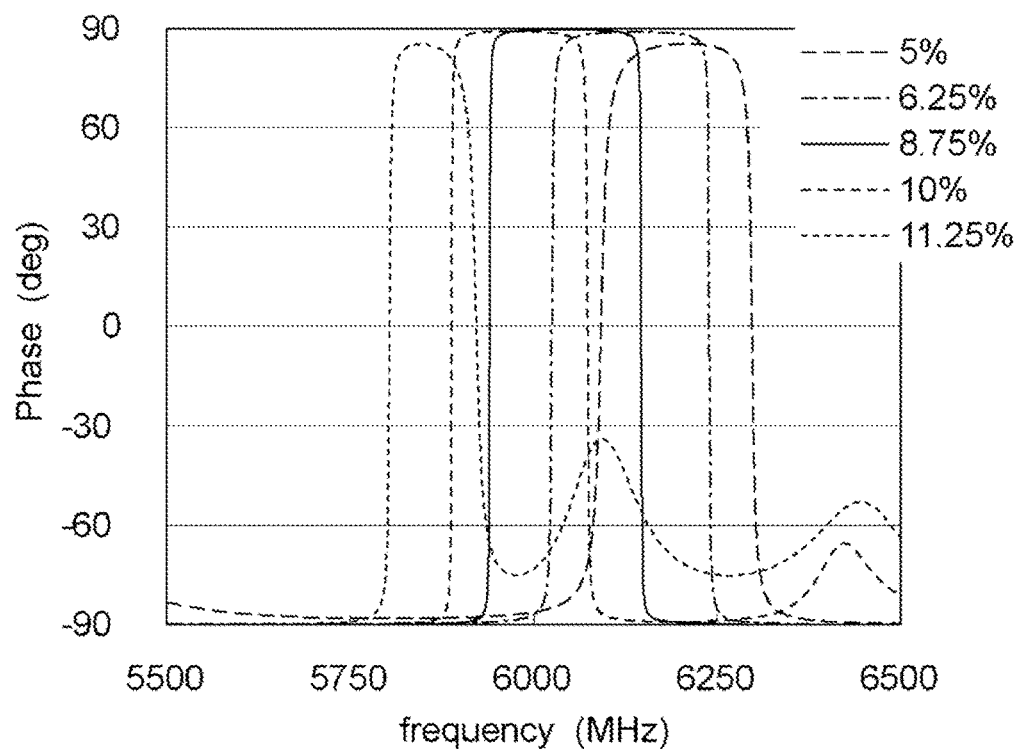

FIG. 22A and FIG. 22B are graphs, similar to FIG. 18A and FIG. 18B, showing the results of computer simulations assuming various values for the thickness $t_2$ of the second layers 13 in Case 3. In the graphs, 5%, 6.25%, 8.75%, 10%, and 11.25% indicate that the thickness $t_2$ is 0.05λ, 0.0625λ, 0.0875λ, 0.10λ, and 0.1125λ. Note that, the values of parameters other than the thickness $t_2$ are the standard values (same as the values in Example 5).

As shown in these graphs, when the thickness $t_2$ becomes 0.05λ or less, the loss between the resonance point and the antiresonance point becomes large. Further, when the thickness $t_2$ becomes 0.1125λ or more, the loss between the resonance point and the antiresonance point becomes large. Accordingly, 0.0625λ to 0.10λ may be made the example of range of the values of the thickness $t_2$.

(Euler Angles of LT Layer in Case 3)

Figure 23A:
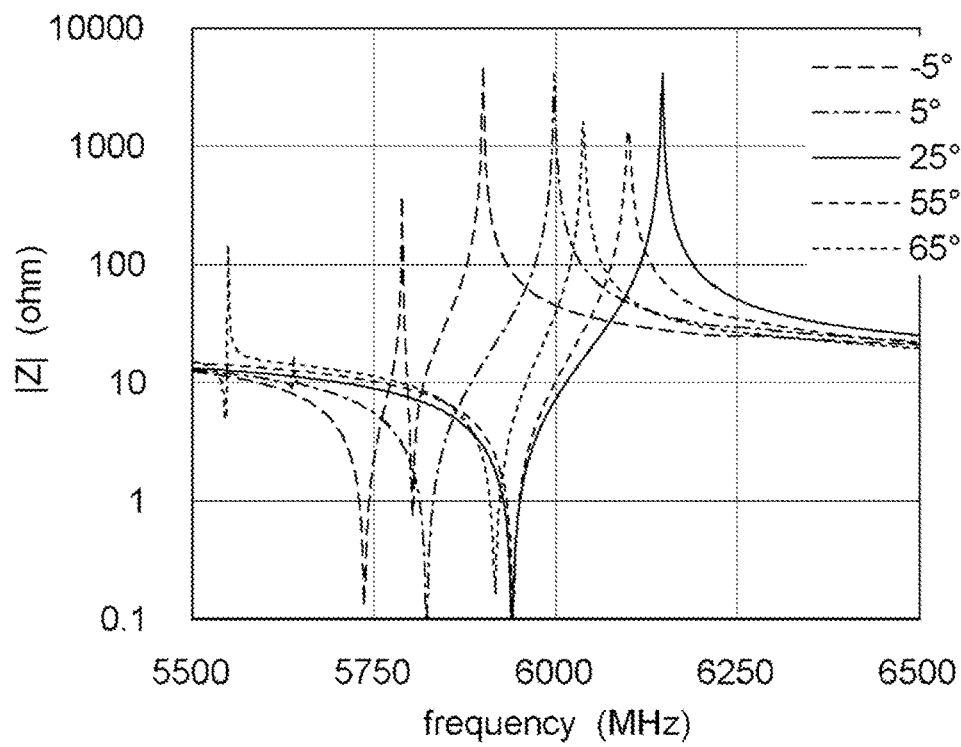
FIG. 23A and FIG. 23B are graphs showing the results of simulation when changing the Euler angles of the LT layer in Example 5.
Figure 23B:
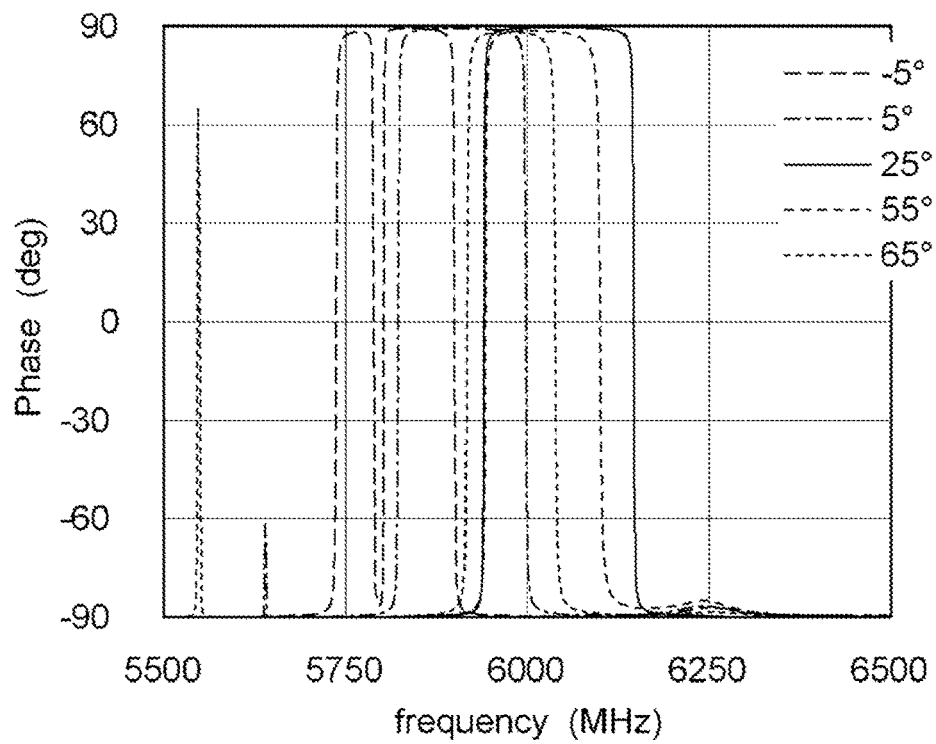

FIG. 23A and FIG. 23B are graphs, similar to FIG. 18A and FIG. 18B, showing the results of computer simulations assuming various values for θ in the Euler angles (φ, θ, ψ)

of the LT layer 7 in Case 3. In the graphs, the angles −5°, 5°, 25°, 55°, and 65° correspond to θ. Note that, the values of parameters other than θ are the standard values (same as the values in Example 5).

As shown in these graphs, when θ becomes 0° or less (in the graphs, −5° or less), the ripple between the resonance point and the antiresonance point becomes large.

Figure 24:
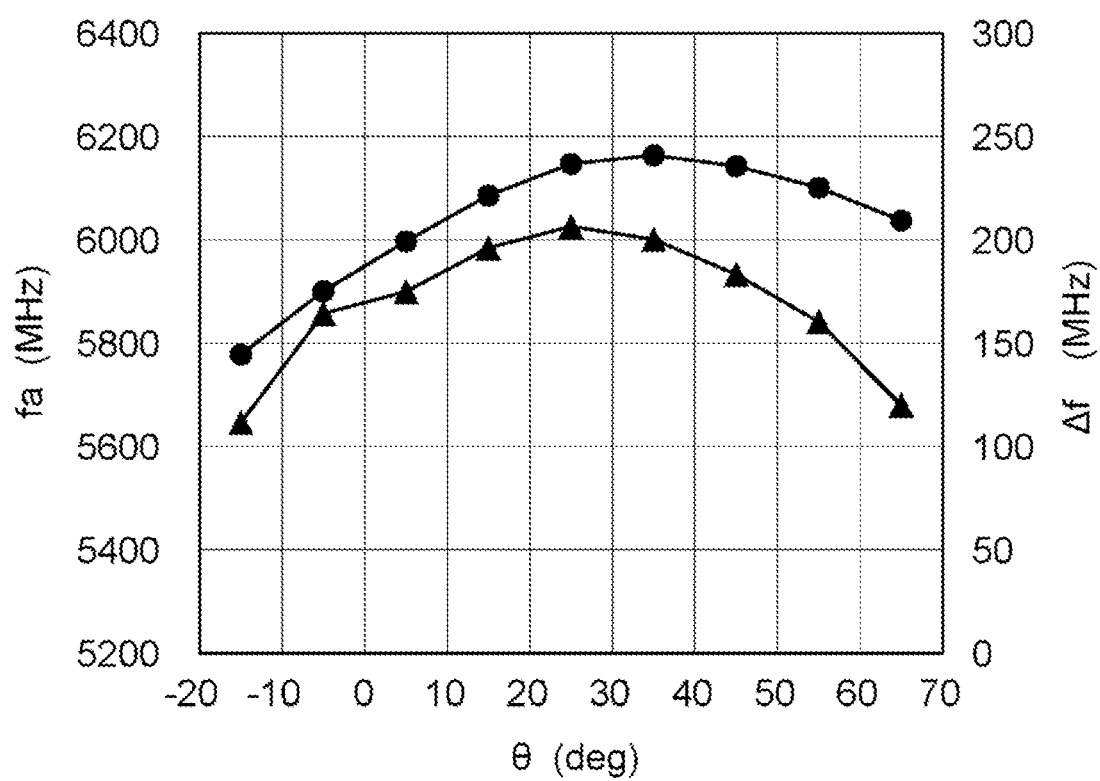
FIG. 24 is another graph showing the result of simulation when changing the Euler angles of the LT layer in Example 5.

FIG. 24 is another graph showing the results of computer simulations assuming various values for θ in the Euler angles (φ, θ, ψ) of the LT layer 7 in Case 3. In this graph, the abscissa shows θ (°). The left side ordinate shows the frequency fa (MHz) at the antiresonance point. The right side ordinate shows the frequency difference Δf (MHz) between the resonance point and the antiresonance point. A round plot shows the relationship between θ and fa. A triangular plot shows the relationship between θ and Δf. Note that, the values of parameters other than θ are the standard values (same as the values in Example 5).

Δf for example exerts an influence upon the width of the passing band when configuring the filter by the resonator 15. For example, in a ladder type filter, a width which is somehow narrower than 2 times Δf becomes the width of the passing band. Accordingly, based on whether Δf with a certain degree of magnitude is secured, the example of range of the values of parameters may be found as well.

As shown in FIG. 24, in a range where the value of θ is 650 or less, 100 MHz can be secured as Δf. However, Δf becomes smaller as the value of θ approaches from 25° to 65°. Although a plot is omitted here, Δf becomes small if θ is 70° or more. Further, on the 70° side, compared with the −20° side, Δf/fa also has become smaller.

When putting together the discoveries obtained from FIG. 23A, FIG. 23B, and FIG. 24, 5° to 65° may be made the example of range of the values of θ.

[HfO$_2$]

An example of the range of the values of parameters where the material of the second layer 13 is HfO$_2$ is as follows.

(Values of Parameters Which Become Standard)

As a result of computer simulations, Example 6 showing relatively good frequency characteristics was obtained. The values of various parameters in Example 6 are as follows: $t_{Al}$=0.06λ, $t_{LT}$=0.175λ, $t_1$=0.13λ, $t_2$=0.08λ, E=(0°, 25°, 0°) (115°-rotated, Y-cut, X-propagation)

Figure 25A:
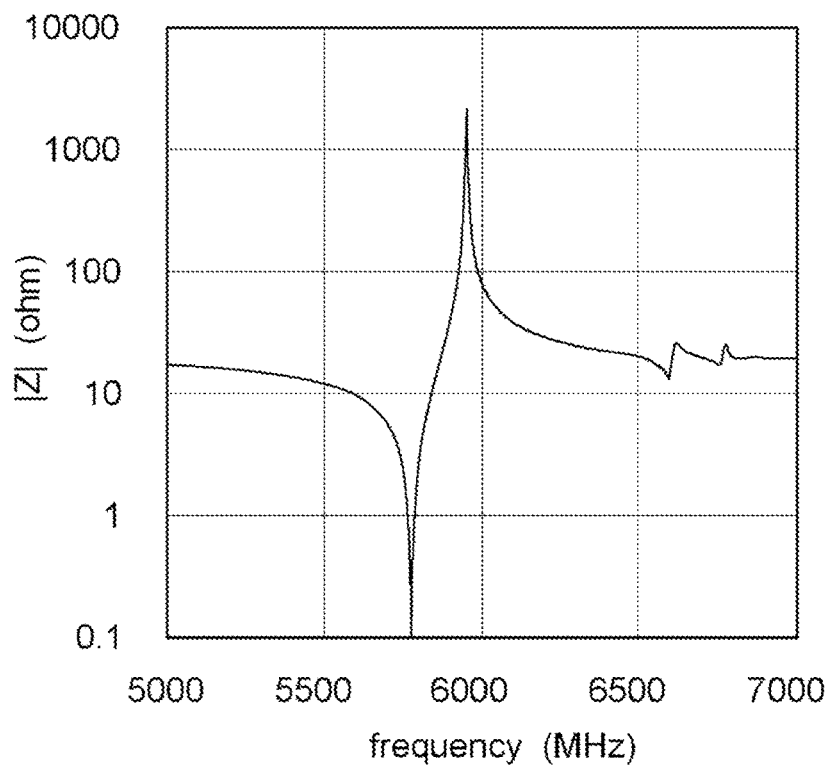
FIG. 25A and FIG. 25B are graphs showing the results of simulation according to Example 6.
Figure 25B:
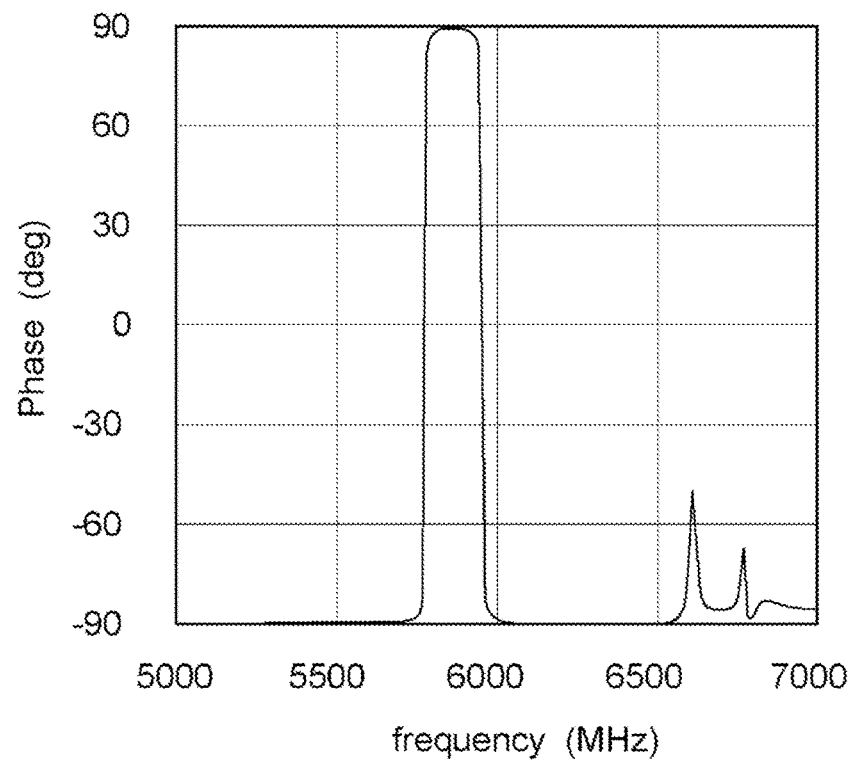

FIG. 25A and FIG. 25B are graphs showing the characteristics in Example 6. FIG. 25λ is a graph showing the change of the absolute value of impedance relative to the frequency in the same way as FIG. 4A. FIG. 25B is a graph showing the change of the phase of impedance relative to the frequency in the same way as FIG. 4B.

Below, a case (sometimes referred to as the HfO$_2$ case) where various values were assumed by using the values of parameters in Example 6 centers (standards) will be explained.

(Thickness of Conductive Layer in HfO$_2$ Case)

Figure 26A:
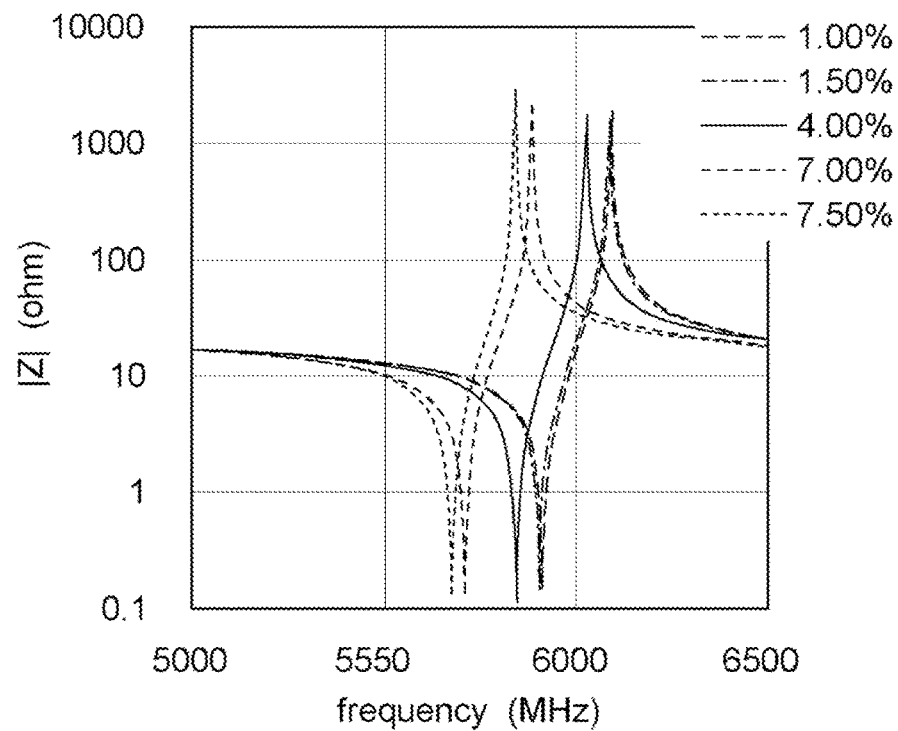
FIG. 26A and FIG. 26B are graphs showing the results of simulation when changing the thickness of the conductive layer in Example 6.
Figure 26B:
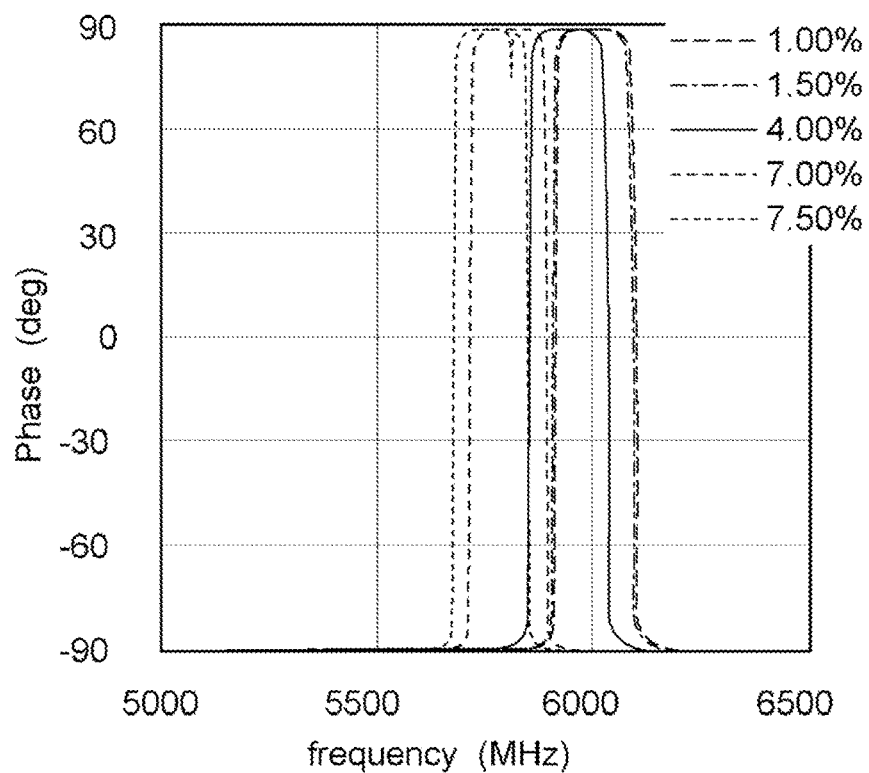

FIG. 26A and FIG. 26B are graphs, similar to FIG. 25A and FIG. 25B, showing the results of computer simulations assuming various values for the thickness $t_{Al}$ of the conductive layer 9 in the HfO$_2$ case. In the graphs, 1.00%, 1.50%, 4.00%, 7.00%, and 7.50% indicate that the thickness $t_{Al}$ is 0.01λ, 0.015λ, 0.04λ, 0.07λ, and 0.075λ. Note that, the values of parameters other than the thickness $t_{Al}$ are the standard values (same as the values in Example 6).

As shown in these graphs, even if the thickness $t_{Al}$ was made smaller than the standard value (0.06λ), no large difference was seen concerning generation of a spurious emission and the magnitude of loss. However, when the conductive layer 9 is made too thin, the electrical resistance becomes large. Therefore, from this viewpoint, 0.02λ may be made the lower limit of the example of range of the values of the thickness $t_{Al}$. Further, when the thickness $t_{Al}$ becomes 0.075λ or more, spurious emission is generated between the resonance point and the antiresonance point (in particular, see FIG. 26B). Accordingly, 0.07λ may be made the upper limit of the example of range of values of the thickness $t_{Al}$.

(Thickness of LT Layer in HfO$_2$ Case)

Figure 27A:
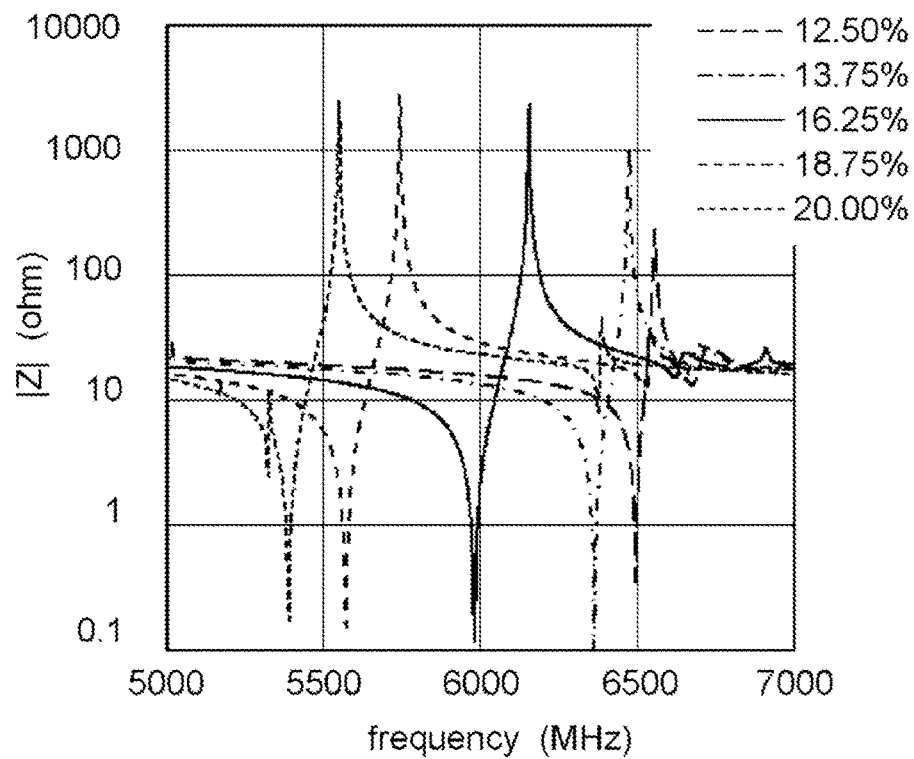
FIG. 27A and FIG. 27B are graphs showing the results of simulation when changing the thickness of the LT layer in Example 6.
Figure 27B:
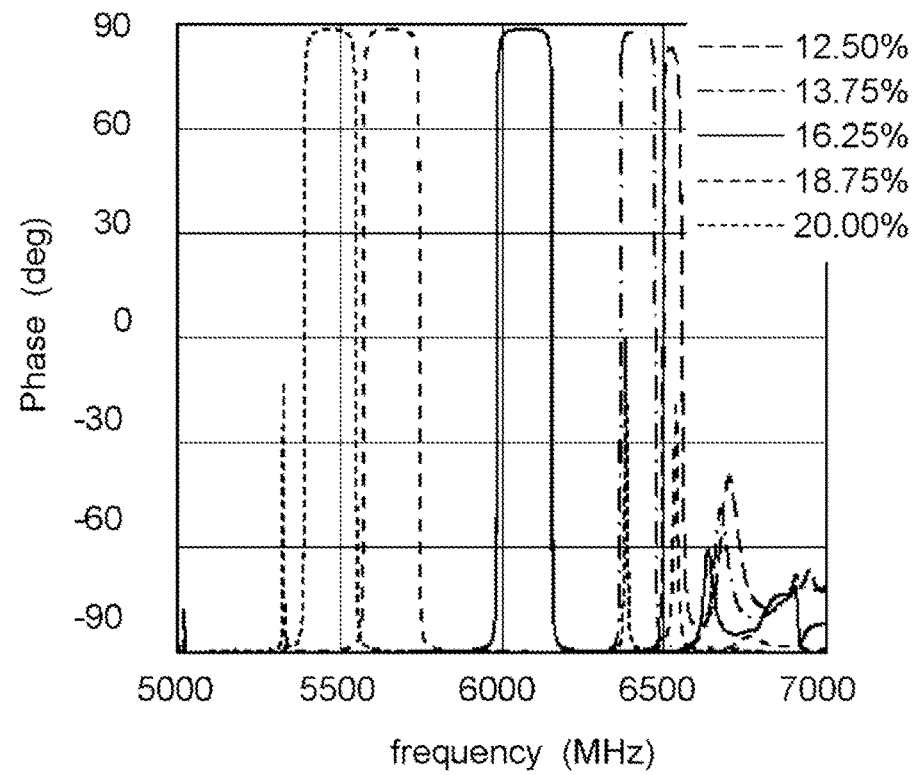

FIG. 27A and FIG. 27B are graphs, similar to FIG. 25A and FIG. 25B, showing the results of computer simulations assuming various values for the thickness $t_{LT}$ of the LT layer 7 in the HfO$_2$ case. In the graphs, 12.50%, 13.75%, 16.25%, 18.75%, and 20.00% indicate that the thickness $t_{LT}$ is 0.125λ, 0.1375λ, 0.1625λ, 0.1875λ, and 0.2λ. Note that, the values of parameters other than the thickness $t_{LT}$ are the standard values (same as the values in Example 6).

As shown in these graphs, when the thickness $t_{LT}$ becomes 0.125λ or less, a loss between the resonance point and the antiresonance point becomes large. Further, when the thickness $t_{LT}$ becomes 0.20λ or more, a spurious emission is generated in the vicinity of the resonance point. Accordingly, 0.1375λ to 0.1875λ may be made the example of range of the values of the thickness $t_{LT}$.

(Thickness of First Layers in HfO$_2$ Case)

Figure 28A:
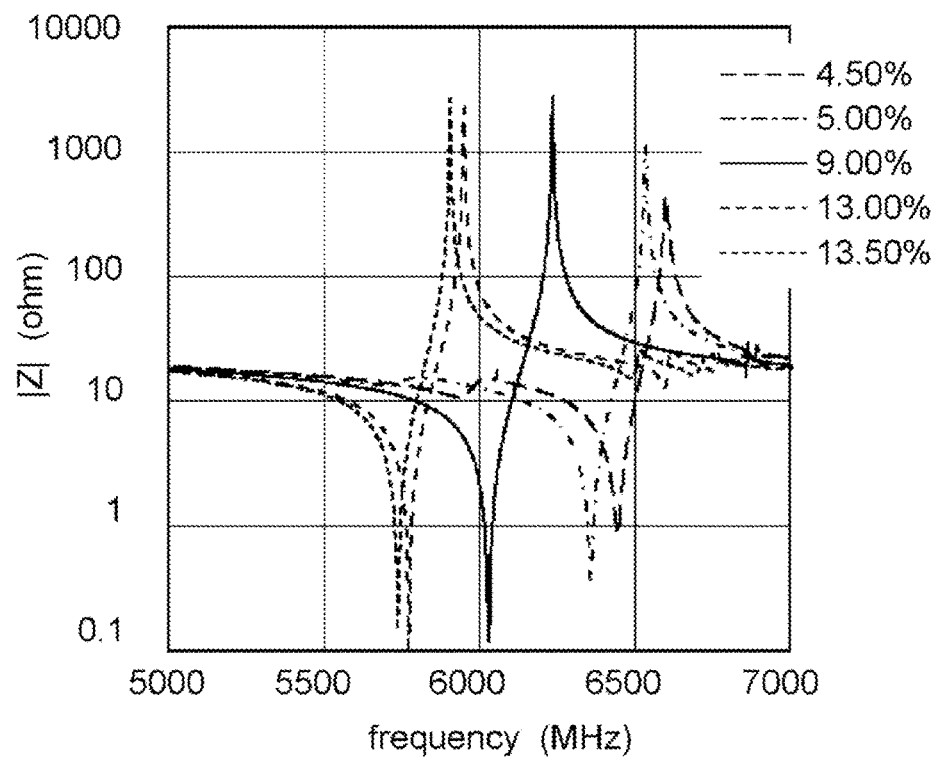
FIG. 28A and FIG. 28B are graphs showing the results of simulation when changing the thicknesses of the first layers in Example 6.
Figure 28B:
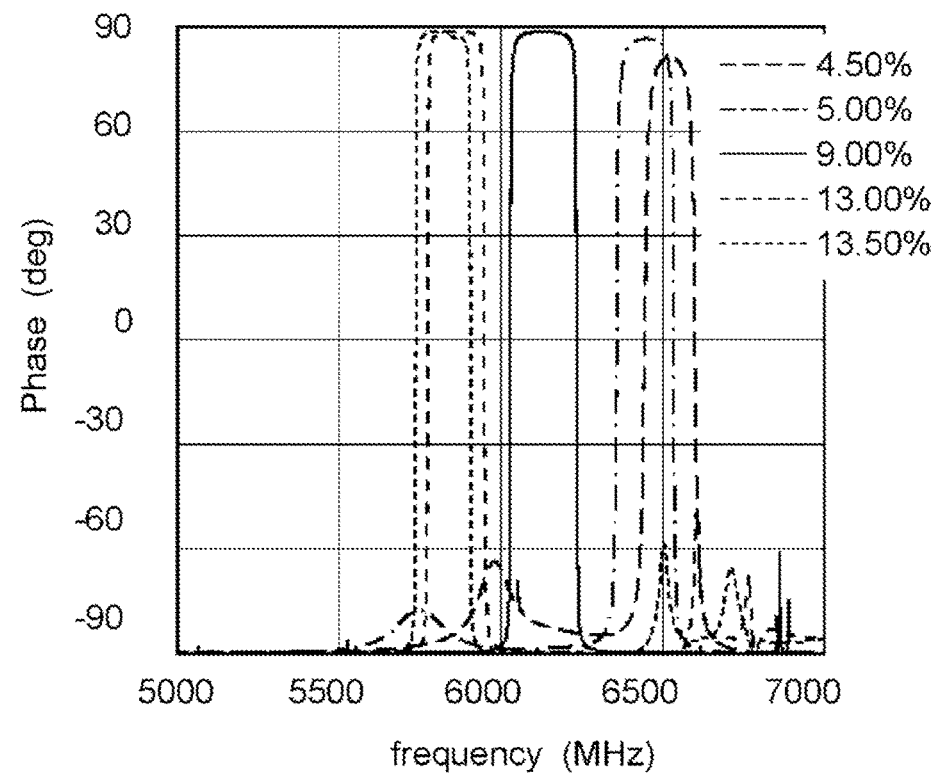

FIG. 28A and FIG. 28B are graphs, similar to FIG. 25A and FIG. 25B, showing the results of computer simulations assuming various values for the thickness $t_1$ of the first layers 11 in the HfO$_2$ case. In the graphs, 4.50%, 5.00%, 9.00%, 13.00%, and 13.50% indicate that the thickness $t_1$ is 0.045λ, 0.05λ, 0.09λ, 0.13λ, and 0.135λ. Note that, the values of parameters other than the thickness $t_1$ are the standard values (same as the values in Example 6).

As shown in these graphs, when the thickness $t_1$ becomes 0.45λ or less, a loss between the resonance point and the antiresonance point becomes large. Further, when the thickness $t_1$ becomes 0.135λ or more, a spurious emission is generated. Accordingly, 0.05λ to 0.13λ may be made the example of the range of the values of the thickness $t_1$.

(Thickness of Second Layers in HfO$_2$ Case)

Figure 29A:
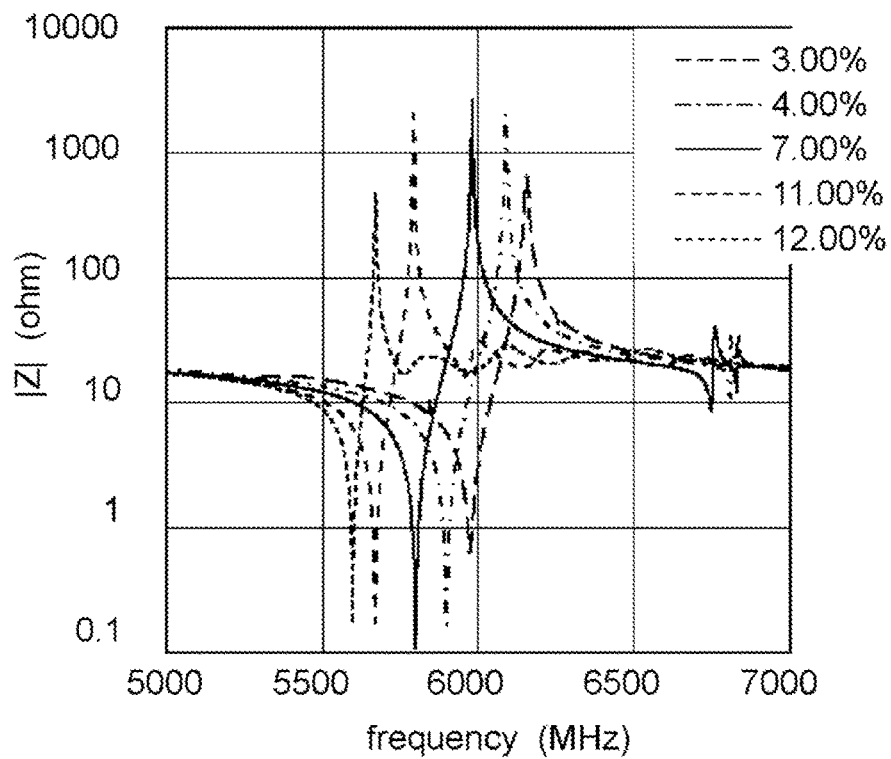
FIG. 29A and FIG. 29B are graphs showing the results of simulation when changing the thicknesses of the second layers in Example 6.
Figure 29B:
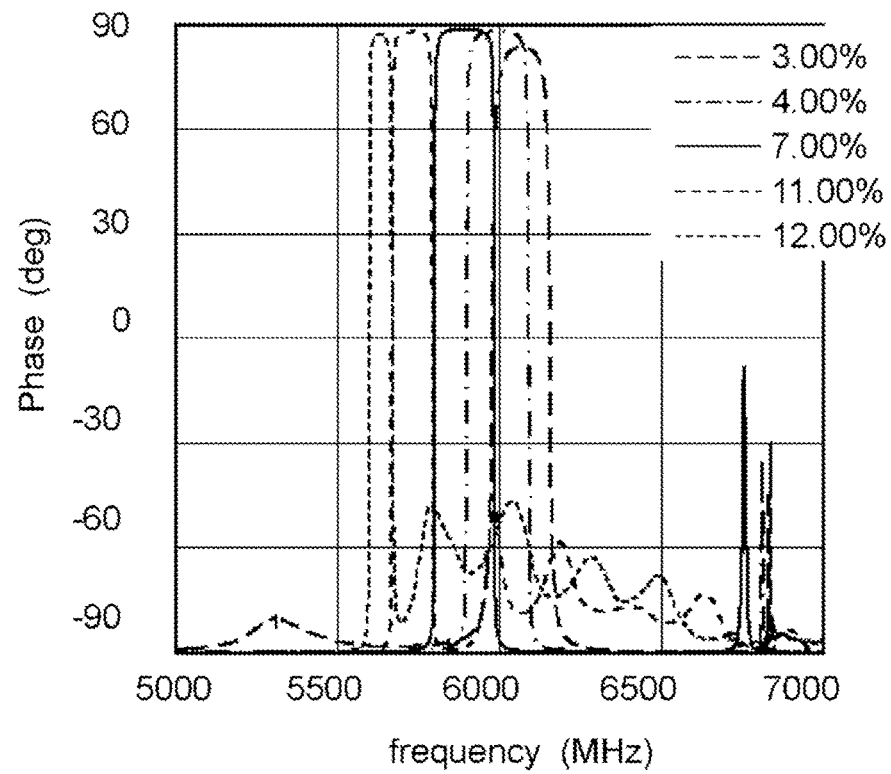

FIG. 29A and FIG. 29B are graphs, similar to FIG. 25A and FIG. 25B, showing the results of computer simulations assuming various values for the thickness $t_2$ of the second layers 13 in the HfO$_2$ case. In the graphs, 3.00%, 4.00%, 7.00%, 11.00%, and 12.00% indicate that the thickness $t_2$ is 0.03λ, 0.04λ, 0.07λ, 0.11, and 0.12λ. Note that, the values of parameters other than the thickness $t_2$ are the standard values (same as the values in Example 6).

As shown in these graphs, when the thickness $t_2$ becomes 0.03λ or less, a loss between the resonance point and the antiresonance point becomes large. Further, when the thickness $t_2$ becomes 0.12λ or more, the loss between the resonance point and the antiresonance point becomes large. Accordingly, 0.04λ to 0.11λ may be made the example of range of the values of the thickness $t_2$.

(Euler Angles of LT Layer in HfO$_2$ Case)

Figure 30A:
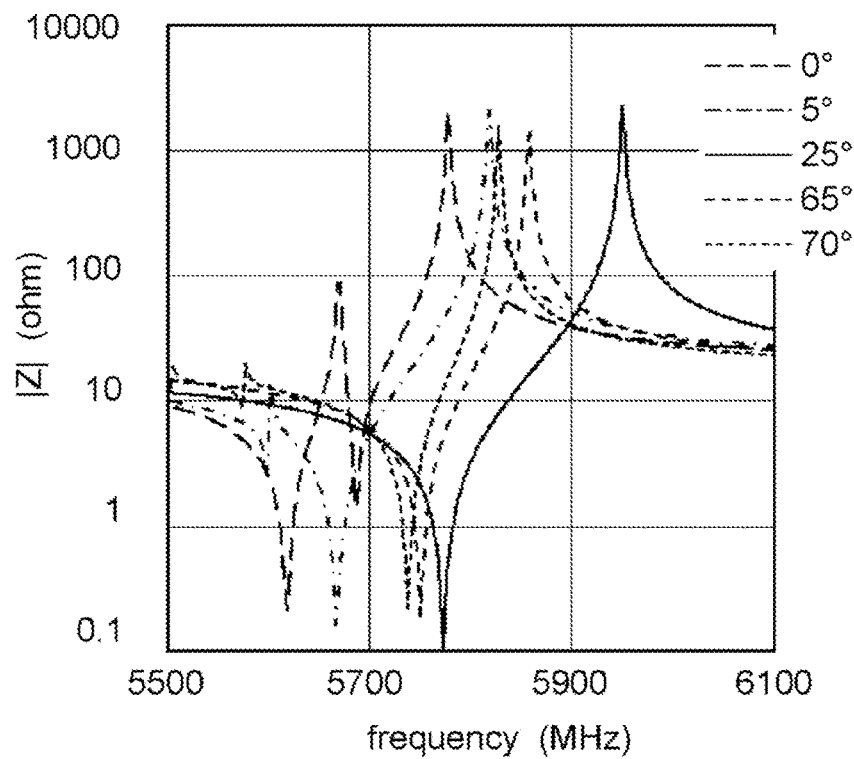
FIG. 30A and FIG. 30B are graphs showing the results of simulation when changing the Euler angles of the LT layer in Example 6.
Figure 30B:
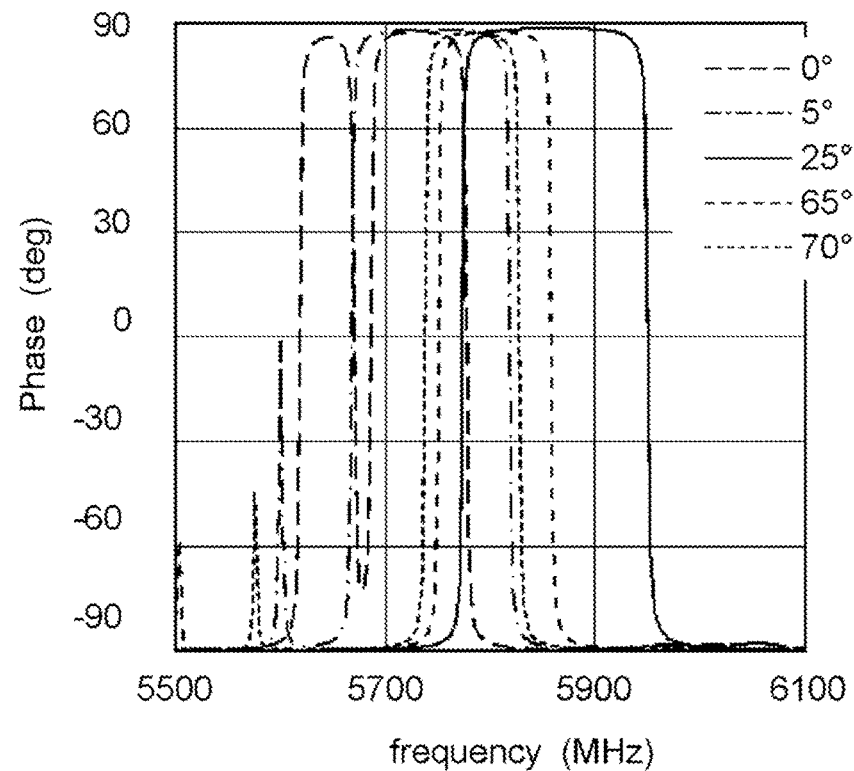

FIG. 30A and FIG. 30B are graphs, similar to FIG. 25A and FIG. 25B, showing the results of computer simulations assuming various values for θ in the Euler angles ((φ, θ, ψ) of the LT layer 7 in the HfO$_2$ case. In the graphs, the angles 0°, 5°, 25°, 65°, and 7° correspond to θ. Note that, the values of parameters other than θ are the standard values (same as the values in Example 6).

As shown in these graphs, when θ becomes 0° or less, a spurious emission is generated between the resonance point and the antiresonance point. Further, when θ becomes 70° or more, although not particularly shown, in the same way as Case 3, Δf becomes smaller. Accordingly, 5° to 65° may be made the example of range of the values of θ.

[ZrO$_2$]

The example of range of the values of parameters when the material of the second layer 13 is ZrO$_2$ is as follows.

(Values of Parameters Which Become Standard)

As a result of computer simulations, Example 7 showing relatively good frequency characteristics was obtained. The values of various parameters in Example 7 are as follows: $t_{Al}$=0.06λ, $t_{LT}$=0.15λ, $t_1$=0.12λ, $t_2$=0.09λ, E=(0°, 25°, 0°) (115°-rotated, Y-cut, X-propagation)

Figure 31A:
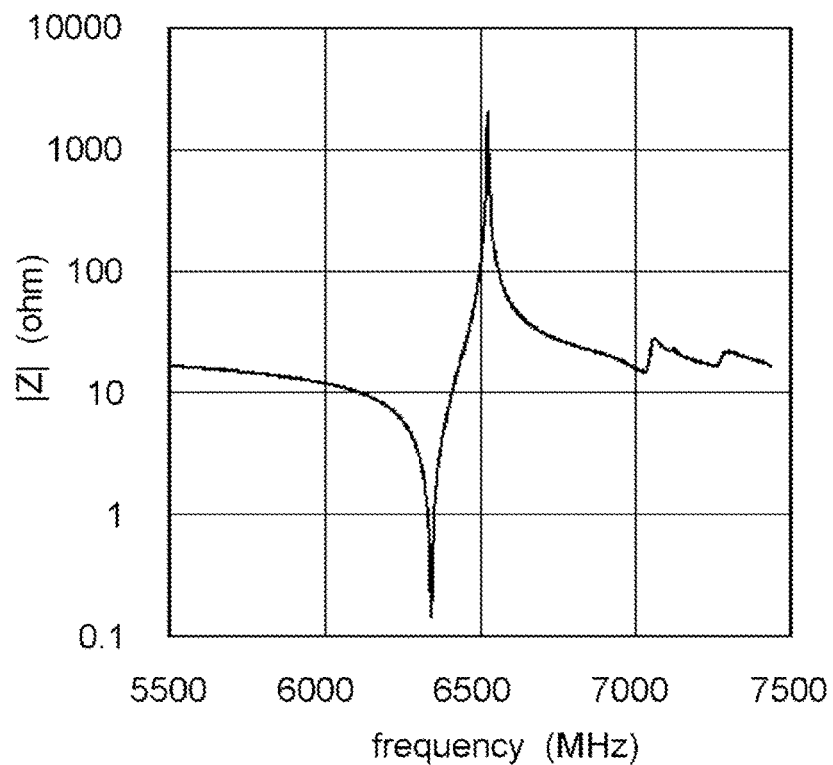
FIG. 31A and FIG. 31B are graphs showing the results of simulation according to Example 7.
Figure 31B:
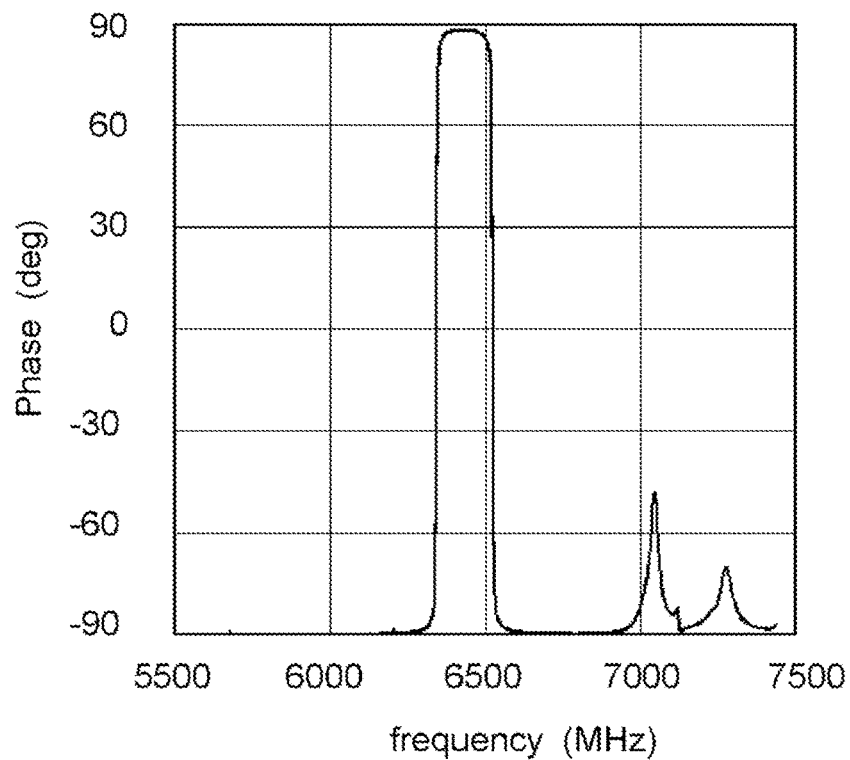

FIG. 31A and FIG. 31B are graphs showing the characteristics in Example 7. FIG. 31λ is a graph showing the change of the absolute value of impedance relative to the frequency in the same way as FIG. 4A. FIG. 31B is a graph showing the change of the phase of impedance relative to the frequency in the same way as FIG. 4B.

Below, a case (sometimes referred to as the ZrO$_2$ case) where various values were assumed by using the values of parameters in Example 7 as centers (standards) will be explained.

(Thickness of Conductive Layer in ZrO$_2$ Case)

Figure 32A:
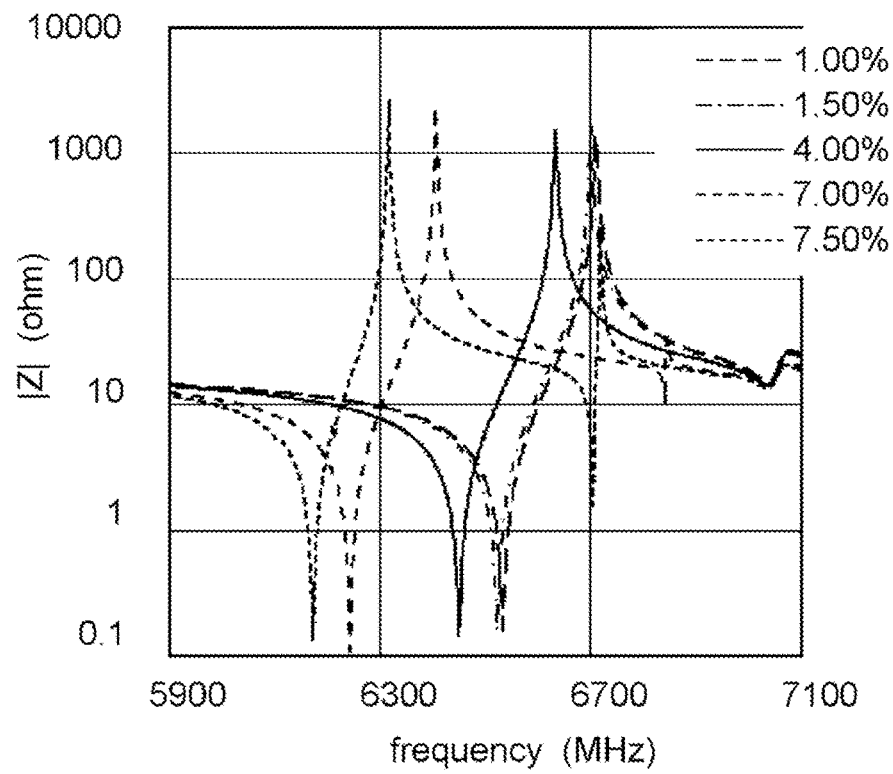
FIG. 32A and FIG. 32B are graphs showing the results of simulation when changing the thickness of the conductive layer in Example 7.
Figure 32B:
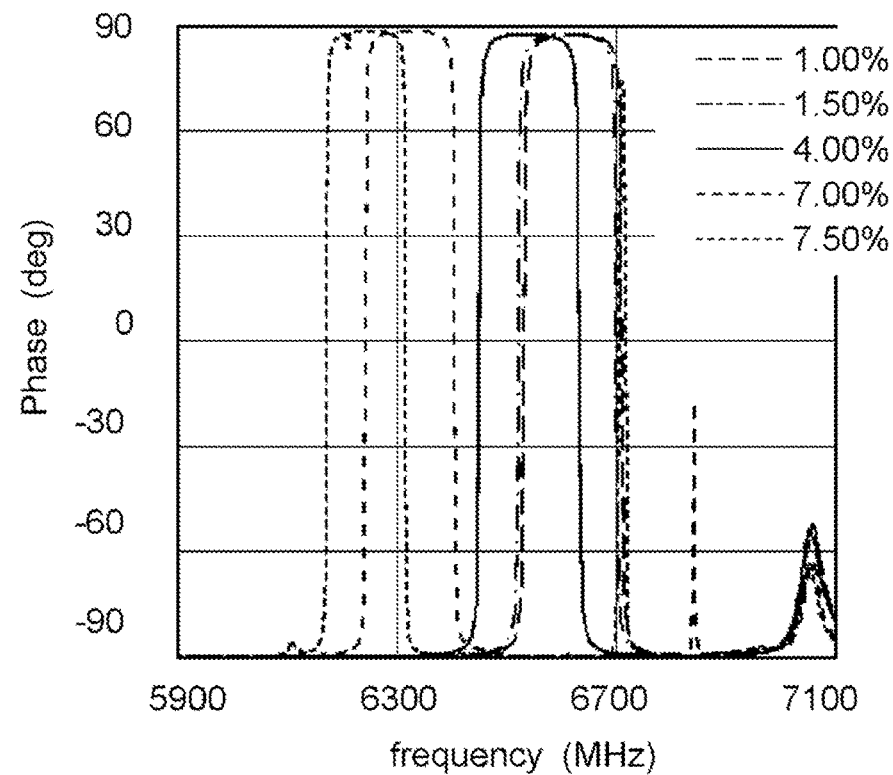

FIG. 32A and FIG. 32B are graphs, similar to FIG. 31A and FIG. 31B, showing the results of computer simulations assuming various values for the thickness $t_{Al}$ of the conductive layer 9 in the ZrO$_2$ case. In the graphs, 1.00%, 1.50%, 4.00%, 7.00%, and 7.50% indicate that the thickness $t_{Al}$ is 0.01λ, 0.015λ, 0.04λ, 0.07λ, and 0.075λ. Note that, the values of parameters other than the thickness $t_{Al}$ are the standard values (same as the values in Example 7).

As shown in these graphs, even if the thickness $t_{Al}$ was made smaller than the standard value (0.06λ), no large difference was seen concerning generation of a spurious emission and the magnitude of loss. However, when the conductive layer 9 is made too thin, the electrical resistance becomes large. Therefore, from this viewpoint, 0.02λ may be made the lower limit of the example of range of the values of the thickness $t_{Al}$. Further, when the thickness $t_{Al}$ becomes 0.075λ or more, a spurious emission is generated between the resonance point and the antiresonance point (in particular, see FIG. 32B). Accordingly, 0.07λ may be made the upper limit of the example of range of values of the thickness $t_{Al}$.

(Thickness of LT Layer in ZrO$_2$ Case)

Figure 33A:
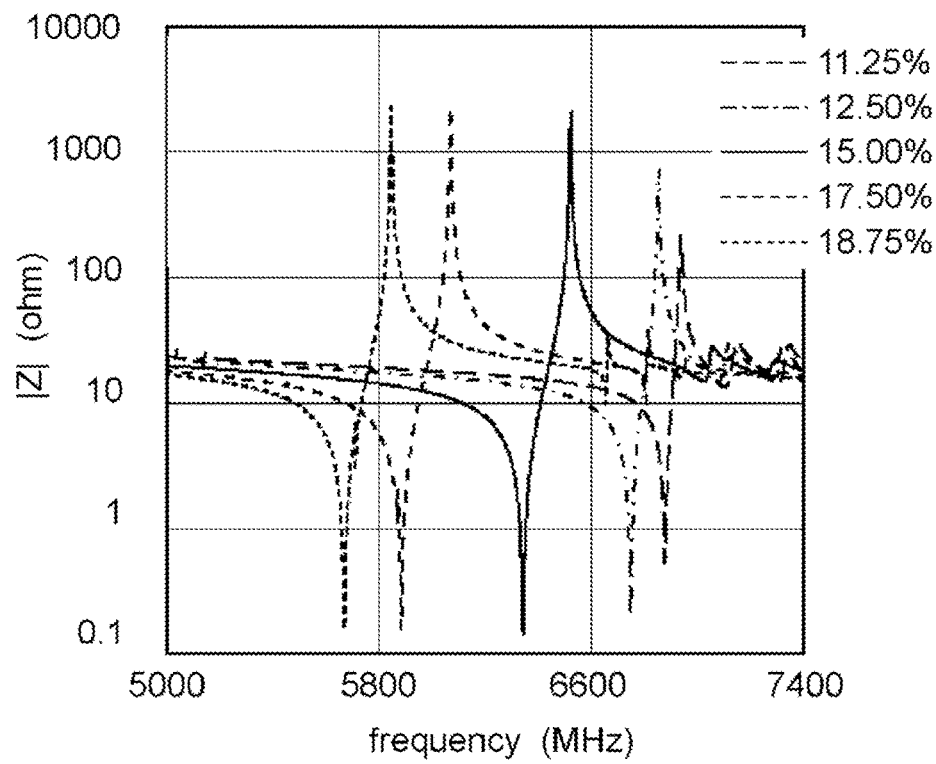
FIG. 33A and FIG. 33B are graphs showing the results of simulation when changing the thickness of the LT layer in Example 7.
Figure 33B:
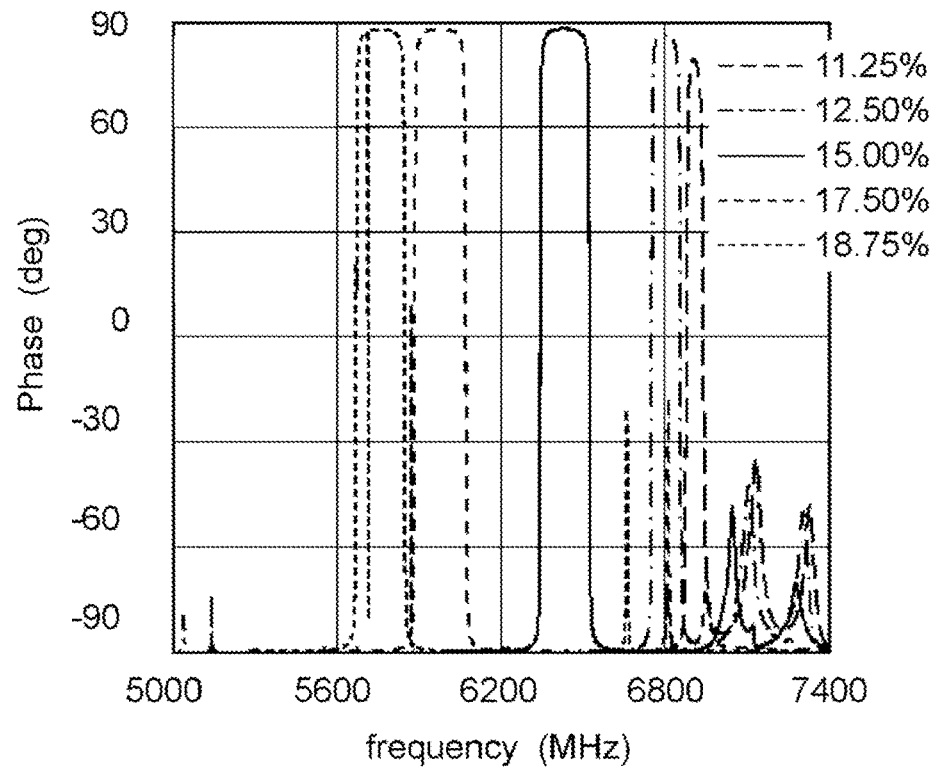

FIG. 33A and FIG. 33B are graphs, similar to FIG. 31A and FIG. 31B, showing the results of computer simulations assuming various values for the thickness $t_{LT}$ of the LT layer 7 in the ZrO$_2$ case. In the graphs, 11.25%, 12.50%, 15.00%, 17.50%, and 18.75% indicate that the thickness $t_{LT}$ is 0.1125λ, 0.125λ, 0.15λ, 0.175λ, and 0.1875λ. Note that, the values of parameters other than the thickness $t_{LT}$ are the standard values (same as the values in Example 7).

As shown in these graphs, when the thickness $t_{LT}$ becomes 0.1125λ or less, a loss between the resonance point and the antiresonance point becomes large. Further, when the thickness $t_{LT}$ becomes 0.1875λ or more, a spurious emission is generated between the resonance point and the antiresonance point. Accordingly, 0.125λ to 0.175λ may be made the example of range of the values of the thickness $t_{LT}$.

(Thickness of First Layers in ZrO$_2$ Case)

Figure 34A:
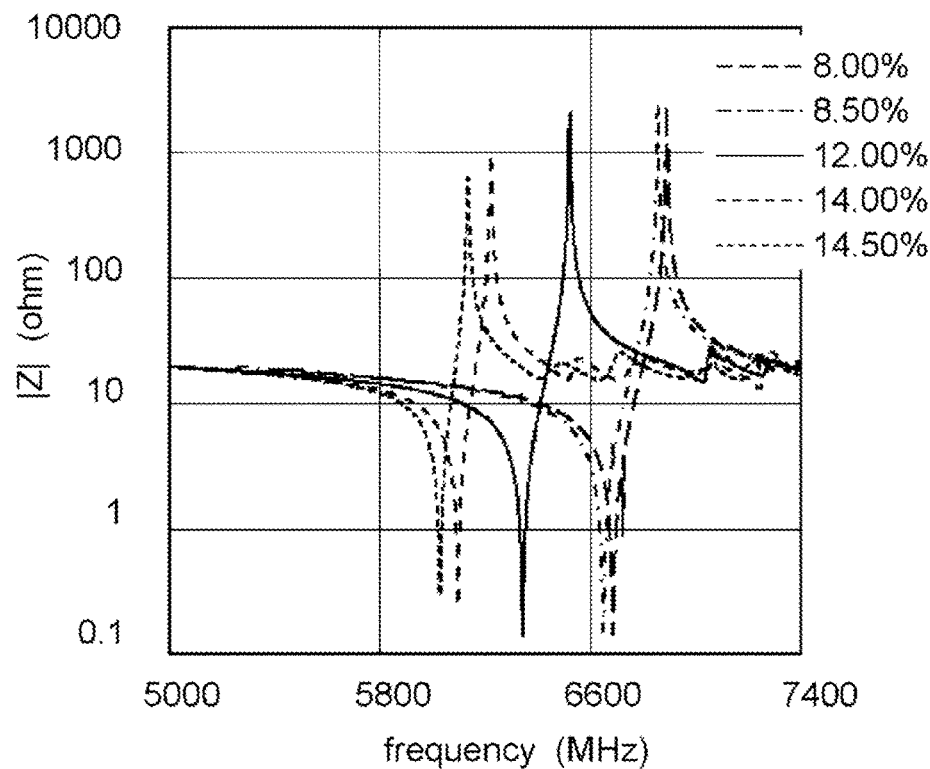
FIG. 34A and FIG. 34B are graphs showing the results of simulation when changing the thicknesses of the first layers in Example 7.
Figure 34B:
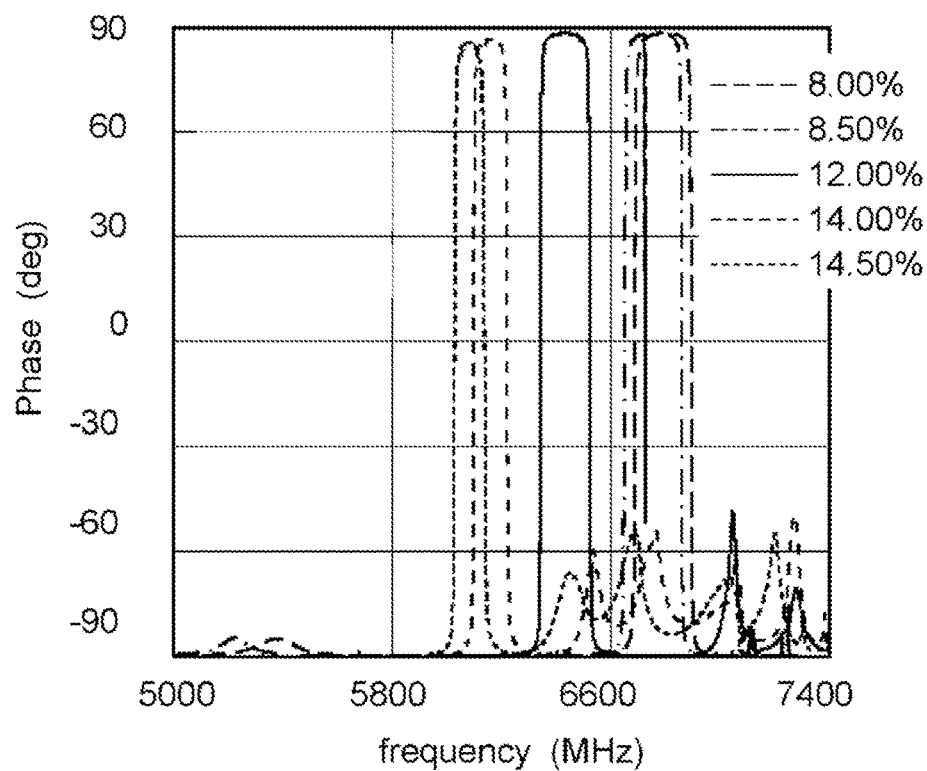

FIG. 34A and FIG. 34B are graphs, similar to FIG. 31A and FIG. 31B, showing the results of computer simulations assuming various values for the thickness $t_1$ of the first layers 11 in the ZrO$_2$ case. In the graphs, 8.00%, 8.50%, 12.00%, 14.00%, and 14.50% indicate that the thickness $t_1$ is 0.08λ, 0.085λ, 0.12λ, 0.14λ, and 0.145λ. Note that, the values of parameters other than the thickness $t_1$ are the standard values (same as the values in Example 7).

As shown in these graphs, when the thickness $t_1$ becomes 0.08λ or less, a spurious emission is generated between the resonance point and the antiresonance point. Further, when the thickness $t_1$ becomes 0.145λ or more, the loss between the resonance point and the antiresonance point becomes large. Accordingly, 0.085λ to 0.14λ may be made the example of range of the values of the thickness $t_1$.

(Thickness of Second Layers in ZrO$_2$ Case)

Figure 35A:
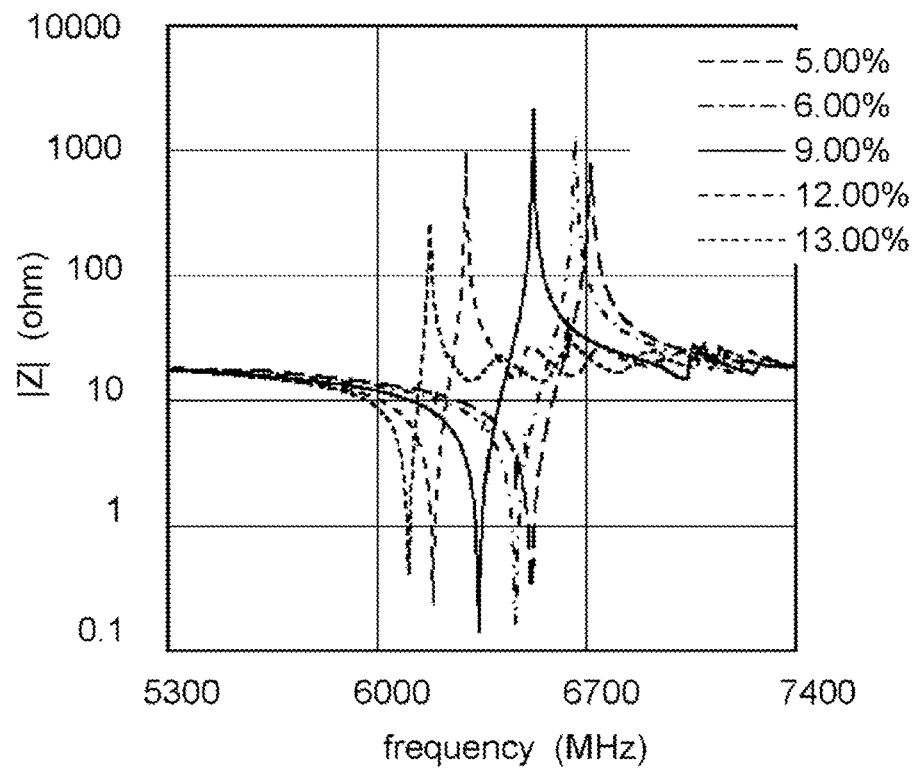
FIG. 35A and FIG. 35B are graphs showing the results of simulation when changing the thicknesses of the second layers in Example 7.
Figure 35B:
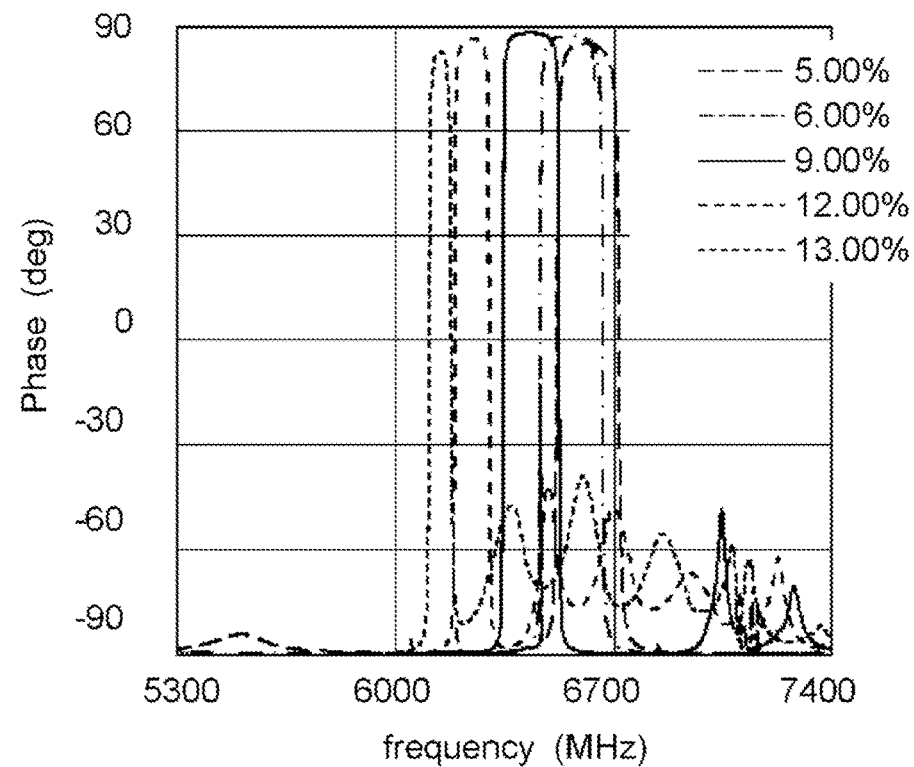

FIG. 35A and FIG. 35B are graphs, similar to FIG. 31A and FIG. 31B, showing the results of computer simulations assuming various values for the thickness $t_2$ of the second layers 13 in the ZrO$_2$ case. In the graphs, 5.00%, 6.00%, 9.00%, 12.00%, and 13.00% indicate that the thickness $t_2$ is 0.05λ, 0.06λ, 0.09λ, 0.12λ, and 0.13λ. Note that, the values of parameters other than the thickness $t_2$ are the standard values (same as the values in Example 7).

As shown in these graphs, when the thickness $t_2$ becomes 0.05λ or less, a spurious emission is generated between the resonance point and the antiresonance point (in particular, see FIG. 35B). Further, when the thickness $t_2$ becomes 0.13λ or more, the loss between the resonance point and the antiresonance point becomes large. Accordingly, 0.06λ to 0.12λ may be made the example of range of the values of the thickness $t_2$.

(Euler Angles of LT Layer in ZrO$_2$ Case)

Figure 36A:
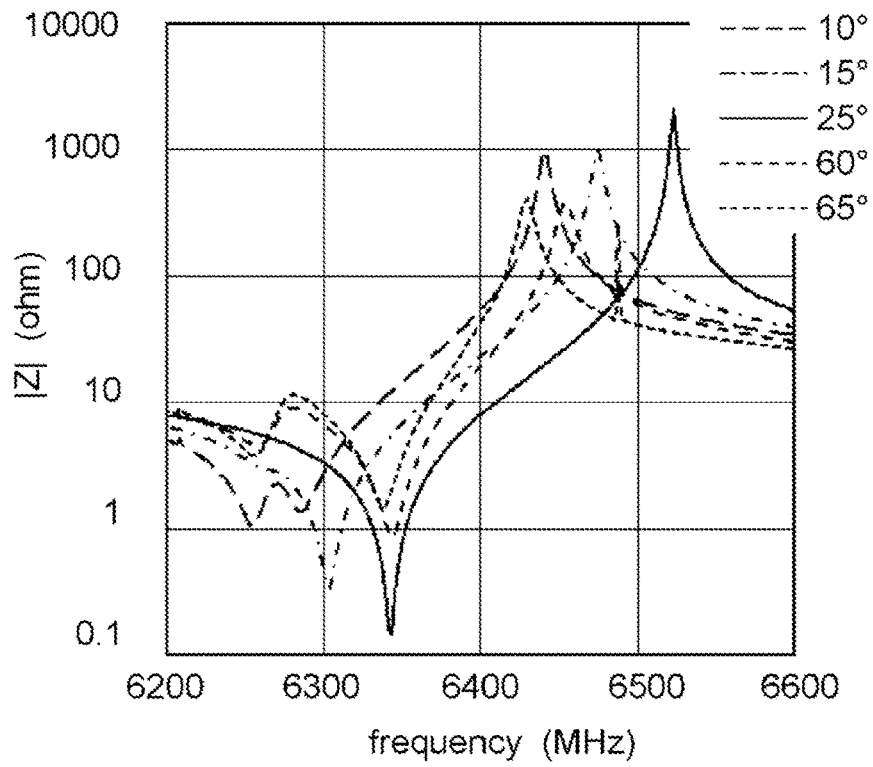
FIG. 36A and FIG. 36B are graphs showing the results of simulation when changing the Euler angles of the LT layer in Example 7.
Figure 36B:
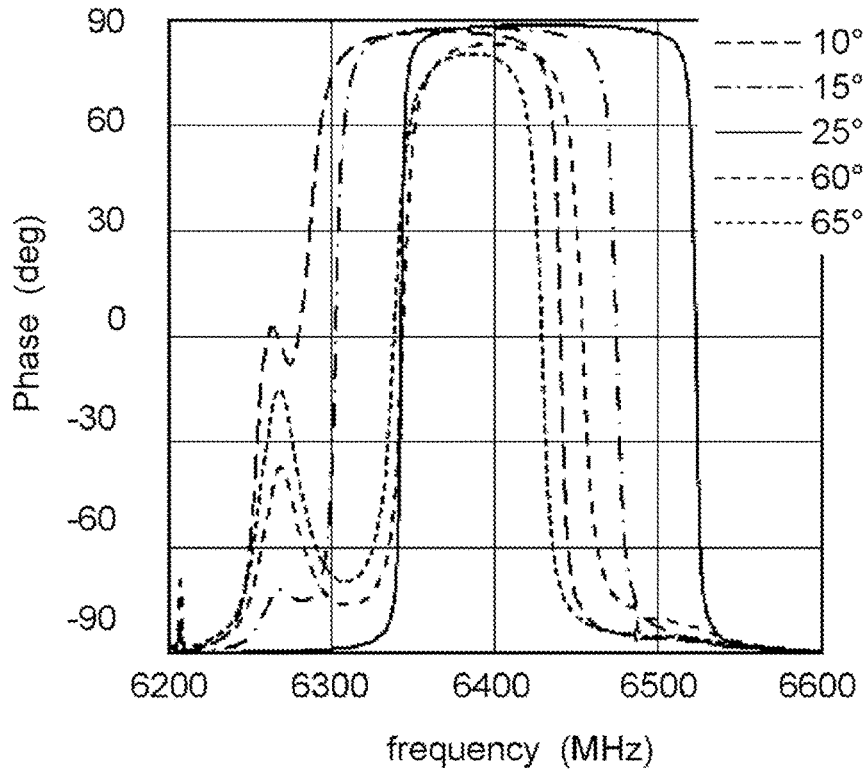

FIG. 36A and FIG. 36B are graphs, similar to FIG. 31A and FIG. 31B, showing the results of computer simulations assuming various values for θ in the Euler angles (φ, θ, ψ) of the LT layer 7 in the ZrO$_2$ case. In the graphs, the angles 10°, 15°, 25°, 60°, and 65° correspond to θ. Note that, the values of parameters other than θ are the standard values (same as the values in Example 7).

As shown in these graphs, when θ becomes 10° or less, a relatively large spurious emission is generated in the vicinity of the resonance point. Further, when θ becomes 650 or more, a relatively large spurious emission is generated in the vicinity of the resonance point. Accordingly, 15° to 60° may be made the example of range of the values of 9.

[TiO$_2$]

The example of range of the values of parameters when the material of the second layer 13 is TiO$_2$ is as follows.

(Values of Parameters which Become Standard)

As a result of computer simulations, Example 8 showing relatively good frequency characteristics was obtained. The values of various parameters in Example 8 are as follows: $t_{Al}$=0.06λ, $t_{LT}$=0.175λ, $t_1$=0.1λ, $t_2$=0.18λ, E=(0°, 25°, 0°) (115°-rotated, Y-cut, X-propagation)

Figure 37A:
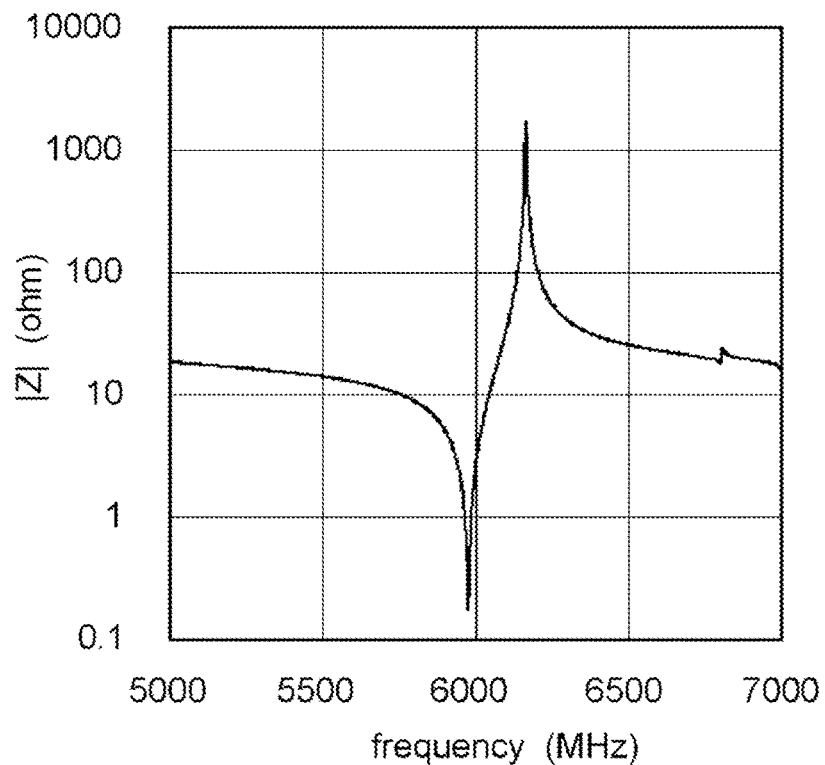
FIG. 37A and FIG. 37B are graphs showing the results of simulation according to Example 8.
Figure 37B:
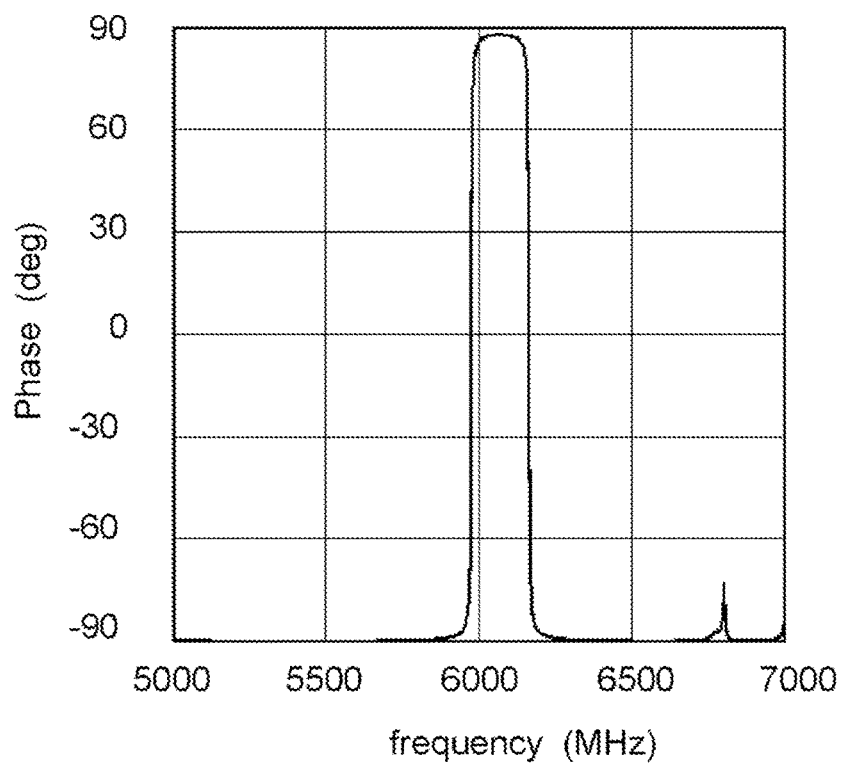

FIG. 37A and FIG. 37B are graphs showing the characteristics in Example 8. FIG. 37λ is a graph showing the change of the absolute value of impedance relative to the frequency in the same way as FIG. 4A. FIG. 37B is a graph showing the change of the phase of impedance relative to the frequency in the same way as FIG. 4B.

Below, a case (sometimes referred to as the TiO$_2$ case) where various values were assumed by using the values of parameters in Example 8 as centers (standards) will be explained.

(Thickness of Conductive Layer in TiO$_2$ Case)

Figure 38A:
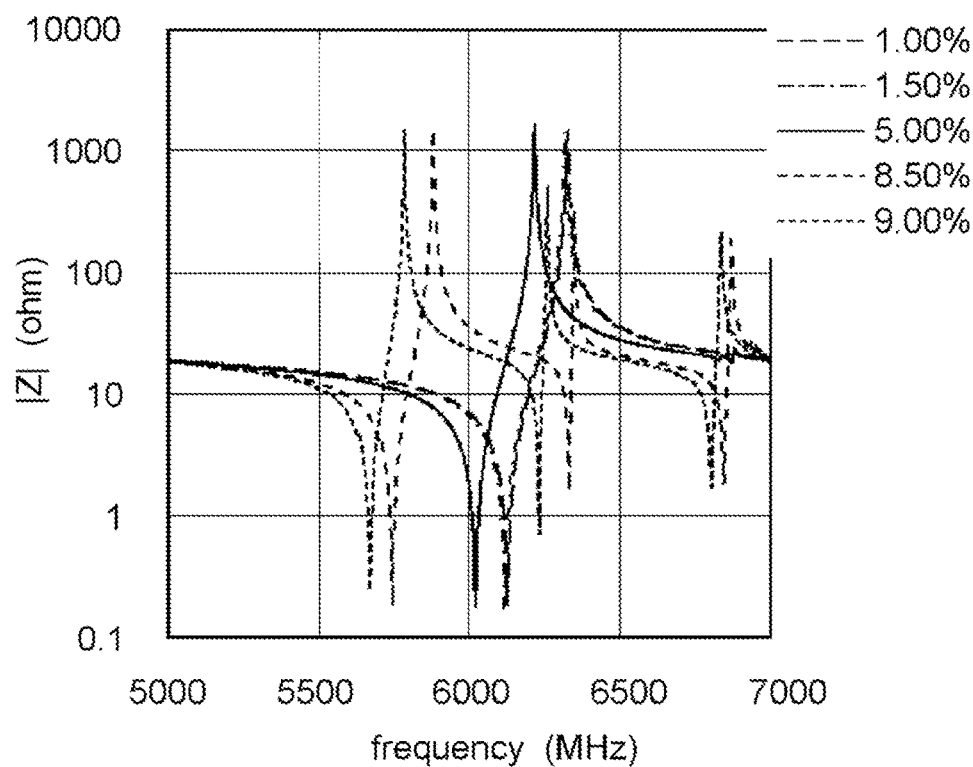
FIG. 38A and FIG. 38B are graphs showing the results of simulation when changing the thickness of the conductive layer in Example 8.
Figure 38B:
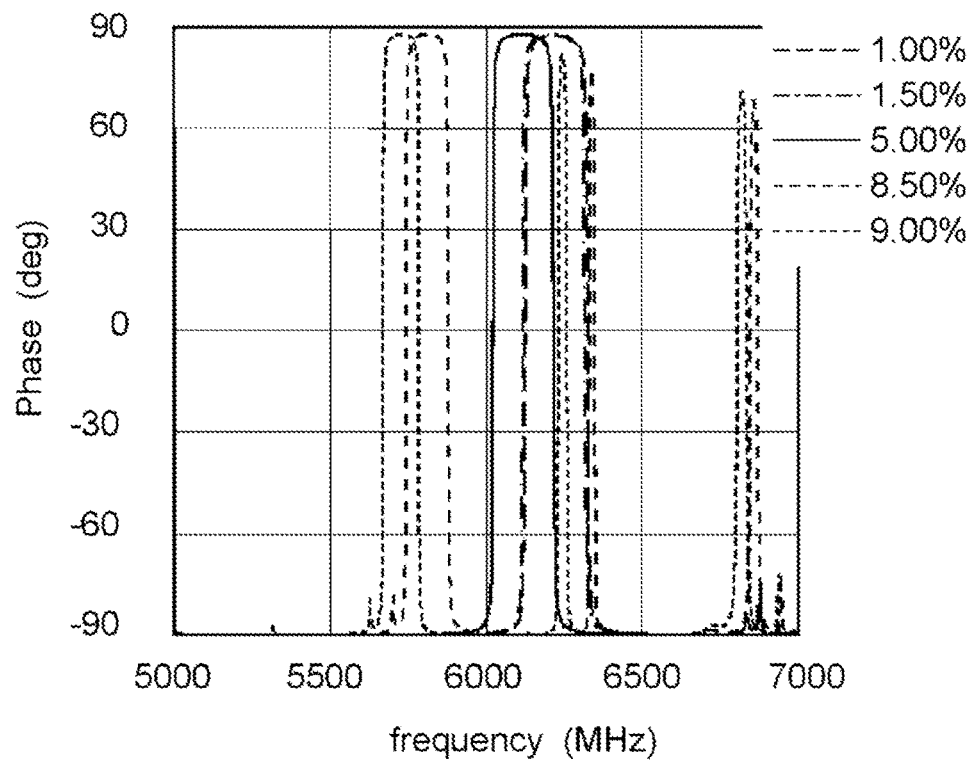

FIG. 38A and FIG. 38B are graphs, similar to FIG. 37A and FIG. 37B, showing the results of computer simulations assuming various values for the thickness $t_{Al}$ of the conductive layer 9 in the TiO$_2$ case. In the graphs, 1.00%, 1.50%, 5.00%, 8.50%, and 9.00% indicate that the thickness $t_{Al}$ is 0.01λ, 0.015λ, 0.05λ, 0.085λ, and 0.09λ. Note that, the values of parameters other than the thickness $t_{Al}$ are the standard values (same as the values in Example 8).

As shown in these graphs, even if the thickness $t_{Al}$ was made smaller than the standard value (0.06λ), no large difference was seen concerning generation of a spurious emission and the magnitude of loss. However, when the conductive layer 9 is made too thin, the electrical resistance becomes large. Therefore, from this viewpoint, 0.02λ may be made the lower limit of the example of range of the values of the thickness $t_A$. Further, when the thickness $t_{Al}$ becomes 0.09λ or more, although not particularly shown, Δf becomes smaller. Accordingly, 0.085λ may be made the upper limit of the example of range of values of the thickness $t_{Al}$.

(Thickness of LT Layer in TiO$_2$ Case)

Figure 39A:
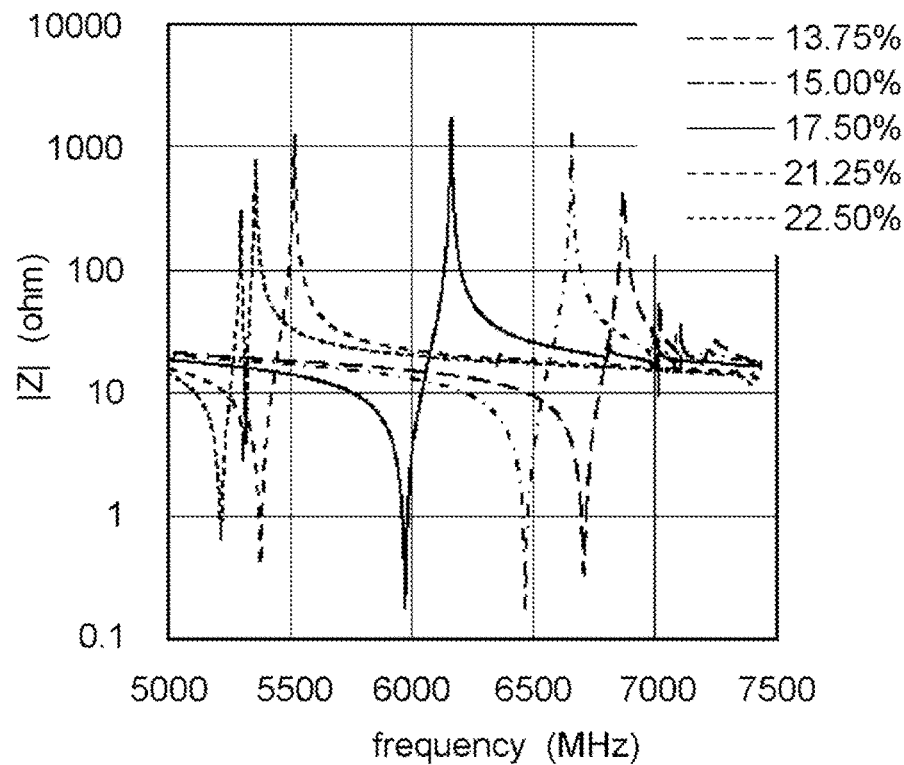
FIG. 39A and FIG. 39B are graphs showing the results of simulation when changing the thickness of the LT layer in Example 8.
Figure 39B:
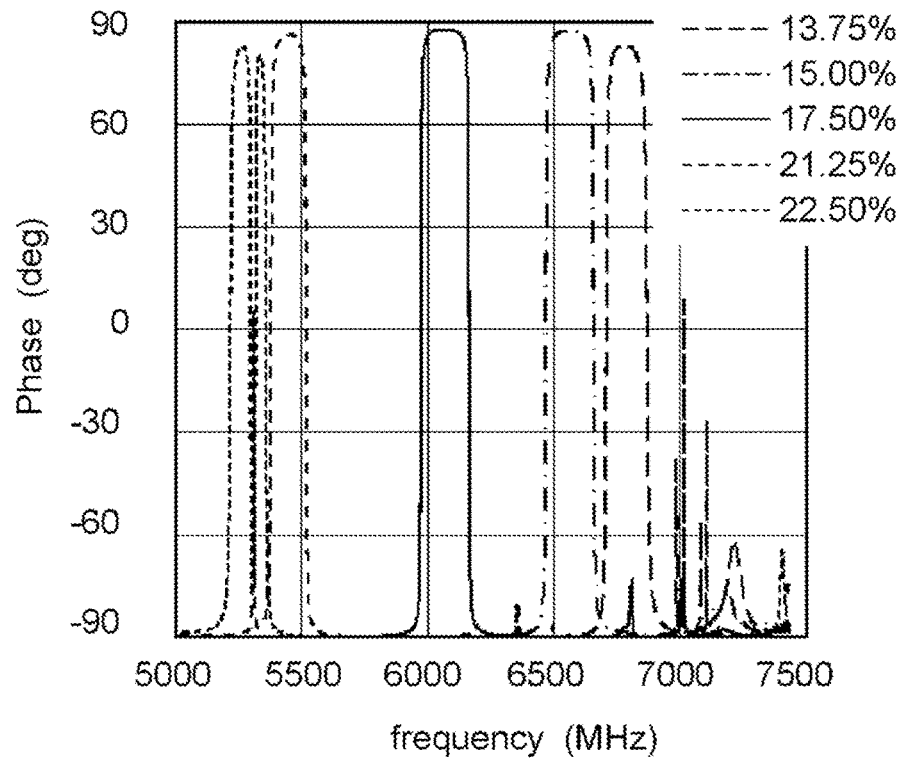

FIG. 39A and FIG. 39B are graphs, similar to FIG. 37A and FIG. 37B, showing the results of computer simulations assuming various values for the thickness $t_{LT}$ of the LT layer 7 in the TiO$_2$ case. In the graphs, 13.75%, 15.00%, 17.50%, 21.25%, and 22.50% indicate that the thickness $t_{LT}$ is 0.1375λ, 0.15λ, 0.175λ, 0.2125λ, and 0.225λ. Note that, the values of parameters other than the thickness $t_{LT}$ are the standard values (same as the values in Example 8).

As shown in these graphs, when the thickness $t_{LT}$ becomes 0.1375λ or less, the loss between the resonance point and the antiresonance point becomes large. Further, when the thickness $t_{LT}$ becomes 0.225λ or more, a spurious emission is generated between the resonance point and the antiresonance point. Accordingly, 0.15λ to 0.2125λ may be made the example of range of the values of the thickness $t_{LT}$.

(Thickness of First Layers in TiO$_2$ Case)

Figure 40A:
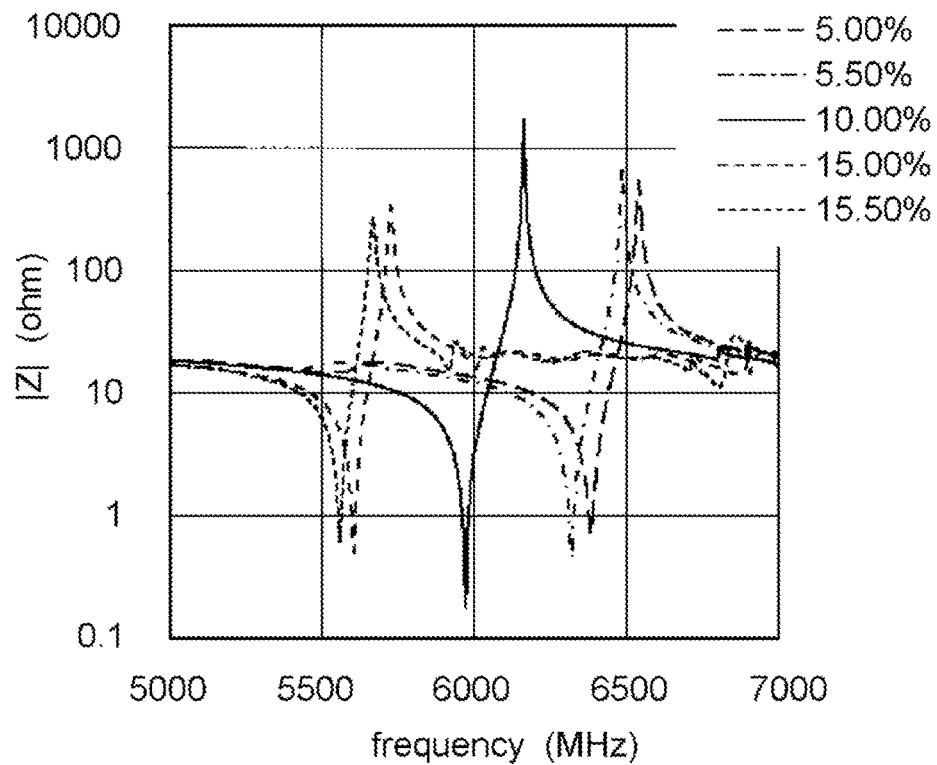
FIG. 40A and FIG. 40B are graphs showing the results of simulation when changing the thicknesses of the first layers in Example 8.
Figure 40B:
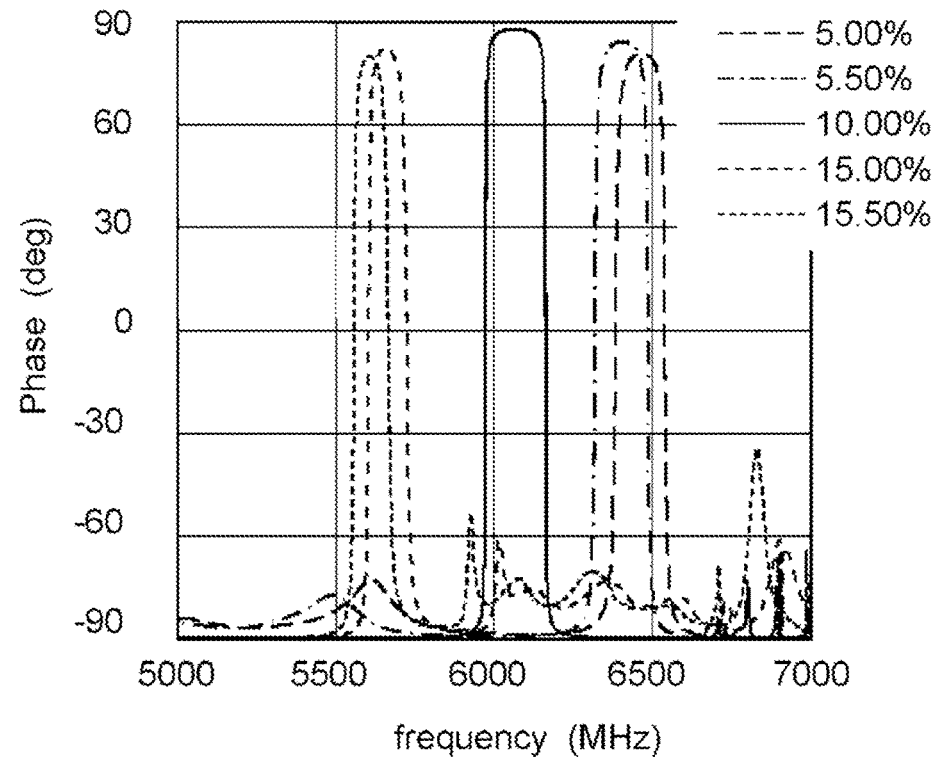

FIG. 40A and FIG. 40B are graphs, similar to FIG. 37A and FIG. 37B, showing the results of computer simulations assuming various values for the thickness $t_1$ of the first layers 11 in the TiO$_2$ case. In the graphs, 5.00%, 5.50%, 10.00%, 15.00%, and 15.50% indicate that the thickness $t_1$ is 0.05λ, 0.055λ, 0.1λ, 0.15λ, and 0.155λ. Note that, the values of parameters other than the thickness $t_1$ are the standard values (same as the values in Example 8).

As shown in these graphs, when the thickness $t_1$ becomes 0.05λ or less, the loss becomes large between the resonance point and the antiresonance point. Further, when the thickness $t_1$ becomes 0.155λ or more, the loss becomes large between the resonance point and the antiresonance point. Accordingly, 0.055λ to 0.15λ may be made the example of range of the values of the thickness $t_1$.

(Thickness of Second Layers in TiO$_2$ Case)

Figure 41A:
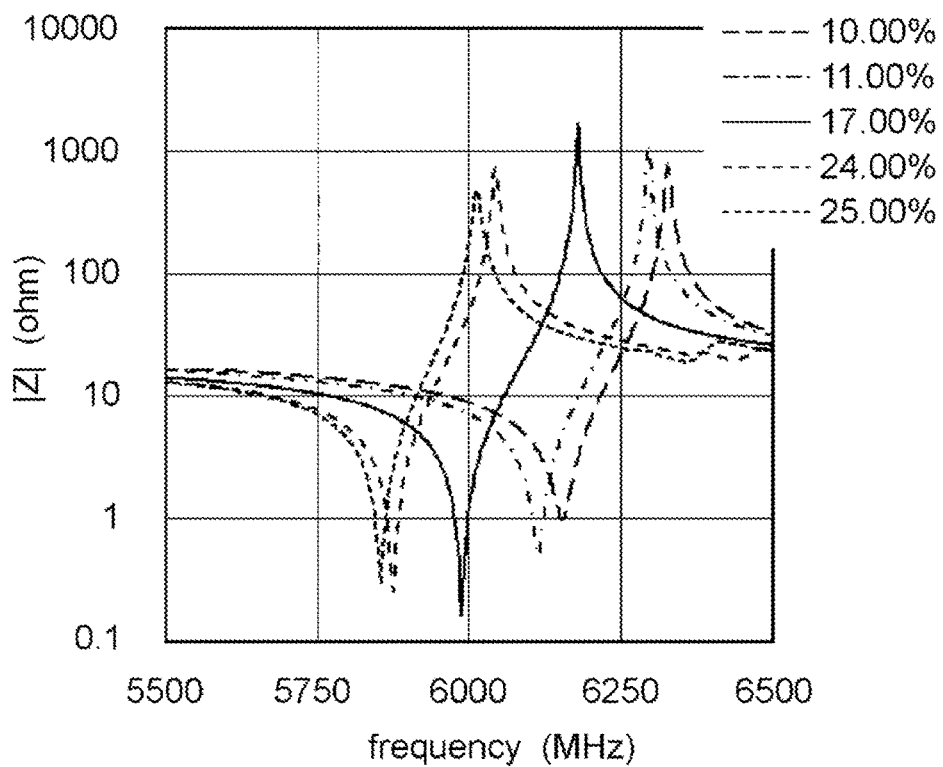
FIG. 41A and FIG. 41B are graphs showing the results of simulation when changing the thicknesses of the second layers in Example 8.
Figure 41B:
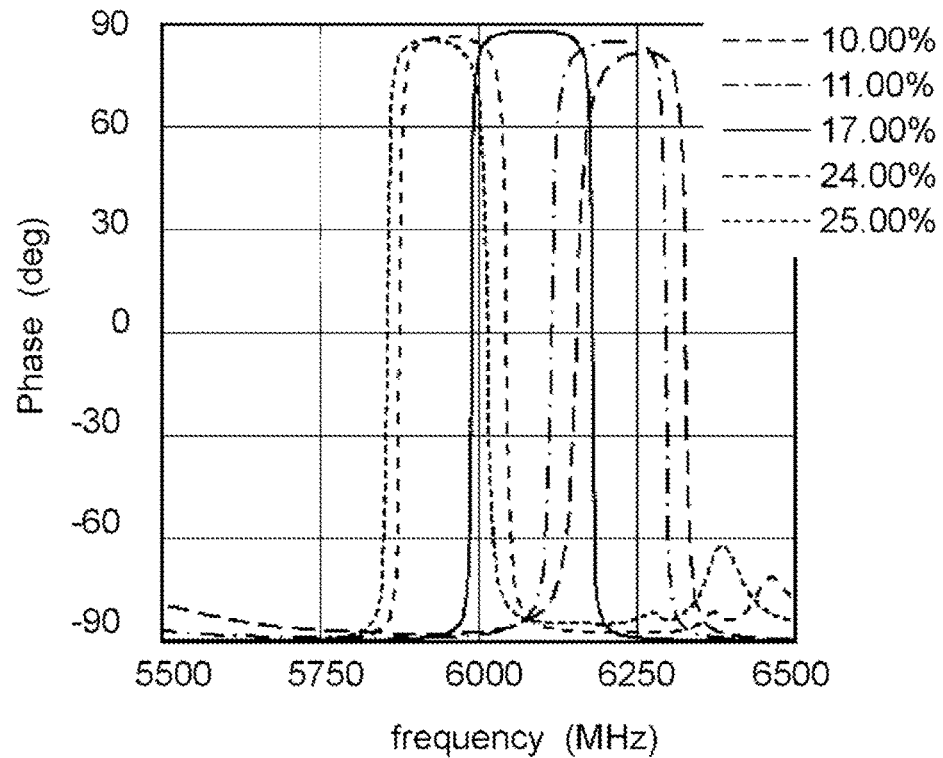

FIG. 41A and FIG. 41B are graphs, similar to FIG. 37A and FIG. 37B, showing the results of computer simulations assuming various values for the thickness $t_2$ of the second layers 13 in the TiO$_2$ case. In the graphs, 10.00%, 11.00%, 17.00%, 24.00%, and 25.00% indicate that the thickness $t_2$ is 0.1λ, 0.11λ, 0.17λ, 0.24λ, and 0.25λ. Note that, the values of parameters other than the thickness $t_2$ are the standard values (same as the values in Example 8).

As shown in these graphs, when the thickness $t_2$ becomes 0.10λ or less, the loss becomes large between the resonance point and the antiresonance point. Further, when the thickness $t_2$ becomes 0.25λ or more, the characteristics of the phase are degraded on the high frequency side of the antiresonance point. Accordingly, 0.11λ to 0.24λ may be made the example of range of the values of the thickness $t_2$.

(Euler Angles of LT Layer in TiO$_2$ Case)

Figure 42A:
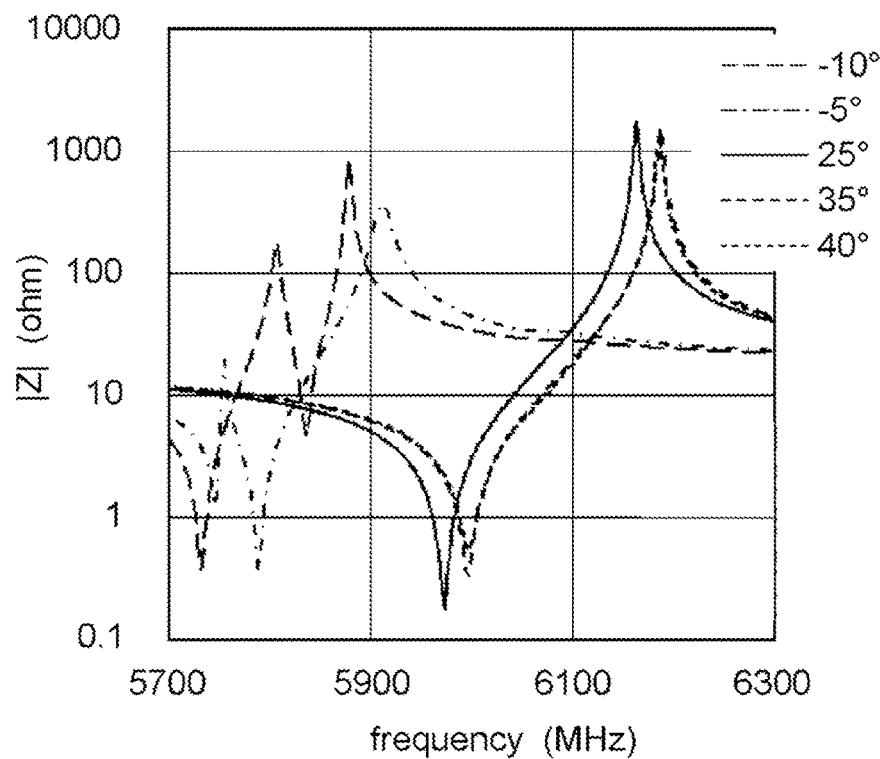
FIG. 42A and FIG. 42B are graphs showing the results of simulation when changing the Euler angles of the LT layer in Example 8.
Figure 42B:
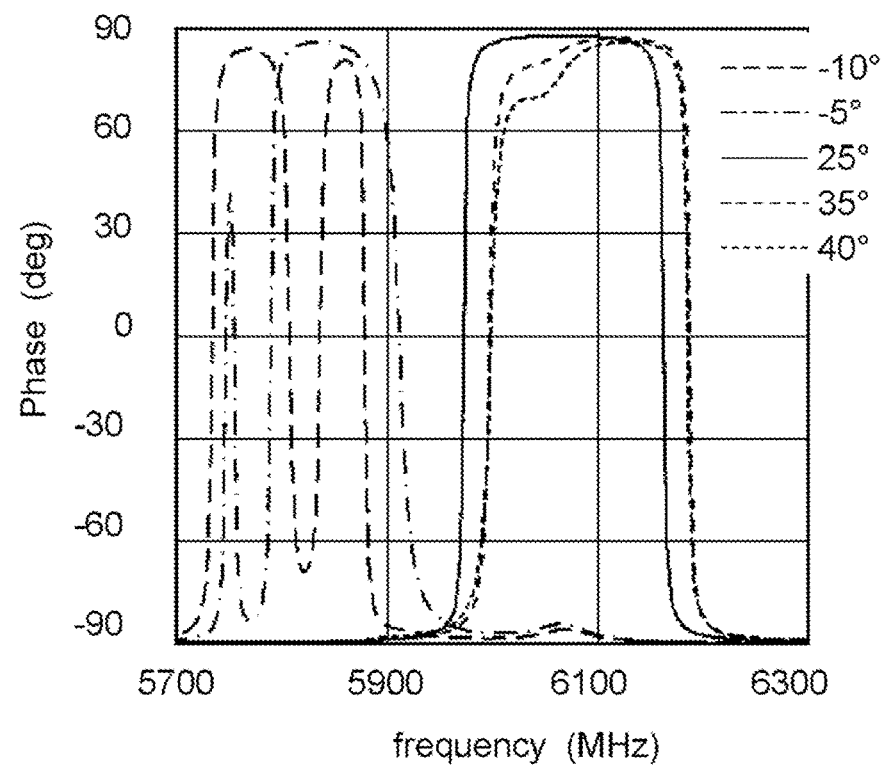

FIG. 42A and FIG. 42B are graphs, similar to FIG. 37A and FIG. 37B, showing the results of computer simulations assuming various values for θ in the Euler angles (φ, θ, ψ) of the LT layer 7 in the TiO$_2$ case. In the graphs, the angles −10°, −5°, 25°, 35°, and 40° correspond to θ. Note that, the values of parameters other than θ are the standard values (same as the values in Example 8).

As shown in these graphs, when θ becomes −10° or less, a spurious emission is generated between the resonance point and the antiresonance point. Further, when θ becomes 40 or more, a spurious emission is generated between the resonance point and the antiresonance point (in particular, see FIG. 42B). Accordingly, −5° to 35° may be made the example of range of the values of θ.

[MgO]

The example of range of the values of parameters when the material of the second layer 13 is MgO is as follows.

(Values of Parameters which Become Standard)

As a result of computer simulations, Example 9 showing relatively good frequency characteristics was obtained. The values of various parameters in Example 9 are as follows: $t_{Al}$=0.06λ, $t_{LT}$=0.175λ, $t_1$=0.12λ, $t_2$=0.15λ, E=(0°, 25°, 0°) (115°-rotated, Y-cut, X-propagation)

Figure 43A:
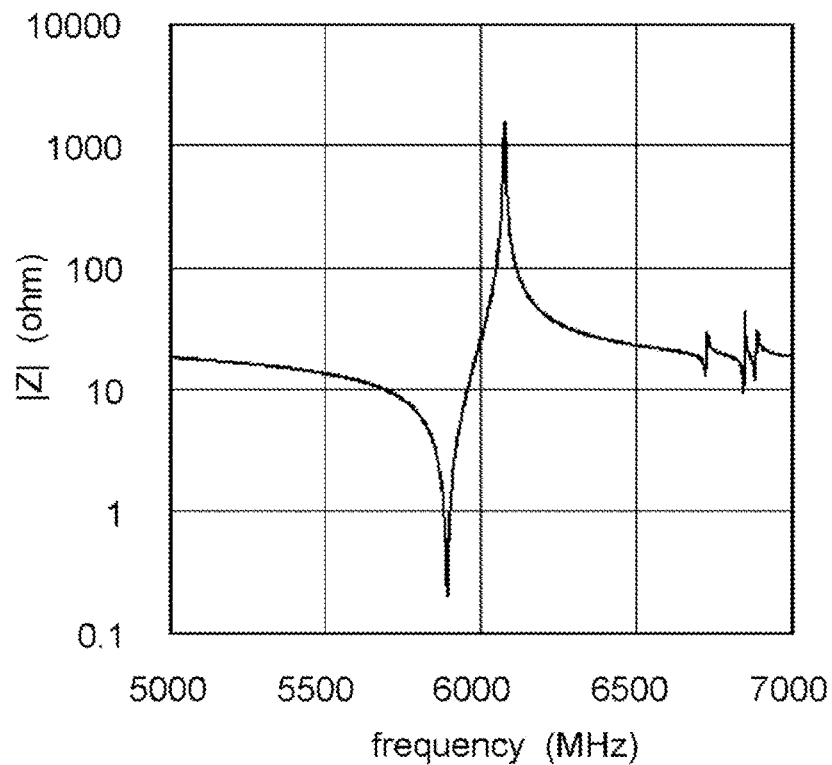
FIG. 43A and FIG. 43B are graphs showing the results of simulation according to Example 9.
Figure 43B:
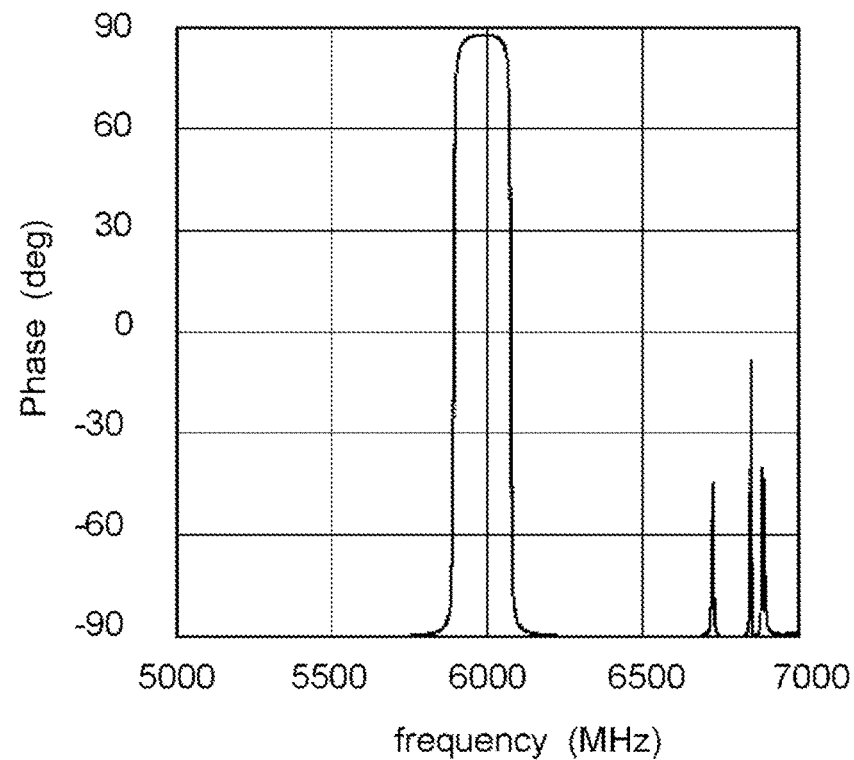

FIG. 43A and FIG. 43B are graphs showing the characteristics in Example 9. FIG. 43A is a graph showing the change of the absolute value of impedance relative to the frequency in the same way as FIG. 4A. FIG. 43B is a graph showing the change of the phase of impedance relative to the frequency in the same way as FIG. 4B.

Below, a case (sometimes referred to as the MgO case) when assuming various values by using the values of parameters in Example 9 as centers (standards) will be explained.

(Thickness of Conductive Layer in MgO Case)

Figure 44A:
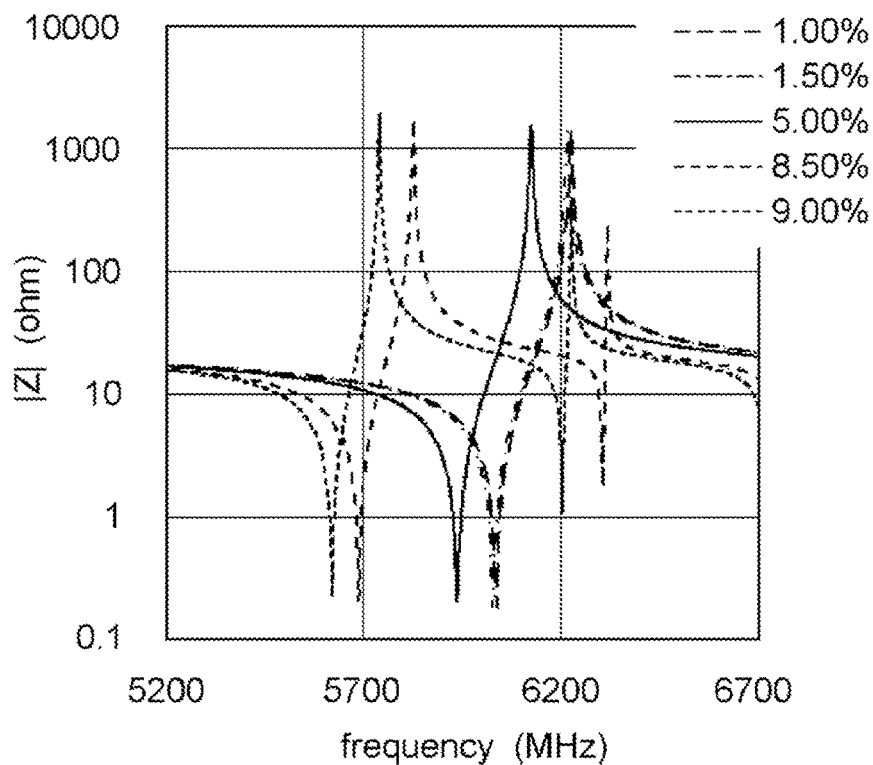
FIG. 44A and FIG. 44B are graphs showing the results of simulation when changing the thickness of the conductive layer in Example 9.
Figure 44B:
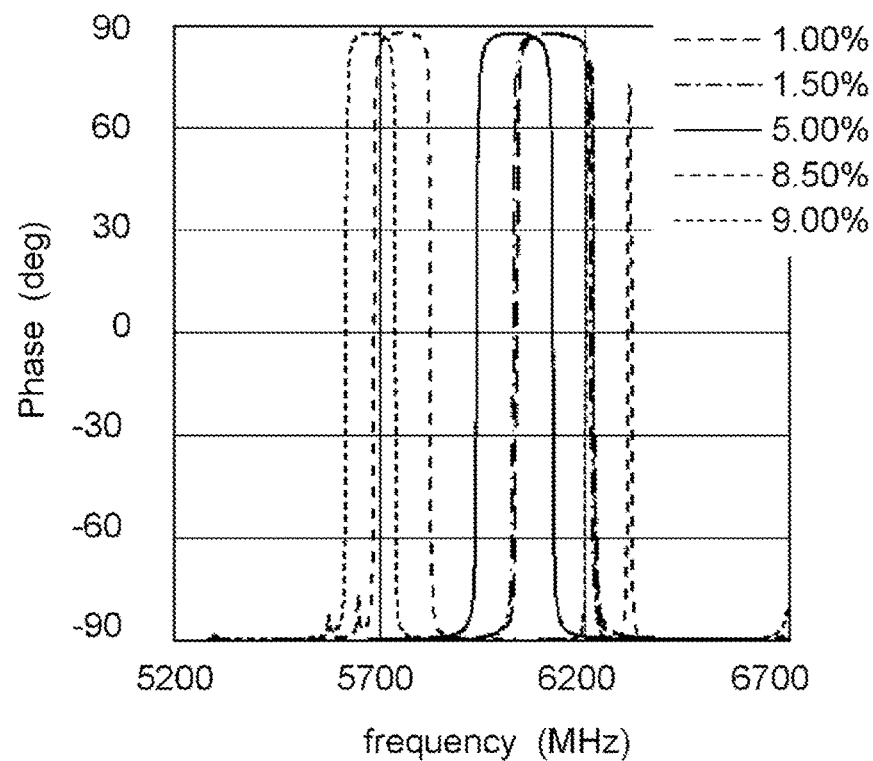

FIG. 44A and FIG. 44B are graphs, similar to FIG. 43A and FIG. 43B, showing the results of computer simulations assuming various values for the thickness $t_{Al}$ of the conductive layer 9 in the MgO case. In the graphs, 1.00%, 1.50%, 5.00%, 8.50%, and 9.00% indicate that the thickness $t_{Al}$ is 0.01λ, 0.015λ, 0.05λ, 0.085λ, and 0.09λ. Note that, the values of parameters other than the thickness $t_{Al}$ are the standard values (same as the values in Example 9).

As shown in these graphs, even if the thickness $t_{Al}$ was made smaller than the standard value (0.06λ), no large difference was seen concerning generation of a spurious emission and the magnitude of loss. However, when the conductive layer 9 is made too thin, the electrical resistance becomes large. Therefore, from this viewpoint, 0.02λ may be made the lower limit of the example of range of the values of the thickness $t_{Al}$. Further, when the thickness $t_{Al}$ becomes 0.09λ or more, although not particularly shown, Δf becomes smaller. Accordingly, 0.085λ may be made the upper limit of the example of range of values of the thickness $t_{Al}$.

(Thickness of LT Layer in MgO Case)

Figure 45A:
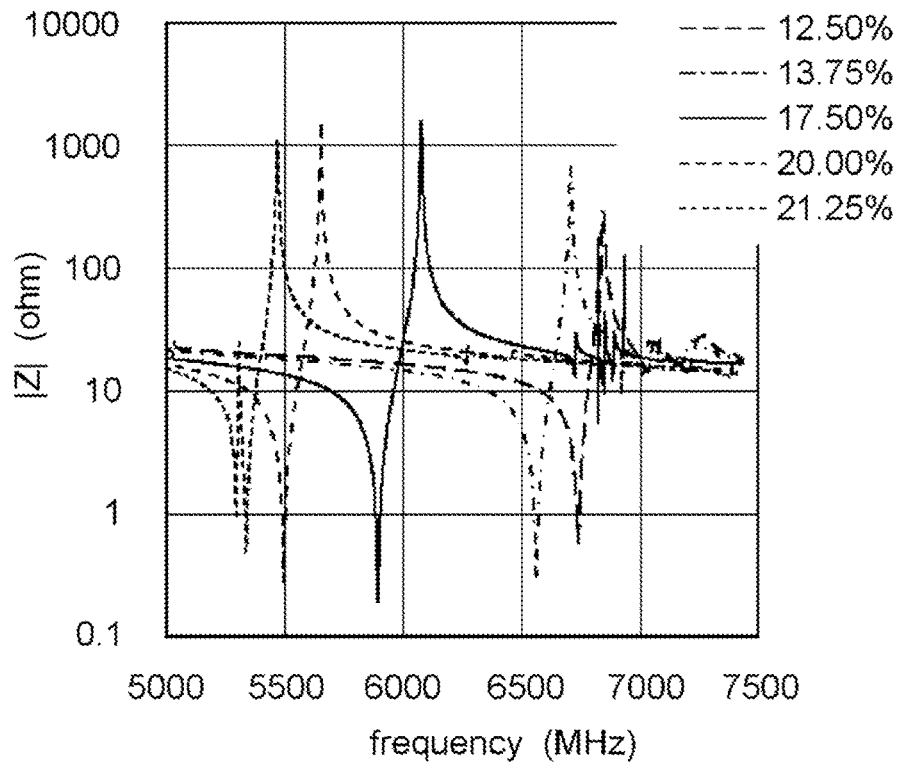
FIG. 45A and FIG. 45B are graphs showing the results of simulation when changing the thickness of the LT layer in Example 9.
Figure 45B:
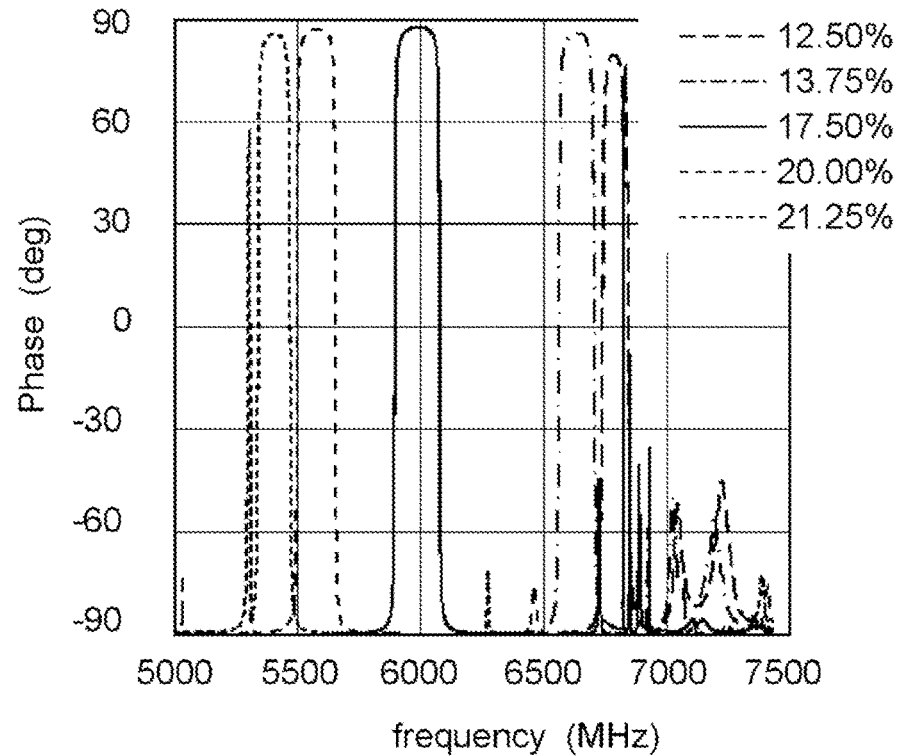

FIG. 45A and FIG. 45B are graphs, similar to FIG. 43A and FIG. 43B, showing the results of computer simulations assuming various values for the thickness $t_{LT}$ of the LT layer 7 in the MgO case. In the graphs, 12.50%, 13.75%, 17.50%, 20.00%, and 21.25% indicate that the thickness $t_{LT}$ is 0.125λ, 0.1375λ, 0.175λ, 0.2λ, and 0.2125λ. Note that, the values of parameters other than the thickness $t_{LT}$ are the standard values (same as the values in Example 9).

As shown in these graphs, when the thickness $t_{LT}$ becomes 0.125λ or less, the loss between the resonance point and the antiresonance point becomes large. Further, when the thickness $t_{LT}$ becomes 0.2125λ or more, a spurious emission is generated in the vicinity of the resonance point. Accordingly, 0.1375λ to 0.2λ may be made the example of range of the values of the thickness $t_{LT}$.

(Thickness of First Layers in MgO Case)

Figure 46A:
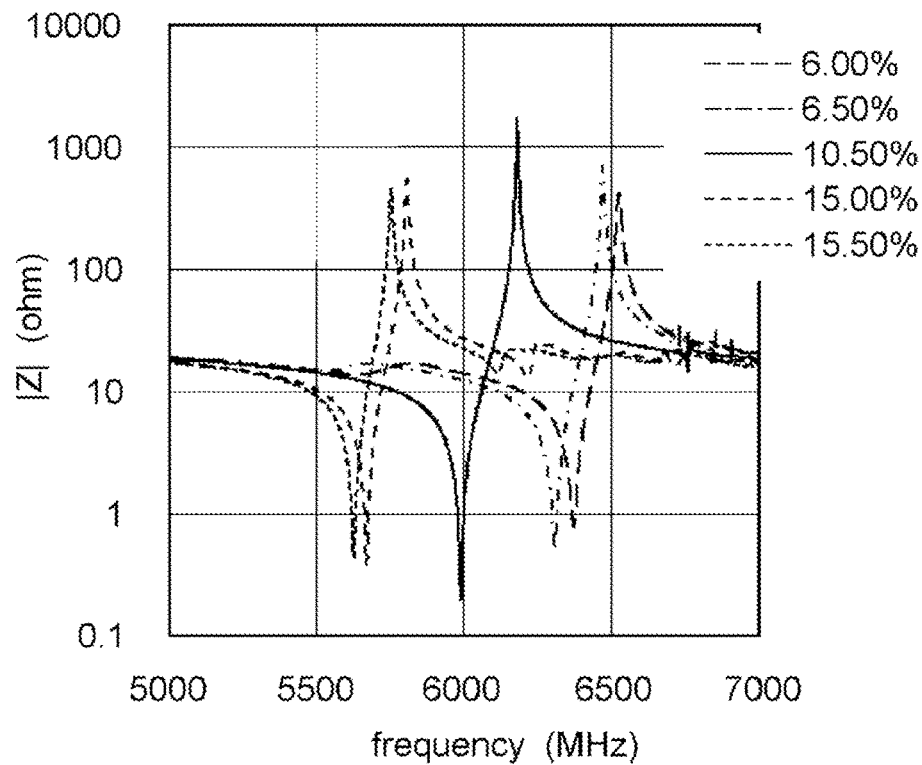
FIG. 46A and FIG. 46B are graphs showing the results of simulation when changing the thicknesses of the first layers in Example 9.
Figure 46B:
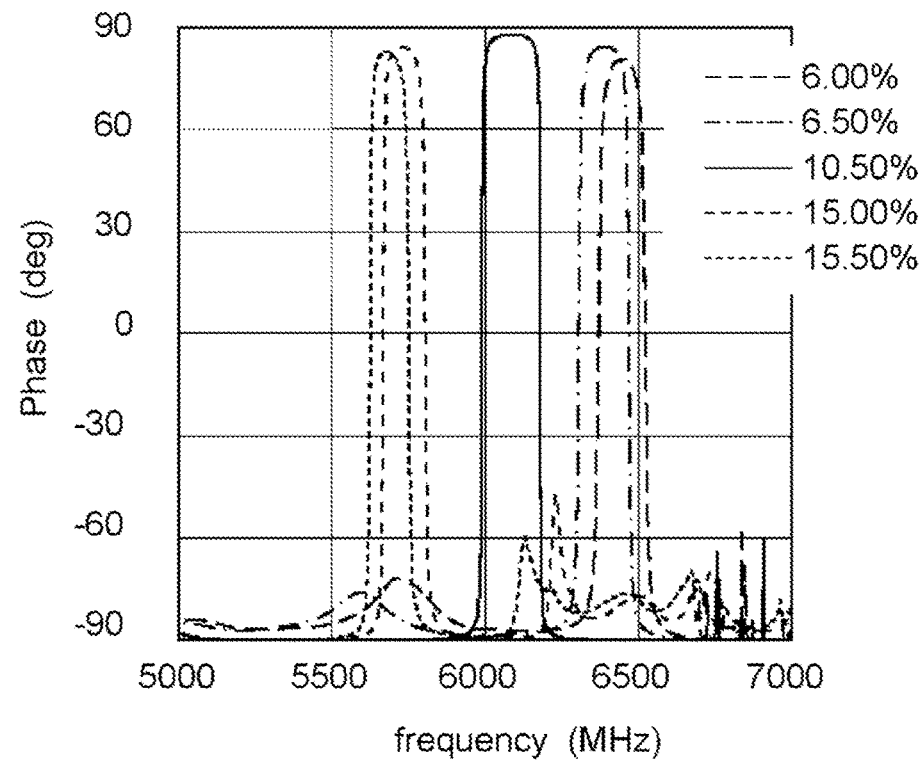

FIG. 46A and FIG. 46B are graphs, similar to FIG. 43A and FIG. 43B, showing the results of computer simulations assuming various values for the thickness $t_1$ of the first layers 11 in the MgO case. In the graphs, 6.00%, 6.50%, 10.50%, 15.00%, and 15.50% indicate that the thickness t is $0.06\lambda$, $0.065\lambda$, $0.105\lambda$, $0.15\lambda$, and $0.155\lambda$. Note that, the values of parameters other than the thickness $t_1$ are the standard values (same as the values in Example 9).

40) As shown in these graphs, when the thickness $t_1$ becomes $0.06\lambda$ or less, the loss becomes large between the resonance point and the antiresonance point. Further, when the thickness $t_1$ becomes $0.155\lambda$ or more, the loss becomes large between the resonance point and the antiresonance point. Accordingly, $0.065\lambda$ to $0.15\lambda$ may be made the example of range of the values of the thickness $t_1$.

(Thickness of Second Layers in MgO Case)

Figure 47A:
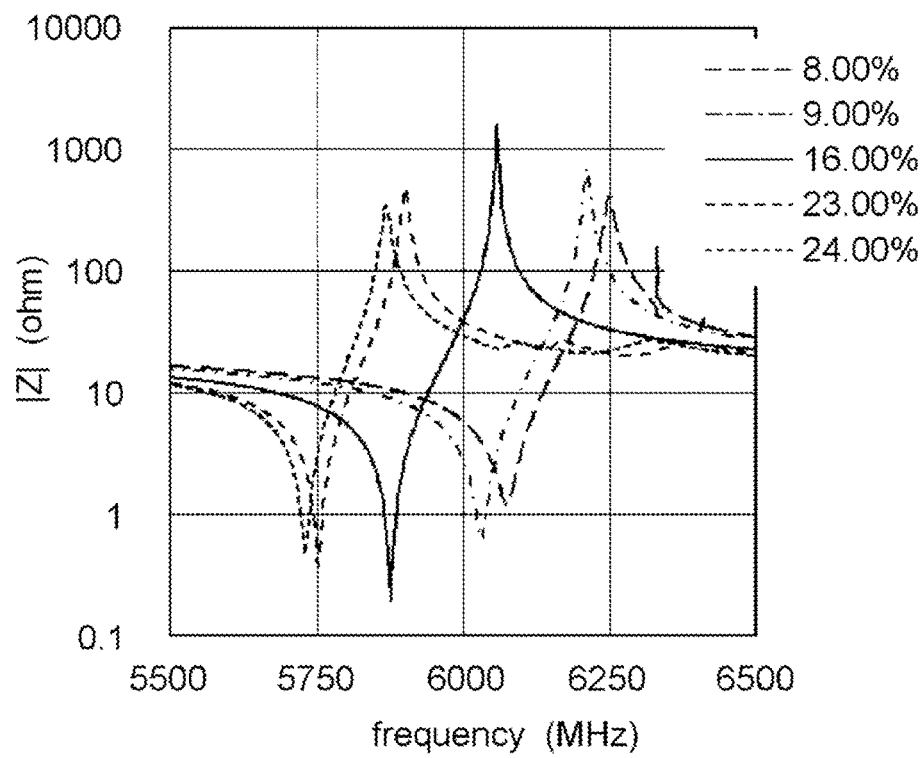
FIG. 47A and FIG. 47B are graphs showing the results of simulation when changing the thicknesses of the second layers in Example 9.
Figure 47B:
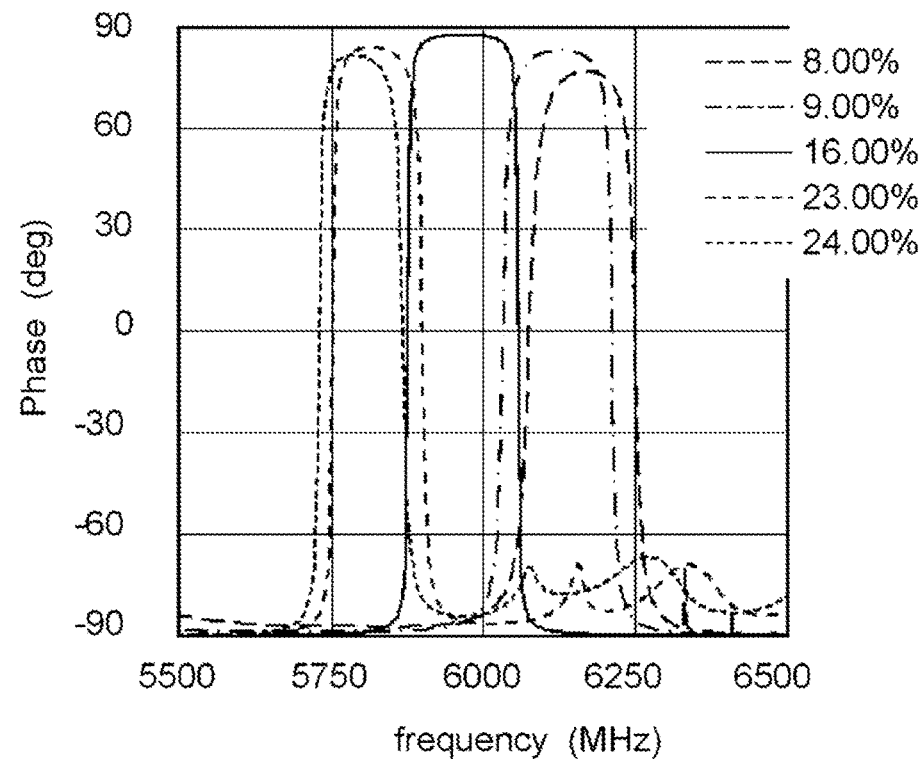

FIG. 47A and FIG. 47B are graphs, similar to FIG. 43A and FIG. 43B, showing the results of computer simulations assuming various values for the thickness $t_2$ of the second layers 13 in the MgO case. In the graphs, 8.00%, 9.00%, 16.00%, 23.00%, and 24.00% indicate that the thickness $t_2$ is $0.08\lambda$, $0.09\lambda$, $0.16\lambda$, $0.23\lambda$, and $0.24\lambda$. Note that, the values of parameters other than the thickness $t_2$ are the standard values (same as the values in Example 9).

As shown in these graphs, when the thickness $t_2$ becomes $0.08\lambda$ or less, the loss becomes large between the resonance point and the antiresonance point. Further, when the thickness $t_2$ becomes $0.24\lambda$ or more, the loss becomes large between the resonance point and the antiresonance point. Accordingly, $0.09\lambda$ to $0.23\lambda$ may be made the example of range of the values of the thickness $t_2$.

(Euler Angles of LT Layer in MgO Case)

Figure 48A:
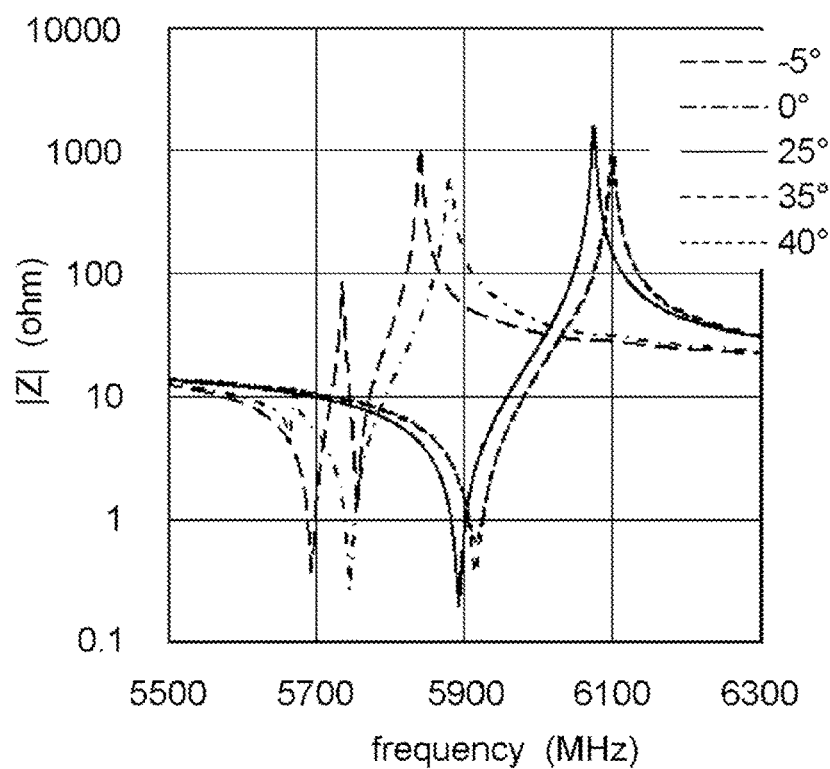
FIG. 48A and FIG. 48B are graphs showing the results of simulation when changing the Euler angles of the LT layer in Example 9.
Figure 48B:
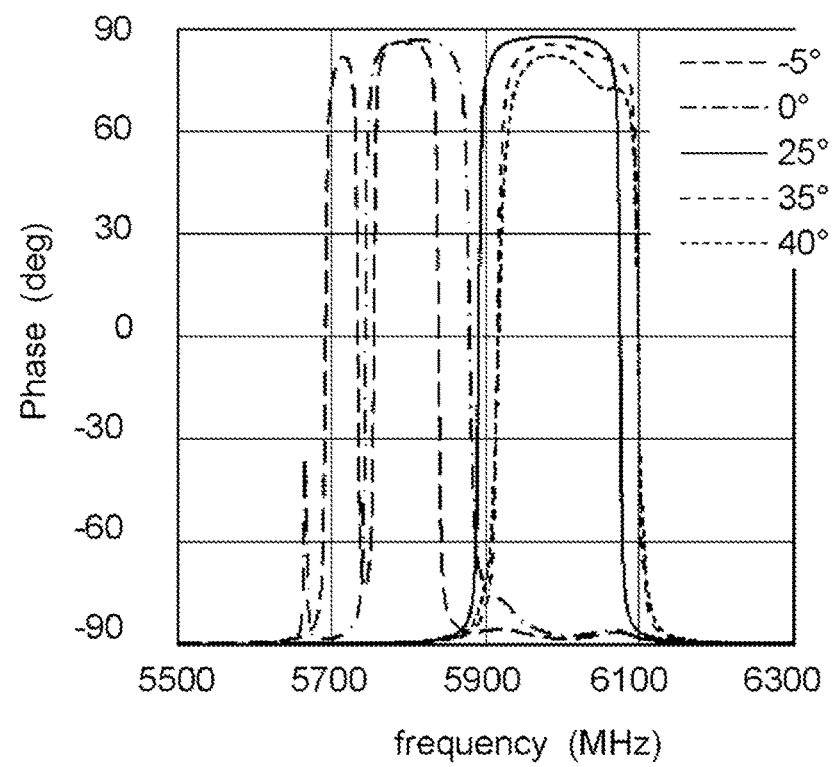

FIG. 48A and FIG. 48B are graphs, similar to FIG. 43A and FIG. 43B, showing the results of computer simulations assuming various values for $\theta$ in the Euler angles ($\varphi$, $\theta$, $\psi$) of the LT layer 7 in the MgO case. In the graphs, the angles $-5°$, $0°$, $25°$, $35°$, and $40°$ correspond to $\theta$. Note that, the values of parameters other than $\theta$ are the standard values (same as the values in Example 9).

As shown in these graphs, when $\theta$ becomes $-5°$ or less, a spurious emission is generated between the resonance point and the antiresonance point. Further, when $\theta$ becomes $40°$ or more, a spurious emission is generated between the resonance point and the antiresonance point (in particular, see FIG. 48B). Accordingly, $0°$ to $35°$ may be made the example of range of the values of $\theta$.

(Combination of Values of Parameters)

Among Cases 1 to 3 where the materials of the second layers 13 are the same ($Ta_2O_5$) as each other, examples of ranges of the values of parameters will be compared. For the thicknesses $t_{AI}$ of the conductive layers 9, the examples of ranges are substantially common among Cases 1 to 3. Further, for the Euler angles, the majority parts overlap between the example of range in Case 2 and the example of range in Case 3. Further, the example of range in Case 1 is included in the examples of ranges in Cases 2 and 3. On the other hand, for the thicknesses $t_2$ of the second layers 13, the examples of ranges do not overlap among Cases 1 to 3. There is a deviation also in the other thicknesses. In particular, the thicknesses $t_{LT}$ of the LT layers 7 do not overlap between Case 1 and Case 2.

From this fact, for example, according to the combination of examples of ranges of the thickness $t_{LT}$, thickness $t_1$, and thickness $t_2$ in Cases 1 to 3 described above, the resonance point and antiresonance point may tend to relatively clearly appear in a relatively high frequency band. Note that, the reason for the above mode of operation obtained according to the combination of the values of these three parameters may be that the combination of the values of these parameters exerts a great influence upon trapping of the slab mode acoustic wave in the LT layer 7.

Further, in Cases 1 to 3, by further combining the above example of range of the Euler angle and/or thickness $t_{AI}$ with respect to the combination of the examples of ranges of the thickness $t_{LT}$, thickness $t_1$, and thickness $t_2$, the mode of operation is improved, that is, the resonance point and antiresonance point more easily relatively clearly appear in a relatively high frequency band.

If the material of the second layers 13 is made different from $Ta_2O_5$, the values of density, elasticity, acoustic velocity, and acoustic impedance etc. become different, therefore a change arises in the combination of the examples of the ranges of the thickness $t_{LT}$, thickness $t_1$, and thickness $t_2$ capable of obtaining a mode of operation where the resonance point and antiresonance point more easily relatively clearly appear in a relatively high frequency band. Further, the example of range of the Euler angle and/or thickness $t_{AI}$ combined with respect to this combination to improve the above mode of operation changes. That is, the combination of the examples of ranges of the thickness $t_{LT}$, thickness $t_1$, and thickness $t_2$, and the example of range of the Euler angle and/or thickness $t_{AI}$ to be combined with this combination may be defined for each material.

49) Note that, in the current results, the examples of ranges of the thicknesses $t_{AI}$ are substantially the same among the materials of the second layers 13. Accordingly, as the example of range of the thickness $t_{AI}$ for various materials of the second layers 13, $0.02\lambda$ to $0.085\lambda$ or $0.02\lambda$ to $0.08\lambda$ may be utilized.

(Other Range of Euler Angles)

In the above description, in the Euler angles (p, 9, $\psi$) $0°$ was assumed for the values of $\varphi$ and $\psi$, and only the value of 9 was changed. Below, the results of computer simulations by conversely fixing 9 and changing the values of $\varphi$ and $\psi$ will be shown.

The conditions of the simulation are as follows:

$t_{A1}=0.07\lambda$, $t_{LT}=0.155\lambda$, $t_1=0.11\lambda$, and $t_2=0.07\lambda$.

The material of the second layers 13 is $Ta_2O_5$.

"$\theta$" was made $25°$. "$\psi$" was changed by $10°$ increments within a range of $-180°$ to $180°$ (however, $-180°$ and $180°$ are equivalent). "$\psi$" was changed by $10°$ increments within a range of $0°$ to $90°$.

Figure 49A:
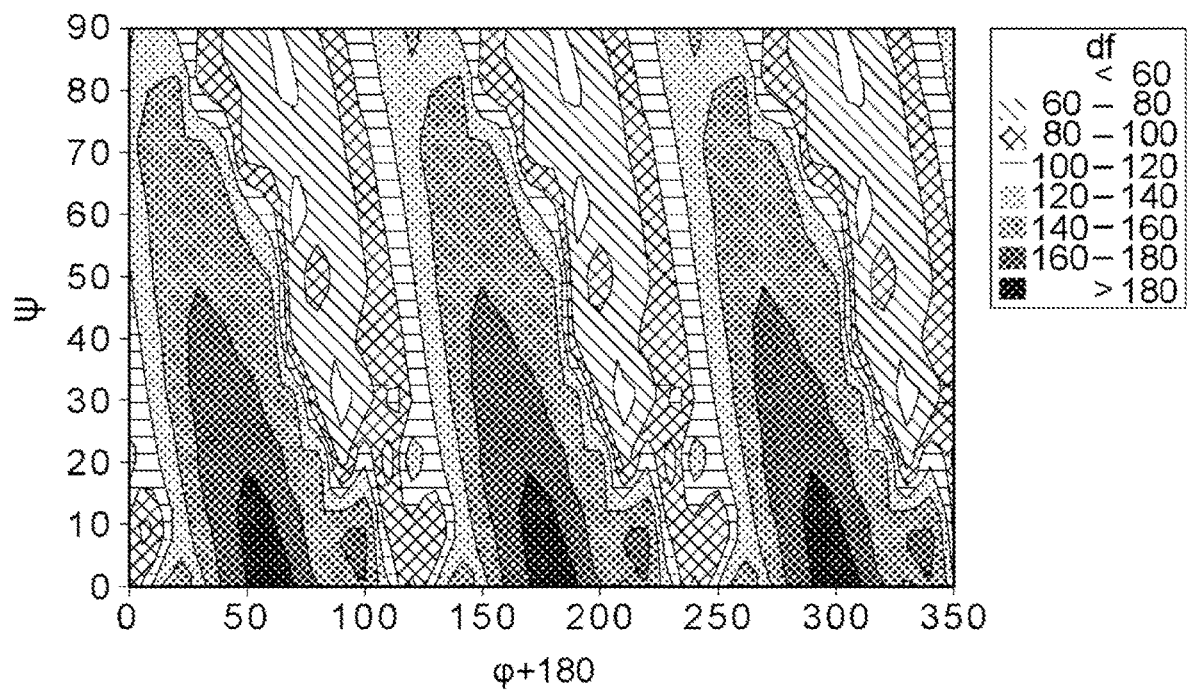
FIG. 49A and FIG. 49B are graphs showing the results of simulation when changing the Euler angles of the LT layer by another manner of change.
Figure 49B:
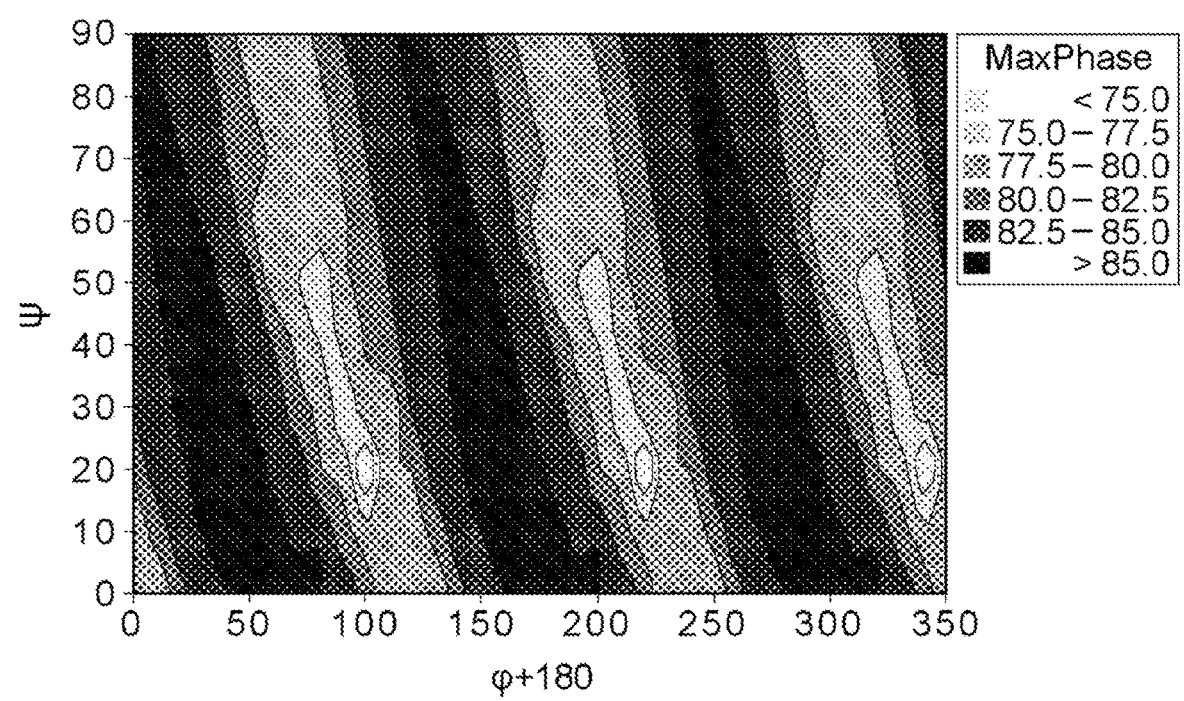

FIG. 49A and FIG. 49B are graphs showing the results of simulations. In FIG. 49A, the value of $\Delta f(df)$ as the frequency difference between the resonance point and the antiresonance point is indicated by a contour line. In FIG. 49B, the maximum value of the phase of the impedance between resonance and antiresonance points (MaxPhase) is indicated by a contour line. In these graphs, the abscissas show $\varphi+180°$. The ordinates show $\psi$.

In these graphs, the conditions for $\varphi=0°$ ($180°$ in the abscissas in the graphs) and $\psi=0°$ correspond to the conditions in Example 5. That is, they correspond to conditions where relatively good frequency characteristics are obtained. Further, due to the symmetry of LT, even under the conditions for $\varphi=-120°$ ($60°$ in the abscissae in the graphs) and $\varphi=120°$ ($300°$ in the abscissas in the graphs), the same frequency characteristics as the frequency characteristics under the conditions for $\varphi=0°$ are obtained.

From these graphs, as the example of range of the Euler angles where the desired frequency characteristics can be obtained, the following conditions can be mentioned:

When the Euler angles of the LT layer 7 are (φ, θ, ψ), and n is 0, 1, or 2, $\theta = 25 \pm 5°$,
$\psi = 0° \pm 10°$, and
$-0.608\psi - 139.5 + 120n \le \varphi \le -0.608\psi - 102.0 + 120n$.

This example of ranges may be combined with the already explained various materials of the second layers 13 and the examples of ranges of the thicknesses of various layers.

In the inequality showing the range of φ described above, when ψ=0° is substituted, substantially the range of φ becomes 0°±20°, −120°±20, or +120°±20. These examples of ranges may be utilized in place of the above inequality as well.

In the above description, the ranges of φ were shown limited to θ=25±5° and ψ=0°±10°. However, the fact that there is an equivalence for each 1200 concerning p in LT is the same also for the other θ and ψ. Accordingly, "φ" in the examples of ranges of the Euler angles concerning the already explained third to ninth examples may be made not only 0°±10°, but also −120°±10° or 120°±10°. Further, it may be made 0°±20°, −120°±20°, or 120°±20° as well.

(Method for Manufacturing Acoustic Wave Device)

The acoustic wave device 1 may be manufactured by combining various known manufacturing processes. For example, a wafer forming the substrate 3 is processed by a CVD (chemical vapor deposition) or other thin film forming method to form a first layer 11 and a second layer 13 in that order. On the other hand, a wafer forming the LT layer 7 is prepared according to the same preparation process as that for the wafer of a general LT substrate. The wafer forming the LT layer 7 is bonded to the wafer forming the substrate 3 and multilayer film 5. In the bonding, the LT layer 7 is made to directly abut against the uppermost layer (for example first layer) of the multilayer film 5. Heat treatment or the like may be carried out before or after the bonding as well. After that, the metal layer which becomes the conductive layer 9 is formed and patterned on the upper surface of the wafer forming the LT layer 7, and the wafer is diced. Due to this, the acoustic wave device 1 is prepared. Naturally a suitable process may be added in accordance with the form of the package etc.

(Example of Utilization of Acoustic Wave Device: Multiplexer)

Figure 16:
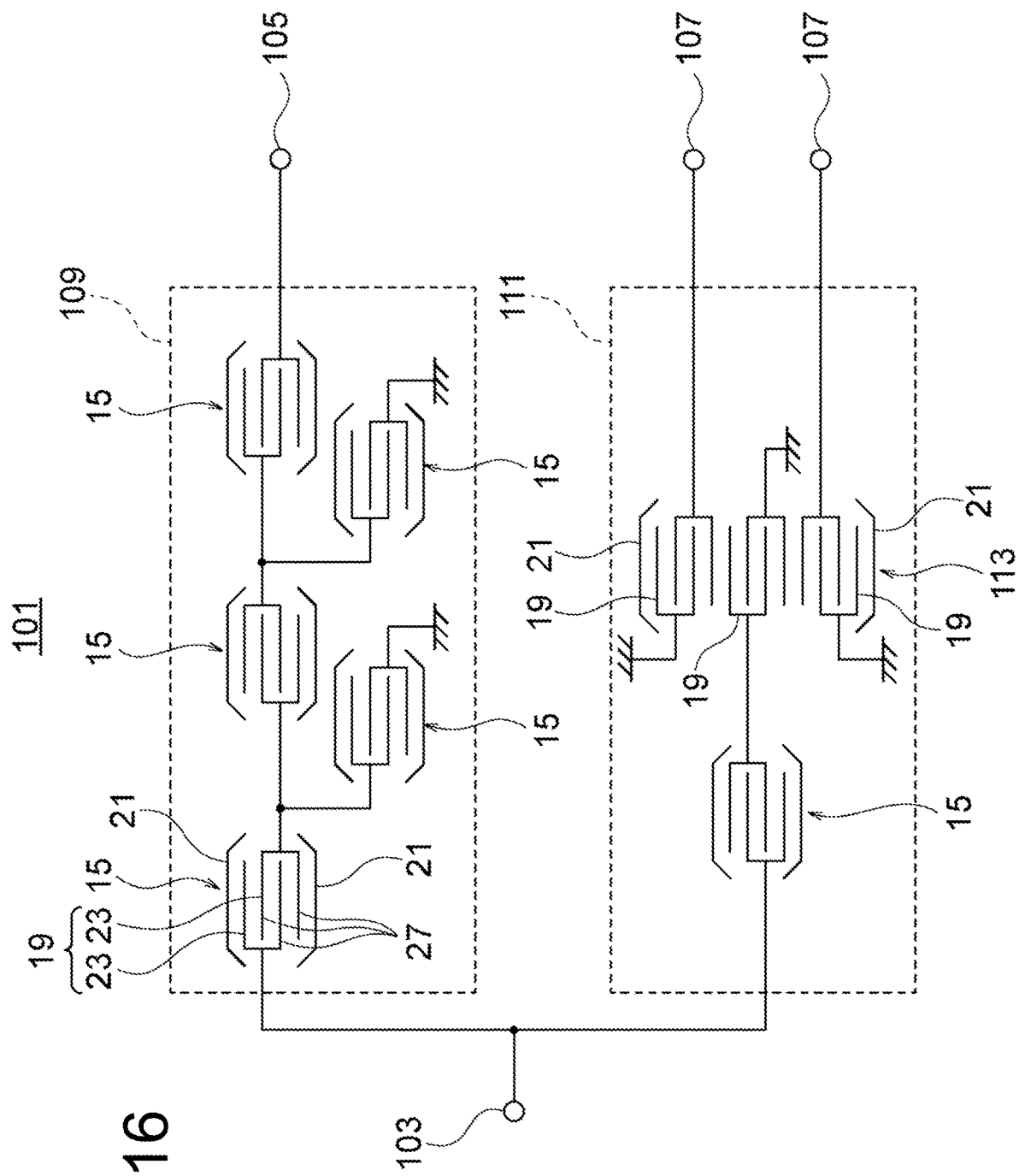
FIG. 16 is a circuit diagram schematically showing the configuration of a multiplexer as an example of utilization of the acoustic wave device in FIG. 1.

FIG. 16 is a circuit diagram schematically showing the configuration of a multiplexer 101 as an example of utilization of the acoustic wave device 1. As understood from the notation shown at the top left of the drawing sheet in this diagram, the comb-shaped electrodes 23 are schematically shown by two-prong fork shapes and the reflector 21 is represented by one line bent in the two ends in this diagram.

The multiplexer 101 for example has a transmission filter 109 which filters a transmission signal from a transmission terminal 105 and outputs the result to an antenna terminal 103 and has a reception filter 111 which filters a reception signal from the antenna 103 and outputs the result to a pair of reception terminals 107.

The transmission filter 109 is for example configured by a ladder type filter configured by a plurality of resonators 15 connected in a ladder shape. That is, the transmission filter 109 has a plurality of (may be one) resonators 15 which are connected in series between the transmission terminal 105 and the antenna terminal 103 and a plurality of (may be one) resonators 15 (parallel arm) which connect that serial line (serial arm) and the reference potential. Note that, the pluralities of resonators 15 configuring the transmission filter 109 are for example provided on the same fixed substrate 2 (3, 5, and 7).

The reception filter 111 is for example configured including a resonator 15 and a multimode type filter (including a double mode type filter) 113. The multimode type filter 113 has a plurality of (three in the example shown) IDT electrodes 19 which are arranged in the direction of propagation of the acoustic wave and a pair of reflectors 21 which are arranged on the two sides thereof. Note that, the resonator 15 and multimode type filter 113 configuring the reception filter 111 are for example provided on the same fixed substrate 2.

Note that, the transmission filter 109 and the reception filter 111 may be provided on the same fixed substrate 2 or may be provided on fixed substrates 2 which are different from each other. FIG. 16 is just one example of the configuration of the multiplexer 101. For example, the reception filter 111 may be configured by a ladder type filter in the same way as the transmission filter 109 as well.

Note that, the multiplexer 101, which has the transmission filter 109 and the reception filter 111, was explained. However, the multiplexer is not limited to this. For example, it may be a diplexer or may be a multiplexer including three or more filters.

(Example of Utilization of Acoustic Wave Device: Communication Apparatus)

FIG. 17 is a block diagram showing the principal part in a communication apparatus 151 as an example of utilization of the acoustic wave device 1 (multiplexer 101). The communication apparatus 151 performs wireless communication utilizing radio waves and includes the multiplexer 101.

In the communication apparatus 151, a transmission information signal TIS including information to be transmitted is modulated and raised in frequency (conversion to a high frequency signal having a carrier frequency) by an RF-IC (radio frequency integrated circuit) 153 to become a transmission signal TS. The transmission signal TS is stripped of unwanted components other than the transmission-use passing band by a band pass filter 155, is amplified by an amplifier 157, and is input to the multiplexer 101 (transmission terminal 105). Further, the multiplexer 101 (transmission filter 109) strips the unwanted components other than the transmission-use passing band from the input transmission signal TS and outputs the transmission signal TS after stripping from the antenna terminal 103 to the antenna 159. The antenna 159 converts the input electrical signal (transmission signal TS) to a wireless signal (radio wave) and transmits the result.

Further, in the communication apparatus 151, a wireless signal (radio wave) received by the antenna 159 is converted to an electrical signal (reception signal RS) by the antenna 159 and is input to the multiplexer 101 (antenna terminal 103). The multiplexer 101 (reception filter 111) strips the unwanted components other than the reception-use passing band from the input reception signal RS and outputs the result from the reception terminal 107 to an amplifier 161. The output reception signal RS is amplified by the amplifier 161 and is stripped of unwanted components other than the reception-use passing band by the band pass filter 163. Further, the reception signal RS is boosted down in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digital audio signals. The passing band of the radio signal may be suitably set. In the present embodiment, also a passing band of relatively high frequency (for example 5 GHz or more) is possible. The modulation scheme may be either of phase modulation, amplitude modulation, frequency modulation, or a combination of any two or more among them. As the circuit system, FIG. 17 illustrated a direct conversion system. However, a suitable system other than that may be employed. For example, it may be a double superheterodyne system as well. Further, FIG. 17 schematically shows only the principal part. A low pass filter or isolator etc. may be added to suitable positions. Further, the positions of the amplifier etc. may be changed as well.

As described above, the acoustic wave device 1 according to the present embodiment has the substrate 3, the multilayer film 5 positioned on the substrate 3, the LT layer 7 configured by a single crystal of $LiTaO_3$ which is positioned on the multilayer film, and the IDT electrode 19 positioned on the LT layer 7. The thickness of the LT layer 7 is 0.3λ or less where two times the pitch "p" of the electrode fingers 27 in the IDT electrode 19 is λ. The Euler angles of the LT layer 7 are (0°±20°, −5° to 65°, 0°±10°), (−120°±20°, −5° to 65°, 0°±10°), or (120°±20°, −5° to 65°, 0°±10°). The multilayer film 5 is configured by alternately stacking the first layers 11 and second layers 13. The first layers 11 are comprised of $SiO_2$. The second layers 13 are comprised of any one of $Ta_2O_5$, $HfO_2$, $ZrO_2$, $TiO_2$, and MgO.

Accordingly, for example, as illustrated in FIG. 4A to FIG. 48B, resonance of frequency which is relatively high relative to the pitch "p" can be realized. For example, when the pitch "p" is μm, a resonance of 5 GHz or more can be realized. As a result, for example, with the pitch "p" the same extent as that in the conventional SAW device utilizing a resonance of about 2 GHz, a resonance of frequency higher than 2 GHz can be utilized. From another viewpoint, with the same process rule as the conventional one, an acoustic wave device 1 corresponding to a high frequency can be prepared.

Here, as already explained, since the multilayer film 5 and LT layer 7 are provided, the LT layer 7 is formed relatively thin, the Euler angles of the LT layer 7 are within the predetermined range, and the like, the slab mode acoustic wave can be utilized. Further, by utilizing the materials explained above as the materials of the multilayer films 5, for example, as shown in FIG. 3A to FIG. 3D etc., the resonance point and antiresonance point can be generated more clearly than the other materials. The reason for this may be a unique combination of the values of the density, elasticity, acoustic velocity, and acoustic impedance in these materials.

The present invention is not limited to the above embodiments, and may be executed in various aspects. For example, the thicknesses of the layers and the Euler angles of the LT layer may be made values out of the ranges exemplified in the embodiments as well.

REFERENCE SIGNS LIST

1 . . . acoustic wave device, 3 . . . substrate, 5 . . . multilayer film, 7 . . . LT layer, 19 . . . IDT electrode, 11 . . . first layer, and 13 . . . second layer.

The invention claimed is:
1. An acoustic wave device comprising:
a substrate,
a multilayer film on the substrate,
an LT layer configured by a single crystal of $LiTaO_3$ on the multilayer film, and
an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HfO_2$, $ZrO_2$, $TiO_2$, and MgO, wherein:
the second layer is comprised of $HfO_2$,
the thickness of the LT layer is 0.1375λ to 0.1875λ,
a thickness of the first layer is 0.05λ to 0.13λ, and
a thickness of the second layer is 0.04λ to 0.11λ.

2. An acoustic wave device comprising:
a substrate,
a multilayer film on the substrate,
an LT layer configured by a single crystal of $LiTaO_3$ on the multilayer film, and
an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HfO_2$, $ZrO_2$, $TiO_2$, and MgO, wherein:
the second layer is comprised of $Ta_2O_5$,
the thickness of the LT layer is 0.19λ to 0.21λ,
a thickness of the first layer is 0.07λ to 0.13λ, and
a thickness of the second layer is 0.95λ to 1.00λ.

3. The acoustic wave device according to claim 2, wherein the Euler angles of the LT layer are (0°±20°, −18° to 34°,0°±10°), (−120°±20°, −18° to 34°), or (120°±20°, −18° to 34, 120°±10°).

4. An acoustic wave device comprising:
a substrate,
a multilayer film on the substrate,
an LT layer configured by a single crystal of $LiTaO_3$ on the multilayer film, and
an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HfO_2$, $ZrO_2$, $TiO_2$, and MgO, wherein:
the second layer is comprised of $Ta_2O_5$,
the thickness of the LT layer is 0.165λ to 0.185λ,
a thickness of the first layer is 0.06λ to 0.13λ, and
a thickness of the second layer is 0.31λ to 0.34λ.

5. The acoustic wave device according to claim 4, wherein the Euler angles of the LT layer are (0°±20°, −4° to 50°, 0°±10°), (−120°±20°, −4° to 50°, 0°±10°), or (120°±20°, −4° to 50, 0°±10°).

6. An acoustic wave device comprising:
a substrate,
a multilayer film on the substrate,
an LT layer configured by a single crystal of $LiTaO_3$ on the multilayer film, and an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HFO_2$, $ZrO_2$, $TiO_2$, and MgO, wherein:
the second layer is comprised of $Ta_2O_5$,
the thickness of the LT layer is 0.15λ to 0.205λ,
a thickness of the first layer is 0.0625λ to 0.1375λ, and
a thickness of the second layer is 0.0625λ to 0.10λ.

7. The acoustic wave device according to claim 6, wherein the Euler angles of the LT layer are wherein the Euler angles of the LT layer are (0°±20°, −5° to 65°, 0°±10°), (−120°±20°, −5° to 65°, 0°±10°), or (120°±20°, −5° to 65, 0°±10°).

8. The acoustic device according to claim 1, wherein thicknesses of the plurality of electrode fingers are 0.02λ to 0.085λ.

9. The acoustic wave device according to claim 1, wherein the Euler angles of the LT layer are wherein the Euler angles of the LT layer are (0°±20°, −5° to 65°, 0°±10°), (−120°±20°, −5° to 65°, 0°±10°), or (120°±20°, −5° to 65, 0°±10°).

10. An acoustic wave device comprising:
a substrate,
a multilayer film on the substrate,
an LT layer configured by a single crystal of $LiTaO_3$ on the multilayer film, and
an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HFO_2$, $ZrO_2$, $TiO_2$, and MgO, wherein:
the second layer is comprised of $ZRO_2$,
the thickness of the LT layer is 0.125λ to 0.175λ,
a thickness of the first layer is 0.085λ to 0.14λ, and
a thickness of the second layer is 0.06λ to 0.12λ.

11. The acoustic wave device according to claim 10, the Euler angles of the LT layer are (0°±20°, −15° to 60°, 0°±10°), (−120°±20°, −15° to 60°, 0°±10°), or (120°±20°, −15° to 60, 0°±10°).

12. An acoustic wave device comprising:
a substrate,
a multilayer film on the substrate,
an LT layer configured by a single crystal of $LiTaO_3$ on the multilayer film, and
an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HFO_2$, $ZrO_2$, $TiO_2$, and MgO, wherein:
the second layer is comprised of $TiO_2$,
the thickness of the LT layer is 0.15λ to 0.2125λ,
a thickness of the first layer is 0.055λ to 0.15λ, and
a thickness of the second layer is 0.11λ to 0.24λ.

13. The acoustic wave device according to claim 12, wherein the Euler angles of the LT layer are (0°±20°, −5° to 35°, 0°±10°), (−120°±20°, −5° to 35°, 0°±10°), or (120°±20°, −5° to 35, 0°±10°).

14. An acoustic wave device comprising:
a substrate,
a multilayer film on the substrate,
an LT layer configured by a single crystal of $LiTaO_3$ on the multilayer film, and
an IDT electrode on the LT layer, wherein
a thickness of the LT layer is 0.3λ or less, where λ is two times a pitch of electrode fingers in the IDT electrode,
Euler angles of the LT layer are
(0°±20°, −5° to 65°, 0°±10°),
(−120°±20°, −5° to 65°, 0°±10°),
(120°±20°, −5° to 65°, 0°±10°),
the multilayer film is configured by alternately stacking at least one first layer and at least one second layer,
the first layer is comprised of $SiO_2$, and
the second layer is comprised of any one of $Ta_2O_5$, $HFO_2$, $ZrO_2$, $TiO_2$, and MgO, wherein:
the second layer is comprised of $MgO_2$,
the thickness of the LT layer is 0.1375λ to 0.20λ,
a thickness of the first layer is 0.65λ to 0.15λ, and
a thickness of the second layer is 0.09λ to 0.23λ.

15. The acoustic wave device according to claim 14, wherein the Euler angles of the LT layer are (0°±20°, −0° to 35°, 0°±10°), (−120°±20°, −0° to 35°, 0°±10°), or (120°±20°, −0° to 35, 0°±10°).

16. A multiplexer comprising:
an antenna terminal,
a transmission filter filtering a signal output to the antenna terminal, and
a reception filter filtering a signal input from the antenna terminal, wherein
at least one of the transmission filter and the reception filter comprises the acoustic wave device according to claim 1.

17. A communication apparatus comprising:
an antenna,
the multiplexer according to claim 16, in which the antenna terminal is connected with the antenna, and
an IC which is connected with respect to the transmission filter and the reception filter on a side opposite to the antenna terminal about a signal route.

* * * * *